United States Patent
Ohmaru

(10) Patent No.: US 9,887,218 B2
(45) Date of Patent: Feb. 6, 2018

(54) IMAGING DEVICE, OPERATING METHOD THEREOF, AND ELECTRONIC DEVICE

(71) Applicant: Semiconductor Energy Laboratory Co., Ltd., Atsugi-shi, Kanagawa-ken (JP)

(72) Inventor: Takuro Ohmaru, Kasuya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 16 days.

(21) Appl. No.: 15/206,695

(22) Filed: Jul. 11, 2016

(65) Prior Publication Data
US 2017/0018587 A1    Jan. 19, 2017

(30) Foreign Application Priority Data

Jul. 16, 2015  (JP) ................. 2015-142019

(51) Int. Cl.
*H01L 27/146* (2006.01)
*H04N 5/232* (2006.01)
(Continued)

(52) U.S. Cl.
CPC .. *H01L 27/14612* (2013.01); *H01L 27/14607* (2013.01); *H01L 27/14616* (2013.01);
(Continued)

(58) Field of Classification Search
CPC .... H04N 5/3745; H04N 5/374; H04N 5/3559; H04N 5/3698; H04N 5/23245;
(Continued)

(56) References Cited

U.S. PATENT DOCUMENTS

2007/0072439 A1  3/2007 Akimoto et al.
2011/0108836 A1  5/2011 Koyama et al.
(Continued)

FOREIGN PATENT DOCUMENTS

| JP | 2007-096055 A | 4/2007 |
| JP | 2007-123861 A | 5/2007 |
| JP | 2011-119711 A | 6/2011 |
| JP | 2013-033664 A | 2/2013 |

OTHER PUBLICATIONS

Imura.S et al., "High Sensitivity Image Sensor Overlaid with Thin-Film Crystalline-Selenium-based Heterojunction Photodiode", IEDM 14: Technical Digest of International Electron Devices Meeting, Dec. 1, 2014, pp. 88-91.

*Primary Examiner* — Christopher K Peterson
(74) *Attorney, Agent, or Firm* — Robinson Intellectual Property Law Office; Eric J. Robinson

(57) ABSTRACT

An imaging device whose dynamic range is broadened is provided. The imaging device includes a pixel including a first photoelectric conversion element and a first circuit including a second photoelectric conversion element. The first circuit switches the operation mode of the pixel to a normal imaging mode or a wide dynamic range mode and switches the operation region of the first photoelectric conversion element to a normal region or an avalanche region in accordance with the illuminance of light with which the second photoelectric conversion element is irradiated. When the illuminance of light with which the first photoelectric conversion element is irradiated is increased, the increase rate of a writing current flowing to the pixel is higher in the avalanche region than in the normal region. However, in the wide dynamic range mode, the increase rate of current can be lowered, and thus the dynamic range can be broadened.

16 Claims, 54 Drawing Sheets

(51) Int. Cl.
  *H04N 5/3745* (2011.01)
  *H04N 5/374* (2011.01)
  *H04N 5/369* (2011.01)
  *H04N 5/355* (2011.01)
  *H04N 5/353* (2011.01)

(52) U.S. Cl.
  CPC .. *H01L 27/14636* (2013.01); *H01L 27/14645* (2013.01); *H01L 27/14663* (2013.01); *H01L 27/14665* (2013.01); *H01L 27/14689* (2013.01); *H04N 5/23245* (2013.01); *H04N 5/355* (2013.01); *H04N 5/3532* (2013.01); *H04N 5/3559* (2013.01); *H04N 5/3698* (2013.01); *H04N 5/374* (2013.01); *H04N 5/3745* (2013.01); *H01L 2224/48091* (2013.01); *H01L 2224/48227* (2013.01); *H01L 2924/15311* (2013.01)

(58) Field of Classification Search
  CPC ............... H04N 5/3532; H04N 5/355; H01L 27/14612; H01L 2224/48091; H01L 2224/48227
  See application file for complete search history.

(56) References Cited

U.S. PATENT DOCUMENTS

| | | |
|---|---|---|
| 2016/0064443 A1 | 3/2016 | Inoue et al. |
| 2016/0064444 A1 | 3/2016 | Inoue et al. |
| 2016/0093652 A1 | 3/2016 | Ikeda et al. |
| 2016/0133660 A1 | 5/2016 | Inoue et al. |
| 2016/0134789 A1 | 5/2016 | Inoue et al. |
| 2016/0225808 A1 | 8/2016 | Kurokawa |
| 2017/0059399 A1* | 3/2017 | Suh ............................ G01J 1/42 |

* cited by examiner

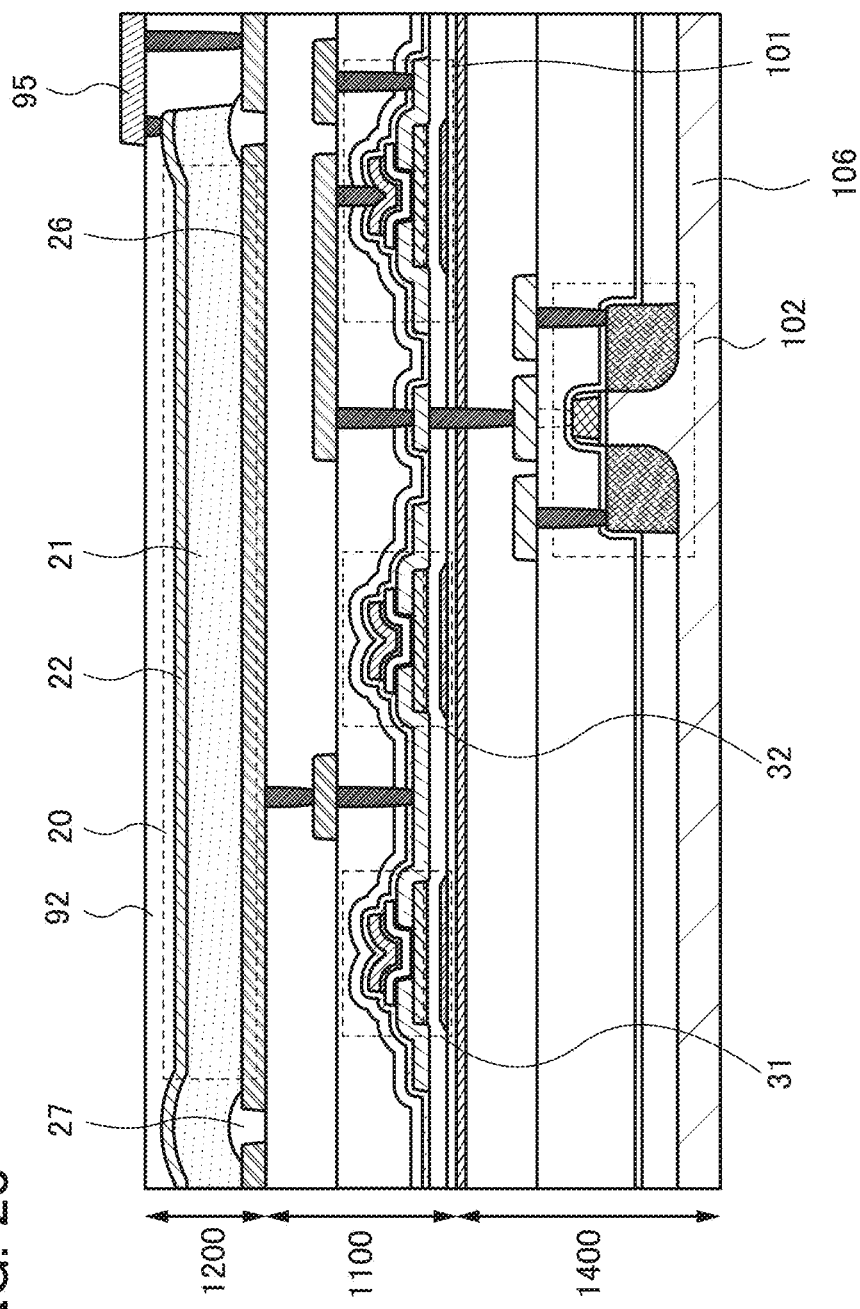

FIG. 35A1
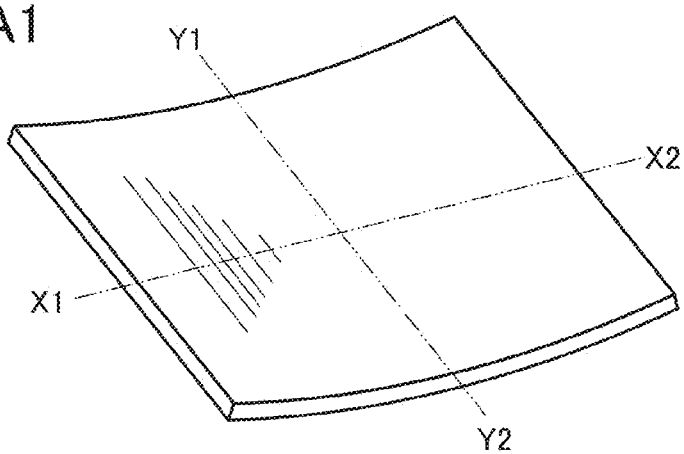
FIG. 35A2
FIG. 35A3
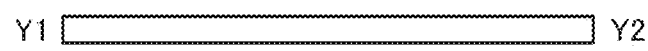
FIG. 35B1
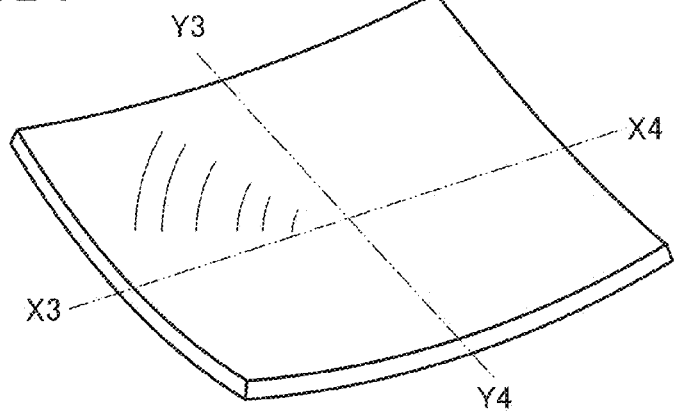
FIG. 35B2
FIG. 35B3

FIG. 45A
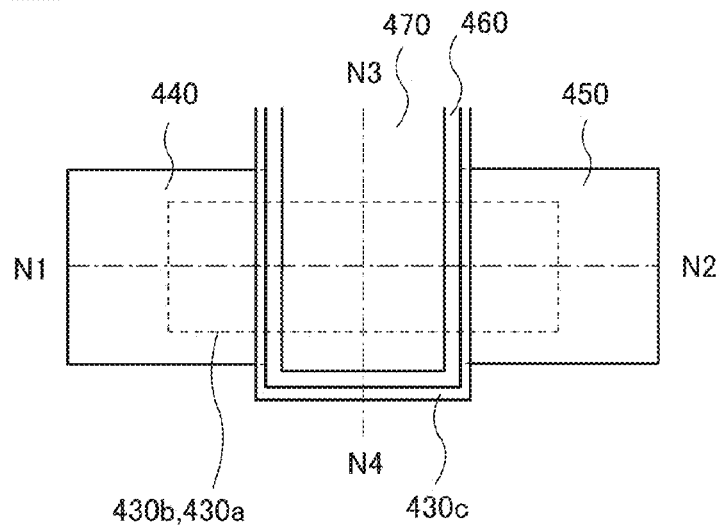
FIG. 45B
FIG. 45C
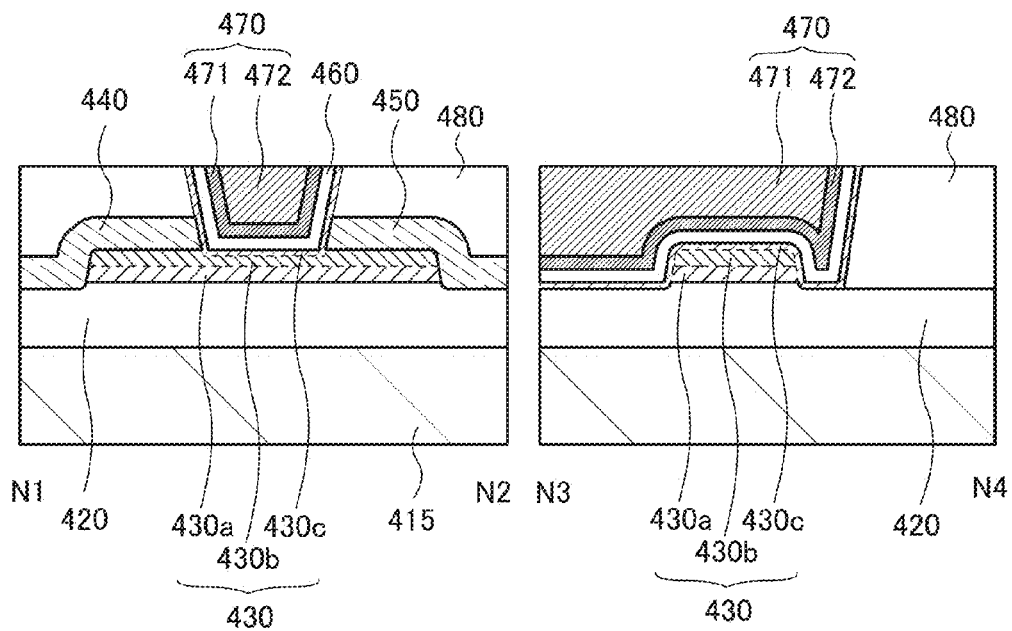

FIG. 50A
FIG. 50B
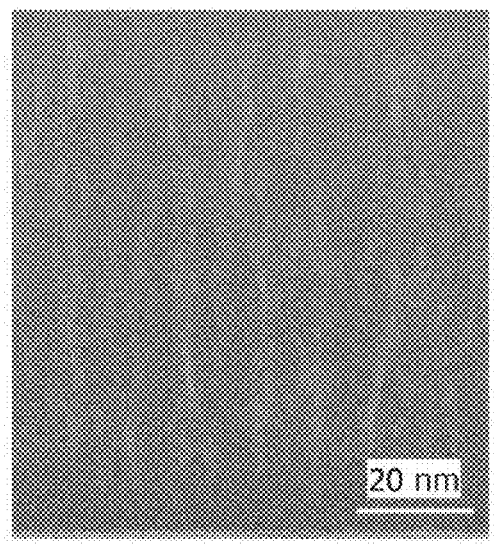
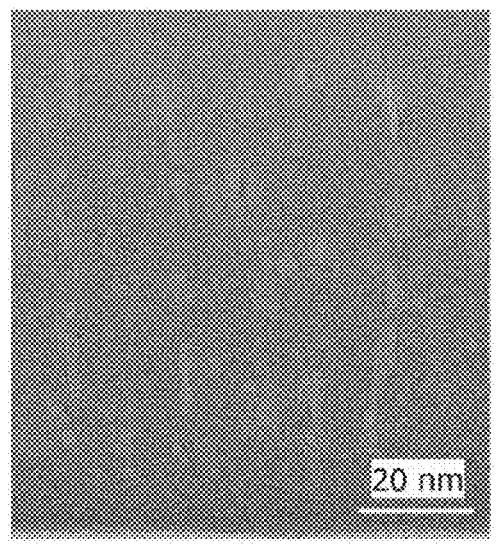

IMAGING DEVICE, OPERATING METHOD THEREOF, AND ELECTRONIC DEVICE

BACKGROUND OF THE INVENTION

1. Field of the Invention

One embodiment of the present invention relates to an imaging device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

A technique by which transistors are formed using oxide semiconductor thin films formed over a substrate has been attracting attention. For example, techniques for forming transistors using zinc oxide or an In—Ga—Zn-based oxide semiconductor as an oxide semiconductor are disclosed in Patent Documents 1 and 2.

Patent Document 3 discloses an imaging device in which a transistor including an oxide semiconductor and having an extremely low off-state current is used in part of a pixel circuit and a transistor including silicon with which a complementary metal oxide semiconductor (CMOS) circuit can be formed is used in a peripheral circuit.

In addition, Patent Document 4 discloses, as an imaging device which utilizes an avalanche multiplication phenomenon, an imaging device in which an amorphous semiconductor layer containing selenium as a main component is used for a photoelectric conversion element.

Moreover, Non-Patent Document 1 proposes an imaging device in which a photoelectric conversion element including a crystalline selenium thin film is formed over a CMOS circuit.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711
[Patent Document 4] Japanese Published Patent Application No. 2013-033664

Non-Patent Document

[Non-Patent Document 1] S. Imura et al., "High Sensitivity Image Sensor Overlaid with Thin-Film Crystalline-Selenium-based Heterojunction Photodiode," *International Electron Devices Meeting*, pp. 88-91, December 2014.

SUMMARY OF THE INVENTION

To make an image sensor have high resolution, the area of one pixel needs to be reduced. When the pixel area is reduced, the light-receiving area of a photoelectric conversion element is also reduced; as a result, the photosensitivity is lowered. In particular, in imaging under a low illuminance condition, the S/N ratio of imaging data largely decreases in some cases. That is, in the image sensor having the conventional structure, there is a trade-off between resolution and photosensitivity.

A solution to the above problem is to use a photoelectric conversion element utilizing an avalanche multiplication phenomenon, which has high photosensitivity. However, the flowing current is larger in imaging which uses the photoelectric conversion element utilizing an avalanche multiplication phenomenon than in imaging which does not utilize the avalanche multiplication phenomenon; thus, due to the limit of the amount of accumulated charge in imaging, the detection range of illuminance, i.e., the dynamic range is narrowed.

Thus, one object of one embodiment of the present invention is to provide an imaging device or the like having a novel structure in which a wide dynamic range can be achieved in imaging using a photoelectric conversion element utilizing an avalanche multiplication phenomenon. Another object of one embodiment of the present invention is to provide an imaging device or the like having a novel structure with high photosensitivity.

Alternatively, an object of one embodiment of the present invention is to provide an operating method or the like of an imaging device having a novel structure capable of broadening a dynamic range in imaging using a photoelectric conversion element utilizing an avalanche multiplication phenomenon. Another object of one embodiment of the present invention is to provide an operating method or the like of an imaging device having a novel structure with high photosensitivity.

Alternatively, an object of one embodiment of the present invention is to provide a novel imaging device, an operating method of a novel imaging device, a novel electronic device, or the like.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

An imaging device of one embodiment of the present invention includes a pixel and a first circuit. The pixel includes a first photoelectric conversion element, a first transistor, a second transistor, a third transistor, and a fourth transistor. One terminal of the first photoelectric conversion element is electrically connected to one of a source and a drain of the first transistor and one of a source and a drain of the second transistor. The other of the source and the drain of the first transistor is electrically connected to a gate of the third transistor. One of a source and a drain of the third transistor is electrically connected to one of a source and a drain of the fourth transistor.

The first circuit includes a second photoelectric conversion element, a fifth transistor, a sixth transistor, a seventh transistor, an eighth transistor, a ninth transistor, a comparator circuit, a selector circuit, and an inverter circuit. One terminal of the second photoelectric conversion element is electrically connected to one of a source and a drain of the fifth transistor. The one of the source and the drain of the fifth transistor is electrically connected to a gate of the fifth transistor. The other of the source and the drain of the fifth transistor is electrically connected to one of a source and a drain of the sixth transistor. The gate of the fifth transistor is electrically connected to a gate of the sixth transistor. The other of the source and the drain of the sixth transistor is electrically connected to one of a source and a drain of the seventh transistor and one of a non-inverting input terminal and an inverting input terminal of the comparator circuit. An output terminal of the comparator circuit is electrically connected to a selection signal input terminal of the selector circuit. A first input terminal of the selector circuit is electrically connected to a first wiring. A second input terminal of the selector circuit is electrically connected to a second wiring. An output terminal of the selector circuit is electrically connected to a gate of the second transistor. A gate of the eighth transistor is electrically connected to the output terminal of the comparator circuit and an input terminal of the inverter circuit. One of a source and a drain of the eighth transistor is electrically connected to one of a source and a drain of the ninth transistor and the other of the source and the drain of the second transistor. The other of the source and the drain of the eighth transistor is electrically connected to a third wiring. A gate of the ninth transistor is electrically connected to an output terminal of the inverter circuit. The other of the source and the drain of the ninth transistor is electrically connected to a fourth wiring.

Alternatively, in the first circuit, the one terminal of the second photoelectric conversion element may be electrically connected to the one of the source and the drain of the sixth transistor and the other terminal of the second photoelectric conversion element may be electrically connected to the one of the source and the drain of the fifth transistor and the gate of the fifth transistor.

The second wiring may be electrically connected to the third wiring.

In addition, the first wiring has a function of supplying a first potential or a second potential, the second wiring has a function of supplying a third potential or a fourth potential, the third wiring has a function of supplying the third potential, and the fourth wiring has a function of supplying a fifth potential. The first potential is a potential at which the source and the drain of the second transistor are brought into conduction when the first potential is applied to the gate of the second transistor, and the second potential and the fourth potential are potentials at which the source and the drain of the second transistor are not brought into conduction when the second potential and the fourth potential are applied to the gate of the second transistor. In addition, the third potential is a potential at which an avalanche multiplication phenomenon occurs in the first photoelectric conversion element when the third potential is applied to the other of the source and the drain of the second transistor, and the third potential is higher than the fifth potential.

Furthermore, the pixel included in the imaging device of one embodiment of the present invention may include a capacitor. One terminal of the capacitor is electrically connected to the other of the source and the drain of the first transistor.

Furthermore, the first photoelectric conversion element and the second photoelectric conversion element may each contain a material containing selenium.

Furthermore, the first transistor and the second transistor may each contain an oxide semiconductor in an active layer, and the oxide semiconductor may contain In, Zn, and M (M is Al, Ti, Ga, Sn, Y, Zr, La, Ce, Nd, or Hf).

Another embodiment of the present invention is a method for operating an imaging device including a pixel including a first photoelectric conversion element and a first circuit including a second photoelectric conversion element. In the operating method, the imaging device operates in a first mode or a second mode. When the illuminance of light with which the first photoelectric conversion element is irradiated is increased, an increase rate of a writing current flowing to the pixel is lower in the second mode than in the first mode. In a first step, the second photoelectric conversion element is irradiated with light. In a second step, whether the illuminance of light with which the second photoelectric conversion element is irradiated is higher than the reference illuminance or not is judged. When the illuminance of the light is higher than the reference illuminance, in a third step, a voltage higher than or equal to 0 V at which an avalanche multiplication phenomenon does not occur is applied to both terminals of the first photoelectric conversion element and imaging is performed in the first mode. When the illuminance of the light is lower than the reference illuminance, in a fourth step, a voltage at which an avalanche multiplication phenomenon occurs is applied to both terminals of the first photoelectric conversion element and imaging is performed in the second mode.

Another embodiment of the present invention is an electronic device including the imaging device of one embodiment of the present invention and a display device.

One embodiment of the present invention can provide an imaging device or the like having a novel structure in which a wide dynamic range can be achieved in imaging using a photoelectric conversion element utilizing an avalanche multiplication phenomenon. In addition, one embodiment of the present invention can provide an imaging device or the like having a novel structure with high photosensitivity.

In addition, one embodiment of the present invention can provide an operating method or the like of an imaging device having a novel structure in which a wide dynamic range can be achieved in imaging using a photoelectric conversion element utilizing an avalanche multiplication phenomenon. In addition, one embodiment of the present invention can provide an operating method or the like of an imaging device having a novel structure with high photosensitivity.

In addition, one embodiment of the present invention can provide a novel imaging device, an operating method of the novel imaging device, a novel electronic device, or the like.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

In the accompanying drawings.

FIG. 28 is a cross-sectional view illustrating a structure of an imaging device;

FIGS. 35A1, 35A2, 35A3, 35B1, 35B2, and 35B3 illustrate bent imaging devices;

FIGS. 45A to 45C are a top view and cross-sectional views illustrating a transistor;

FIGS. 50A and 50B show cross-sectional TEM images of an a-like OS;

DETAILED DESCRIPTION OF THE INVENTION

Figure 1:
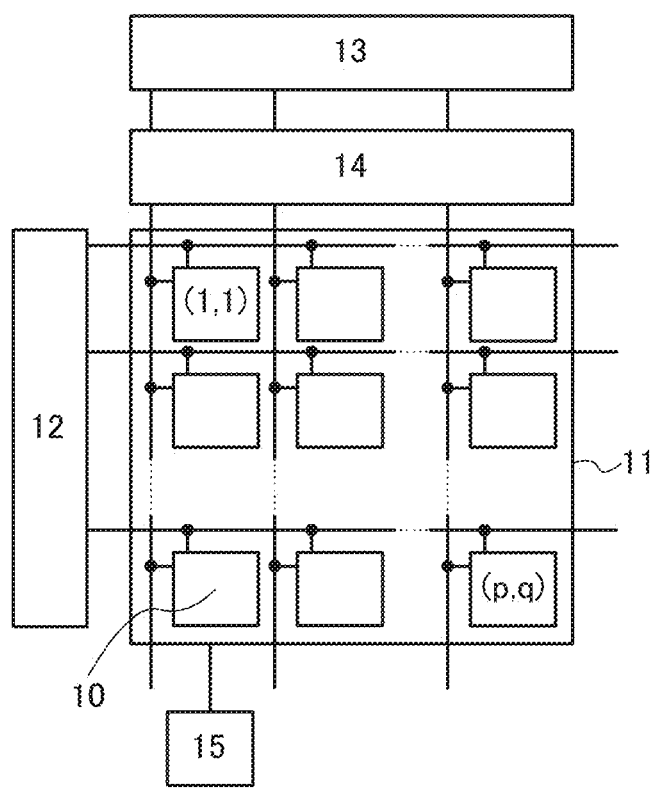
FIG. 1 is a block diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Since the source and the drain of the transistor change depending on the structure, operating conditions, and the like of the transistor, it is difficult to define which is a source or a drain. Thus, the terms "source" and "drain" can be interchanged with each other depending on the case or circumstances.

In this specification, ordinal numbers such as "first," "second," and "third" are used to avoid confusion among components, and thus do not limit the number of the components.

In this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive layer, and a layer).

Examples of the case where X and Y are directly connected include the case where an element that enables electrical connection between X and Y (e.g., a switch, a transistor, a capacitor, an inductor, a resistor, a diode, a display element, a light-emitting element, and a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring functions as an electrode, one conductive layer functions as the wiring and the electrode. Thus, "electrical connection" in this specification includes in its category such a case where one conductive layer has functions of a plurality of components.

Note that in this specification, terms for explaining arrangement, such as "over" and "under," are used for convenience to describe the positional relationship between components with reference to drawings. The positional relationship between components is changed as appropriate in accordance with a direction in which each component is described. Thus, there is no limitation on terms used in this specification, and description can be made appropriately depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Note that the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Embodiment 1

An imaging device of one embodiment of the present invention is described with reference to drawings.

In this specification and the like, an imaging device refers to any device that has an imaging function. The imaging device also indicates a circuit having a function of imaging or an entire system including such a circuit.

One embodiment of the present invention is an imaging device which has a function of suppressing a writing current flowing to a pixel including a photoelectric conversion element when an avalanche multiplication phenomenon occurs in the photoelectric conversion element, for example. Thus, for example, even when the avalanche multiplication phenomenon occurs to obtain the imaging data, the dynamic range can be broadened. That is, both the high photosensitivity and the wide dynamic range can be achieved.

FIG. 1 is a block diagram illustrating the configuration of an imaging device of one embodiment of the present invention. The imaging device includes pixels 10, a circuit 12, a circuit 13, a circuit 14, and a circuit 15. The pixels 10 are arranged in a matrix with p rows and q columns (p and q are each an integer of 2 or more) and are included in a pixel array 11.

The pixels 10 are electrically connected to the circuit 12, the circuit 13, the circuit 14, and the circuit 15.

The circuit 12 serves as a row driver for selecting a row of the pixel array 11. The circuit 13 serves as a column driver for selecting a column of the pixel array 11. The circuit 14 serves as an A/D conversion circuit.

The circuit 15 serves as a controller for switching operation modes of the imaging device of one embodiment of the present invention in accordance with the illuminance of irradiation light, as detailed later.

A variety of circuits, such as a decoder and a shift register, are used for the circuit 12 and the circuit 13.

Figure 2:
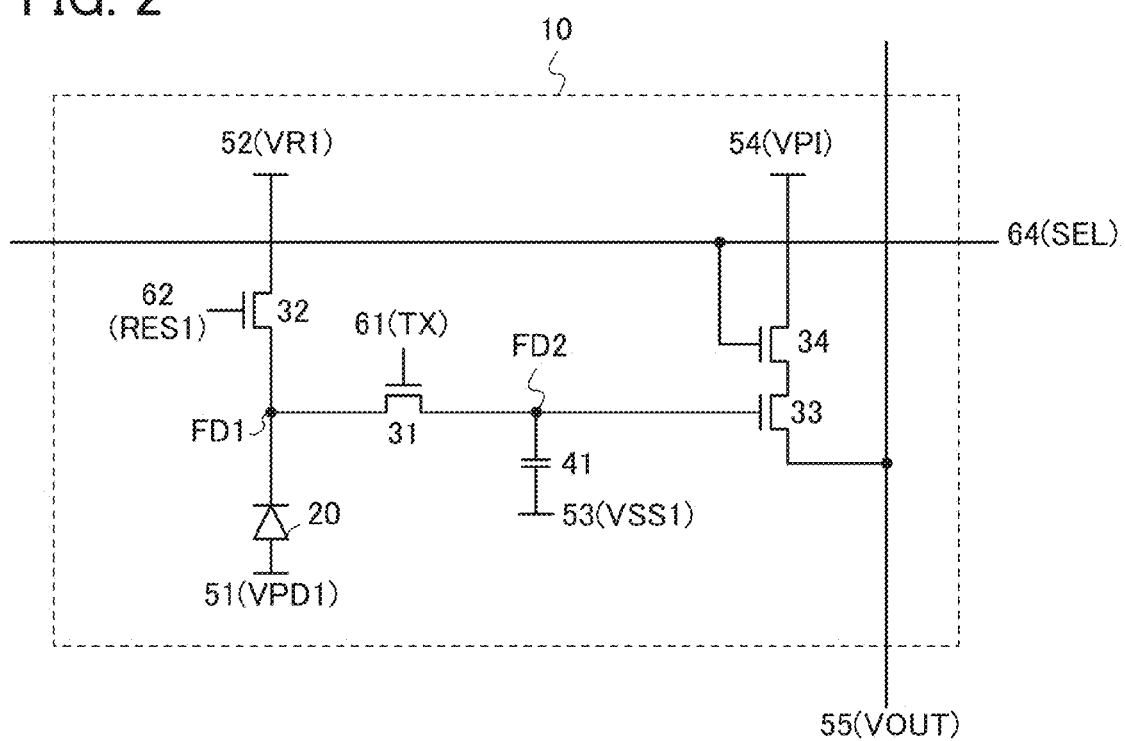
FIG. 2 illustrates a pixel circuit of an imaging device.

FIG. 2 is a circuit diagram of the pixel 10 in FIG. 1. The pixel 10 includes a photoelectric conversion element 20, a transistor 31, a transistor 32, a transistor 33, a transistor 34, and a capacitor 41. Note that in FIG. 2, the transistors 31 to 34 are all n-channel transistors.

In this specification, in some cases, an n-channel transistor is referred to as an n-ch transistor and a p-channel transistor is referred to as a p-ch transistor.

For the photoelectric conversion element 20, a selenium-based material can be used. The photoelectric conversion element has high external quantum efficiency with respect to visible light. In addition, the avalanche multiplication phenomenon occurs, whereby a highly sensitive sensor in which the number of multiplied electrons with respect to the amount of irradiation light is large can be obtained. Thus, in particular, when the illuminance of irradiation light is low, the avalanche multiplication phenomenon desirably occurs.

Note that the avalanche multiplication phenomenon can be caused by applying a relatively high voltage (e.g., higher than or equal to 10 V and lower than or equal to 50 V) to both terminals of the photoelectric conversion element.

In this specification, the range of voltages in which the avalanche multiplication phenomenon occurs is referred to as an avalanche region in some cases. In addition, the range of voltages in which the avalanche multiplication phenomenon does not occur (e.g., higher than or equal to 0 V and lower than 10 V) is referred to as a normal region in some cases. The voltages in the avalanche region are higher than those in the normal region.

Moreover, the range of voltages applied to both terminals of the photoelectric conversion element is referred to as an operation region of the photoelectric conversion element in some cases. For example, the operation of the photoelectric conversion element in the avalanche region is expressed as follows: "the operation region of the photoelectric conversion element is set to the avalanche region" in some cases. In addition, the operation of the photoelectric conversion element in the normal region is expressed as follows: "the operation region of the photoelectric conversion element is set to the normal region" in some cases.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced.

Moreover, crystalline selenium has higher spectral sensitivity to and a higher absorption coefficient for visible light than amorphous selenium.

Furthermore, for the photoelectric conversion element 20, a material containing a compound of copper, indium, and selenium (CIS) may be used. Alternatively, a layer including a compound of copper, indium, gallium, and selenium (CIGS) may be used. With CIS or CIGS, a photoelectric conversion element that can utilize an avalanche multiplication phenomenon in a manner similar to that of a single layer of selenium can be formed.

Note that for the photoelectric conversion element 20, a selenium-based material is not necessarily used. For example, a PIN diode element formed using an amorphous silicon film, a microcrystalline silicon film, or the like may be used.

The imaging device of one embodiment of the present invention, for example, when the photoelectric conversion element is operated in the avalanche region, performs imaging in a wide dynamic range mode, which is an imaging mode in which the increase rate of a writing current flowing to the pixel 10 is suppressed when the illuminance of light with which the photoelectric conversion element is irradiated is increased. Accordingly, the dynamic range can be broadened even in the operation in the avalanche region. In other words, both the high photosensitivity and the wide dynamic range can be achieved.

In the pixel 10 in FIG. 2, one terminal of the photoelectric conversion element 20 is electrically connected to one of a source and a drain of the transistor 31 and one of a source and a drain of the transistor 32. The other of the source and the drain of the transistor 31 is electrically connected to a gate of the transistor 33 and one terminal of the capacitor 41. One of a source and a drain of the transistor 33 is electrically connected to one of a source and a drain of the transistor 34.

The other terminal of the photoelectric conversion element 20 is electrically connected to a wiring 51 (VPD1). The other of the source and the drain of the transistor 32 is electrically connected to a wiring 52 (VR1). The other terminal of the capacitor 41 is electrically connected to a wiring 53 (VSS1). The other terminal of the transistor 34 is electrically connected to a wiring 54 (VPI). The other of the source and the drain of the transistor 33 is electrically connected to a wiring 55 (VOUT).

A gate of the transistor 31 is electrically connected to a wiring 61 (TX). A gate electrode of the transistor 32 is electrically connected to a wiring 62 (RES1). A gate electrode of the transistor 34 is electrically connected to a wiring 64 (SEL).

Here, the wiring 51 (VPD1), the wiring 52 (VR1), the wiring 53 (VSS1), and the wiring 54 (VPI) can serve as power supply lines. In addition, the wiring 61 (TX), the wiring 62 (RES1), and the wiring 64 (SEL) can serve as signal lines. As detailed later, the wiring 52 (VR1) and the wiring 62 (RES1) are electrically connected to the circuit 15.

In the above configuration, a node where the one terminal of the photoelectric conversion element 20, the one of the source and the drain of the transistor 31, and the one of the source and the drain of the transistor 32 are connected to one another is denoted by FD1. A node where the other of the source and the drain of the transistor 31, the gate of the transistor 33, and the one terminal of the capacitor 41 are connected to one another is denoted by FD2.

In the pixel 10, the photoelectric conversion element 20 is a light-receiving element and has a function of generating current based on the light with which the photoelectric conversion element 20 is irradiated. The transistor 31 has a function of controlling the charge accumulation in and the charge release from the node FD1 by the photoelectric conversion element 20. The transistor 32 has a function of resetting the potentials of the nodes FD1 and FD2 and a function of adjusting the increase rate of a writing current flowing to the pixel 10 when the illuminance of light with which the photoelectric conversion element 20 is irradiated is increased. The transistor 33 serves as an amplifying transistor configured to output a signal based on the potential of the node FD2. The transistor 34 serves as a selection transistor configured to control selection of the pixel 10 in reading.

Imaging data captured by the pixel 10 can be output as a signal through the wiring 55 (VOUT).

The imaging device of one embodiment of the present invention can be operated in a normal imaging mode or a wide dynamic range mode. In the wide dynamic range mode, the increase rate of a writing current flowing to the pixel 10 is lower than that in the normal imaging mode when the illuminance of light with which the photoelectric conversion element 20 is irradiated is increased.

Examples of the conditions of switching from the normal imaging mode to the wide dynamic range mode or from the wide dynamic range mode to the normal imaging mode are, as detailed later, the illuminance of light with which the circuit 15 is irradiated, and the like.

Details of the operation of the pixel 10 in the normal imaging mode and the wide dynamic range mode will be described using timing charts of FIG. 3 and FIG. 4A. The timing charts each show the potentials of the wirings 52 (VR1), 61 (TX), 62 (RES1), and 64 (SEL) and the nodes FD1 and FD2.

Figure 3:
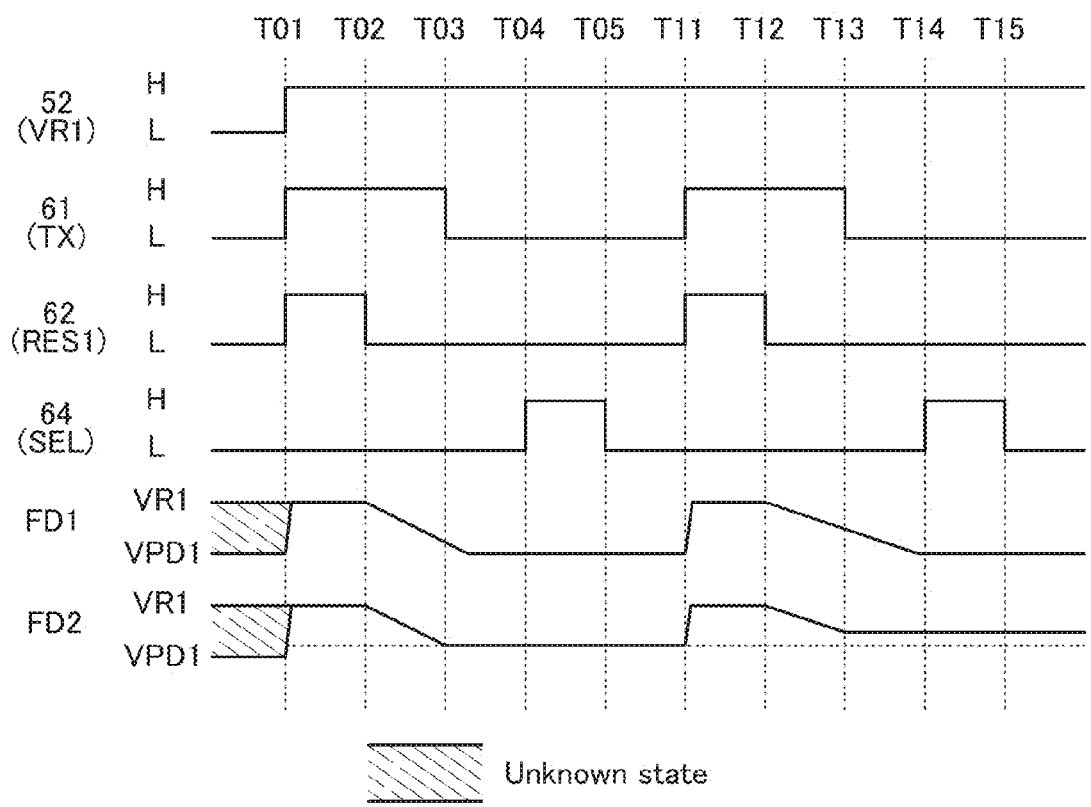
FIG. 3 is a timing chart illustrating imaging operation.

FIG. 3 is a timing chart showing the operation of the pixel 10 in the normal imaging mode. At Time T01 to Time T05, the first frame is imaged, and at Time T11 to Time T15, the second frame is imaged.

Here, the potentials of the wiring 52 (VR1) and the wiring 54 (VPI) are set at an H level and the potentials of the wiring 51 (VPD1) and the wiring 53 (VSS1) are set at an L level; however, the above wirings can be supplied with different potentials.

In this specification, the H level and the L level refer to a high potential and a low potential, respectively. The L level can be a ground potential, for example.

At Time T01, the potentials of the wiring 61 (TX) and the wiring 62 (RES1) are set at an H level, whereby the transistor 31 and the transistor 32 are turned on. In addition, the potential of the wiring 64 (SEL) is set at an L level, whereby the transistor 34 is turned off. As a result, the potentials of the nodes FD1 and FD2 are set at the potential VR1 of the wiring 52 (VR1).

At Time T02, the potential of the wiring 62 (RES1) is set at an L level, whereby the transistor 32 is turned off, and the potentials of the nodes FD1 and FD2 start to be decreased. The higher the illuminance of light with which the photoelectric conversion element 20 is irradiated is, the larger the potential decrease at the node FD2 is.

At Time T03, the potential of the wiring 61 (TX) is set at an L level, whereby the transistor 31 is turned off. Accordingly, the potential of the node FD2 is retained. Note that the node FD1 continues to be discharged after T03.

At Time T04, the potential of the wiring 64 (SEL) is set at an H level, whereby the transistor 34 is turned on. Thus, a signal that corresponds to imaging data is output to the wiring 55 (VOUT) in accordance with the potential of the node FD2. Note that the lower the potential of the node FD2 is, the lower the potential of the signal output from the wiring 55 (VOUT) becomes. In other words, the higher the illuminance of light with which the photoelectric conversion element 20 is irradiated is, the lower the potential of the signal output from the wiring 55 (VOUT) becomes.

At Time T05, the potential of the wiring 64 (SEL) is set at an L level, whereby the transistor 34 is turned off.

The operation at Time T11 to Time T15 is similar to the operation at Time T01 to Time T05. At Time T11 to Time T15, the illuminance of light with which the photoelectric conversion element 20 is irradiated is lower than that at Time T01 to Time T05. Thus, the potential of the node FD2 at Time T13 is higher than that of the node FD2 at Time T03. The above is the description of the imaging operation in the normal imaging mode.

Figure 4A:
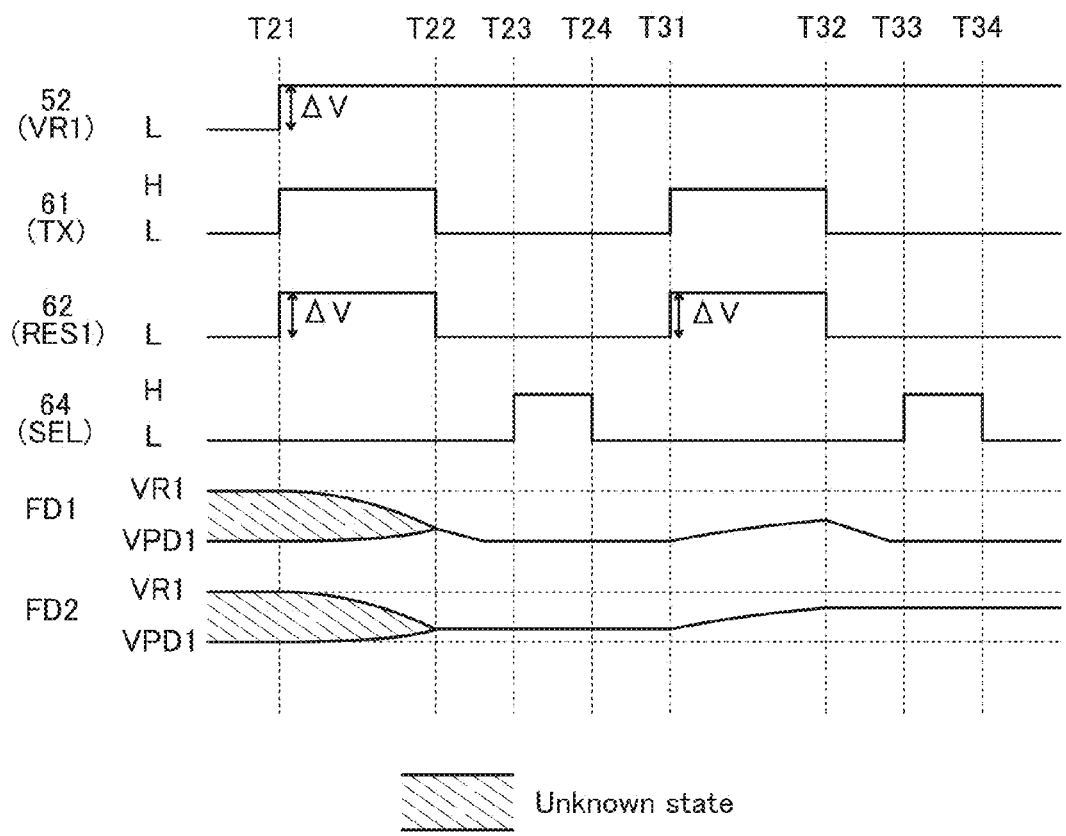
FIGS. 4A and 4B are a timing chart and a circuit diagram illustrating imaging operation.

FIG. 4A is a timing chart showing the operation of the pixel 10 in the wide dynamic range mode. At Time T21 to Time T24, the first frame is imaged, and at Time T31 to Time T34, the second frame is imaged.

Here, the potential of the wiring 54 (VPI) is set at an H level and the potentials of the wiring 51 (VPD1) and the wiring 53 (VSS1) are set at an L level; however, the above wirings can be supplied with different potentials.

Figure 4B:
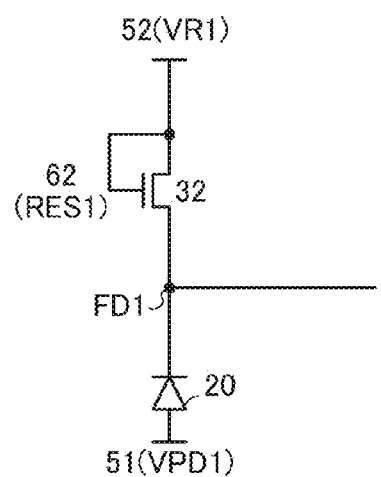

At Time T21, the potential of the wiring 61 (TX) is set at an H level, whereby the transistor 31 is turned on. In addition, the same potential as the potential ΔV which is applied to the wiring 52 (VR1) is applied to the wiring 62 (RES1). This is equivalent to the case where the gate of the transistor 32 is diode-connected to the other of the source or drain thereof as illustrated in FIG. 4B. Note that in FIG. 4B, some structure elements and wirings in the pixel 10 are not illustrated.

When the photoelectric conversion element 20 is irradiated with light, current flows from the node FD1 to the wiring 51 (VPD1), and the potential of the node FD1 is decreased. Thus, in the diode-connected transistor 32, a potential difference between the source and the drain of the transistor 32 is increased. As a result, current flows from the wiring 52 (VR1) to the node FD1, and the potential of the node FD1 is increased. That is, when current flows through the transistor 32, the decreasing width of the node FD1 due to light with which the photoelectric conversion element 20 is irradiated can be reduced.

As described above, in the wide dynamic range mode, the dynamic range can be broadened as compared with that in the normal imaging mode.

The higher the illuminance of light with which the photoelectric conversion element 20 is irradiated is, the larger the current which flows from the node FD1 to the wiring 51 (VPD1) becomes, whereby the potential of the node FD1 is decreased. Accordingly, the potential of the node FD2 is also decreased.

At Time T22, the potentials of the wiring 61 (TX) and the wiring 62 (RES1) are set at an L level, whereby the transistors 31 and 32 are turned off. Accordingly, the potential of the node FD2 is retained. Note that the node FD1 is continuously discharged after T22.

At Time T23, the potential of the wiring 64 (SEL) is set at an H level, whereby the transistor 34 is turned on. Thus, a signal that corresponds to imaging data is output to the wiring 55 (VOUT) in accordance with the potential of the node FD2. Note that the lower the potential of the node FD2 is, the lower the potential of the wiring 55 (VOUT) becomes. In other words, the higher the illuminance of light with which the photoelectric conversion element 20 is irradiated is, the lower the potential of the wiring 55 (VOUT) becomes.

At Time T24, the potential of the wiring 64 (SEL) is set at an L level, whereby the transistor 34 is turned off.

The operation at Time T31 to Time T34 is similar to the operation at Time T21 to Time T24. At Time T31 to Time T34, the illuminance of light with which the photoelectric conversion element 20 is irradiated is lower than that at Time T21 to Time T24. Thus, the potential of the node FD2 at Time T32 is higher than that of the node FD2 at Time T22. The above is the description of the imaging operation in the wide dynamic range mode.

Note that the potential ΔV may constantly continue to be applied to the wiring 62 (RES1). As a result, the potential of the wiring 62 (RES1) can be easily controlled.

In the case where the illuminance of irradiation light is increased, the increase rate of a writing current flowing to the pixel 10 is higher when the photoelectric conversion element is operated in the avalanche region than when it is operated in the normal region. Thus, when the photoelectric conversion element is operated in the avalanche region, it is preferable that the increase rate of the current be reduced by imaging in the wide dynamic range mode. On the other hand, when the photoelectric conversion element is operated in the normal region, imaging in the normal imaging mode is preferred. However, imaging may be performed in the avalanche region in the normal imaging mode or may be performed in the normal region in the wide dynamic range mode.

Figure 5:
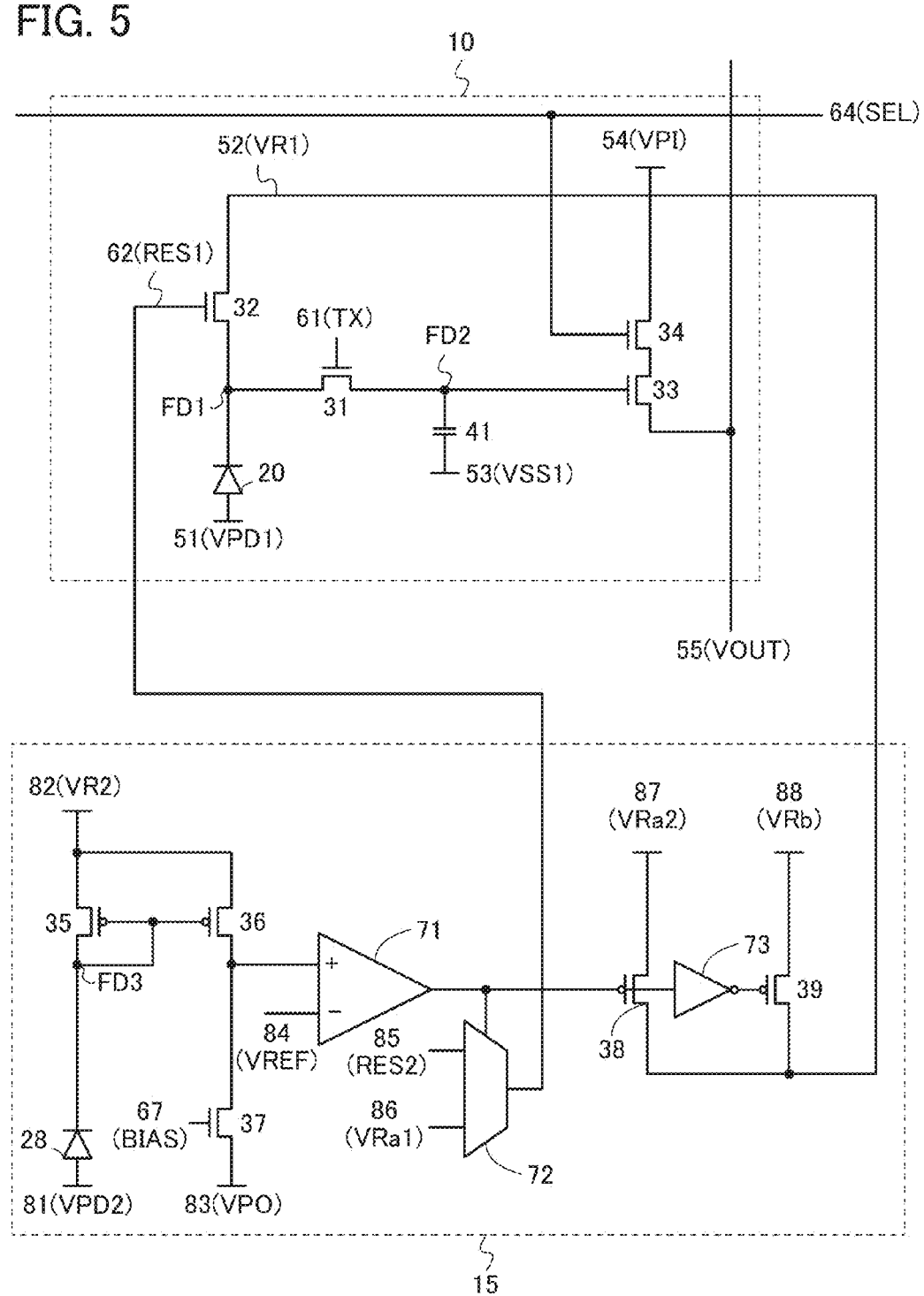
FIG. 5 illustrates a circuit of an imaging device.

Next, details of the circuit 15 are described with reference to FIG. 5. FIG. 5 is a circuit diagram showing the configurations of the pixel 10 and the circuit 15 and the connection relation therebetween.

The circuit 15 has a function of switching operation regions of the photoelectric conversion element 20 and imaging modes in accordance with the illuminance of irradiation light. For example, when the illuminance of irradiation light is lower than the reference illuminance, imaging can be performed in the avalanche region in the wide dynamic range mode. Alternatively, for example, when the illuminance of irradiation light is higher than the reference illuminance, imaging can be performed in the normal region in the normal imaging mode.

The circuit 15 includes a photoelectric conversion element 28, a transistor 35, a transistor 36, a transistor 37, a transistor 38, a transistor 39, a comparator 71, a selector 72, and an inverter 73. Although the transistors 35, 36, 38, and 39 are p-ch transistors and the transistor 37 is an n-ch transistor in FIG. 5, a p-ch transistor may be replaced with an n-ch transistor, and vice versa as appropriate. For example, all of the transistors 35 to 39 may be p-ch transistors.

For the photoelectric conversion element 28, the same material as that of the photoelectric conversion element 20, such as a selenium-based material, can be used. Alternatively, a material which is different from that of the photoelectric conversion element 20 can be used for the photoelectric conversion element 28.

In the circuit 15 in FIG. 5, one terminal of the photoelectric conversion element 28 is electrically connected to one of a source and a drain of the transistor 35. The one of the source and the drain of the transistor 35 is electrically connected to a gate of the transistor 35. The other of the source and the drain of the transistor 35 is electrically connected to one of a source and a drain of the transistor 36. The gate of the transistor 35 is electrically connected to a gate of the transistor 36. The other of the source and the drain of the transistor 36 is electrically connected to one of a source and a drain of the transistor 37 and a non-inverting input terminal of the comparator 71. An output terminal of the comparator 71 is electrically connected to a selection signal input terminal of the selector 72 and a gate of the transistor 38. An output terminal of the selector 72 is electrically connected to the wiring 62 (RES1). The gate of the transistor 38 is electrically connected to an input terminal of the inverter 73. One of a source and a drain of the transistor 38 is electrically connected to one of a source and a drain of the transistor 39 and the wiring 52 (VR1). A gate of the transistor 39 is electrically connected to an output terminal of the inverter 73.

The other terminal of the photoelectric conversion element 28 is electrically connected to a wiring 81 (VPD2). The other of the source and the drain of the transistor 35 is electrically connected to a wiring 82 (VR2). The other of the source and the drain of the transistor 37 is electrically connected to a wiring 83 (VPO). An inverting input terminal of the comparator 71 is electrically connected to a wiring 84 (VREF). A first input terminal of the selector 72 is electrically connected to a wiring 85 (RES2). A second input terminal of the selector 72 is electrically connected to a wiring 86 (VRa1). The other of the source and the drain of the transistor 38 is electrically connected to a wiring 87 (VRa2). The other of the source and the drain of the transistor 39 is electrically connected to a wiring 88 (VRb).

A gate of the transistor 37 is electrically connected to a wiring 67 (BIAS).

In the above configuration, a node where the one terminal of the photoelectric conversion element 28, the one of the source and the drain of the transistor 35, the gate of the transistor 35, and the gate of the transistor 36 are connected to one another is denoted by FD3.

The transistor 37 serves as a constant current source. The selector 72 has a function of outputting the potential applied to the first input terminal when the potential of the selection signal input terminal is at an H level and outputting the potential applied to the second input terminal when the potential of the selection signal input terminal is at an L level.

Figure 6:
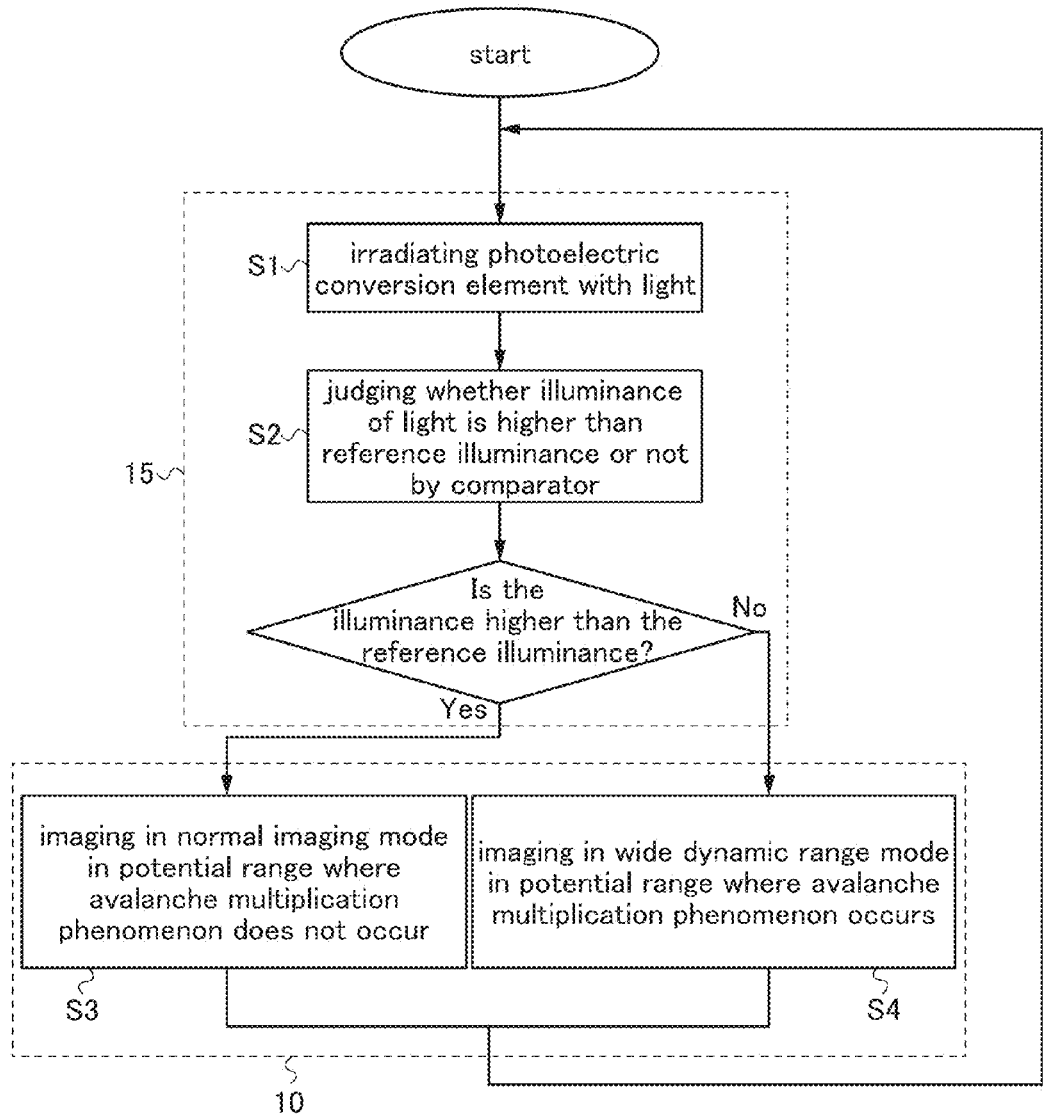
FIG. 6 is a flow chart showing an operating method of an imaging device.

The operation of the circuit 15 and the pixel 10 is described below with reference to a flowchart of FIG. 6. In FIG. 6, S1 and S2 show the operation of the circuit 15, and S3 and S4 show the operation of the pixel 10.

Here, the potentials of the wiring 67 (BIAS) and the wiring 82 (VR2) are set at an H level and the potentials of the wiring 81 (VPD2) and the wiring 83 (VPO) are set at an L level; however, the above wirings can be supplied with different potentials.

First, the photoelectric conversion element 28 is irradiated with light (S1). Accordingly, current flows through the photoelectric conversion element 28, and the potential of the node FD3 is decreased. Since the one of the source and the drain of the transistor 35 is electrically connected to the gate of the transistor 35, the potential of the gate of the transistor 35 is decreased and the transistor 35 is turned on. The transistor 35 and the transistor 36 form a current mirror; thus, the same amount of current as a current flowing through the transistor 35 flows through the transistor 36.

The current flowing through the transistor 36 flows through the transistor 37, and a potential in accordance with the amount of the current is applied to the non-inverting input terminal of the comparator 71. In addition, to the inverting input terminal, a potential VREF is applied through the wiring 84 (VREF). The comparator 71 outputs an H level signal when the potential applied to the non-inverting input terminal is higher than VREF and outputs an L level signal when the potential is lower than VREF.

The higher the illuminance of light with which the photoelectric conversion element 28 is irradiated is, the higher the potential applied to the non-inverting input terminal of the comparator 71 becomes. When VREF is set to a potential corresponding to the illuminance of reference light, the comparator has a function of judging whether the illuminance of light with which the photoelectric conversion element 28 is irradiated is higher than the illuminance of reference light or not (S2). The comparator outputs an H level signal when the illuminance of light with which the photoelectric conversion element 28 is irradiated is higher than that of reference light and outputs an L level signal when the illuminance of light with which the photoelectric conversion element 28 is irradiated is lower than that of reference light.

When the H level signal is output from the comparator 71, a potential RES2 of the wiring 85 (RES2) is applied to the wiring 62 (RES1) by the selector 72, and a potential VRb of the wiring 88 (VRb) is applied to the wiring 52 (VR1) through the transistor 39. Alternatively, when the L level signal is output from the comparator 71, a potential VRa1 of the wiring 86 (VRa1) is applied to the wiring 62 (RES1) by the selector 72, and a potential VRa2 of the wiring 87 (VRa2) is applied to the wiring 52 (VR1) through the transistor 38.

Here, for example, the potential RES2 of the wiring 85 (RES2) is set at an H level or an L level, and the potential VRa1 of the wiring 86 (VRa1) is set at the potential VRa2 of the wiring 87 (VRa2) or an L level. In this manner, imaging can be performed such that the normal imaging mode is used when the H level signal is output from the comparator 71 and the wide dynamic range mode is used when the L level signal is output.

Furthermore, the potential VRb of the wiring 88 (VRb) is set to a potential (e.g., higher than or equal to 0 V and lower than 10 V) applied to the wiring 52 (VR1) when imaging is performed in the normal region, for example. In addition, the potential VRa2 of the wiring 87 (VRa2) is set to a potential (e.g., higher than or equal to 10 V and lower than or equal to 50 V) applied to the wiring 52 (VR1) when imaging is performed in the avalanche region, for example. As described above, when the illuminance is high, imaging can be performed in the normal region in the normal imaging mode (S3), and when the illuminance is low, imaging can be performed in the avalanche region in the wide dynamic range mode (S4). As a result, an imaging device with which imaging can be performed in a wide illuminance range from the low illuminance to the high illuminance.

In FIG. 6, whether the illuminance of light with which the photoelectric conversion element 28 is irradiated is higher than the reference is judged and the operation regions of the photoelectric conversion element 20 and the imaging modes are switched every time one frame is imaged; however, one embodiment of the present invention is not limited thereto. For example, the judgement may be performed every time two frames are imaged or after three or more frames are imaged.

In addition, the potentials RES2, VRa1, VRa2, and VRb are not limited to the above examples, and can be any value. For example, when the illuminance is high, the above potentials may be set to perform imaging in the normal region in the wide dynamic range mode. Alternatively, when the illuminance is low, the above potentials may be set to perform imaging in the avalanche region in the normal imaging mode.

Alternatively, the non-inverting input terminal of the comparator 71 may be electrically connected to the wiring 84 (VREF) and the inverting input terminal may be electrically connected to the other of the source and the drain of the transistor 36. In this case, the first input terminal and the second input terminal of the selector 72 are electrically connected to the wiring 86 (VRa1) and the wiring 85 (RES2), respectively, and the other of the source and the drain of the transistor 38 and the other of the source and the drain of the transistor 39 are electrically connected to the wiring 88 (VRb) and the wiring 87 (VRa2), respectively, whereby the circuit can have a function similar to that of the circuit 15 having the configuration illustrated in FIG. 5.

Figure 7A:
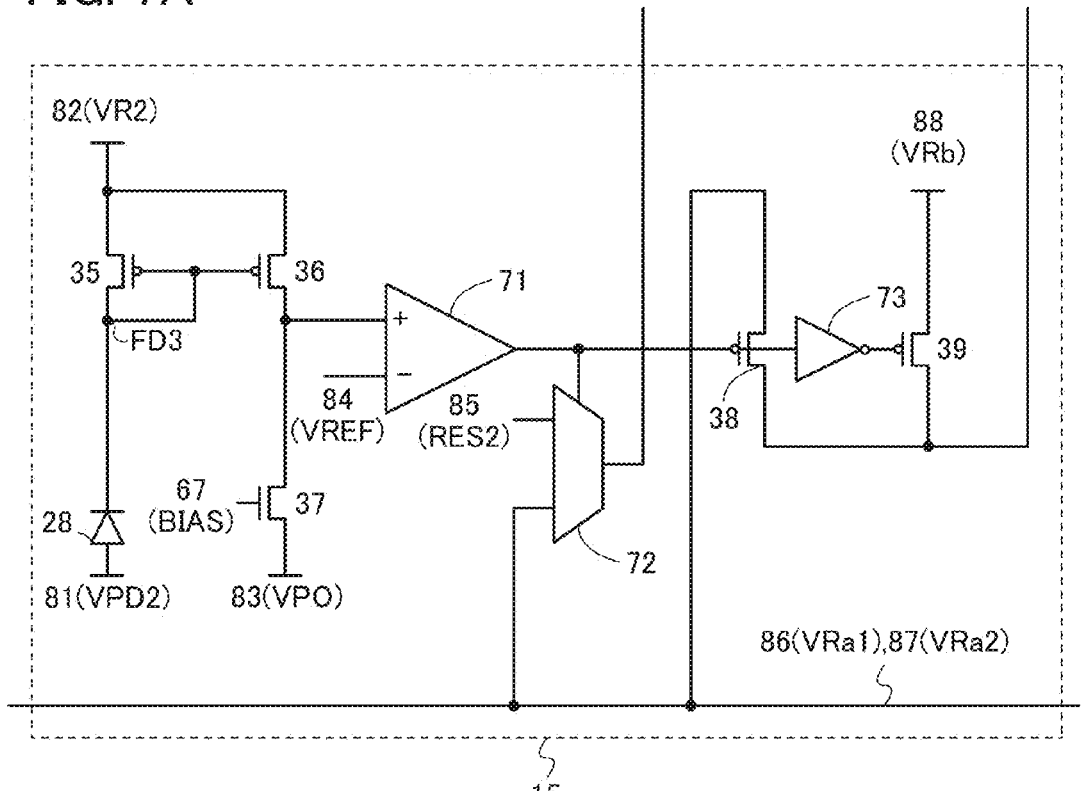
FIGS. 7A and 7B each illustrate a circuit of an imaging device.

Modification examples of the circuit 15 in FIG. 5 are shown in FIGS. 7A and 7B, FIGS. 8A and 8B, FIGS. 9A and 9B, and FIGS. 10A and 10B. The configuration of the circuit 15 in FIG. 7A is different from that of the circuit 15 in FIG. 5 in that the wiring 86 (VRa1) and the wiring 87 (VRa2) are electrically connected to each other. With the configuration, the potential ΔV shown in FIG. 4A constantly continues to be applied to the wiring 62 (RES1).

Figure 7B:
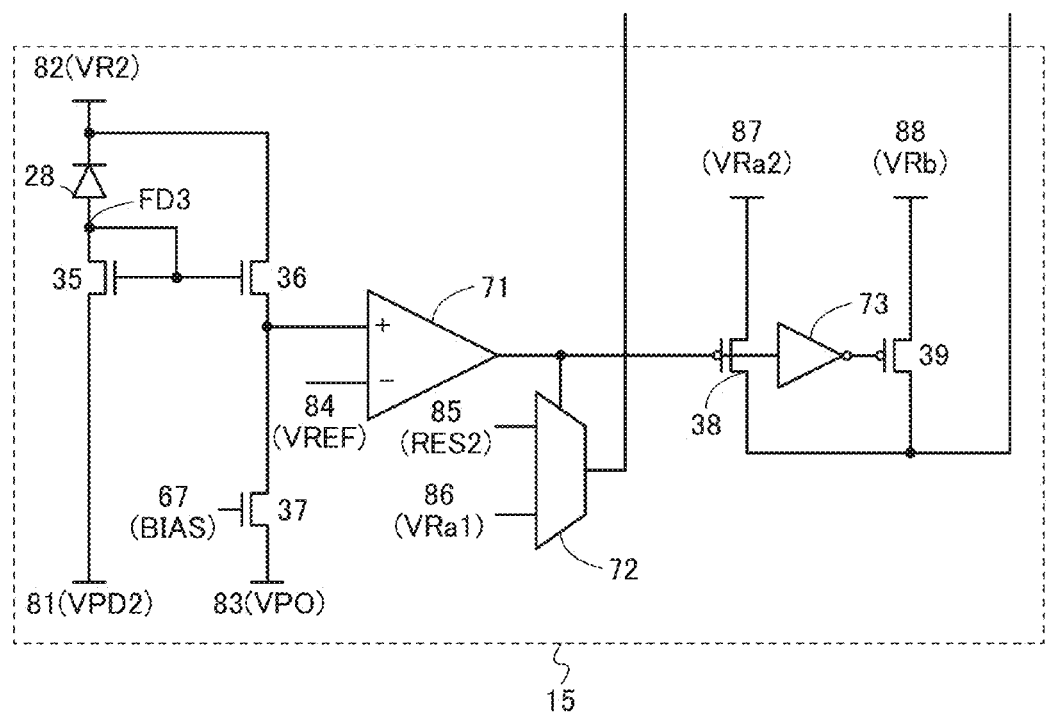

In the circuit 15 in FIG. 7B, one terminal of the photoelectric conversion element 28 is electrically connected to one of the source and the drain of the transistor 36 and the wiring 82 (VR2). The other terminal of the photoelectric conversion element 28 is electrically connected to the gate and the other of the source and the drain of the transistor 35. The gate of the transistor 35 is electrically connected to the gate of the transistor 36. One of the source and the drain of the transistor 35 is electrically connected to the wiring 81 (VPD2). In the above points, the circuit 15 in FIG. 7B is different from that in FIG. 5. With such a configuration, the transistors 35 and 36 can be n-ch transistors.

Figure 8A:
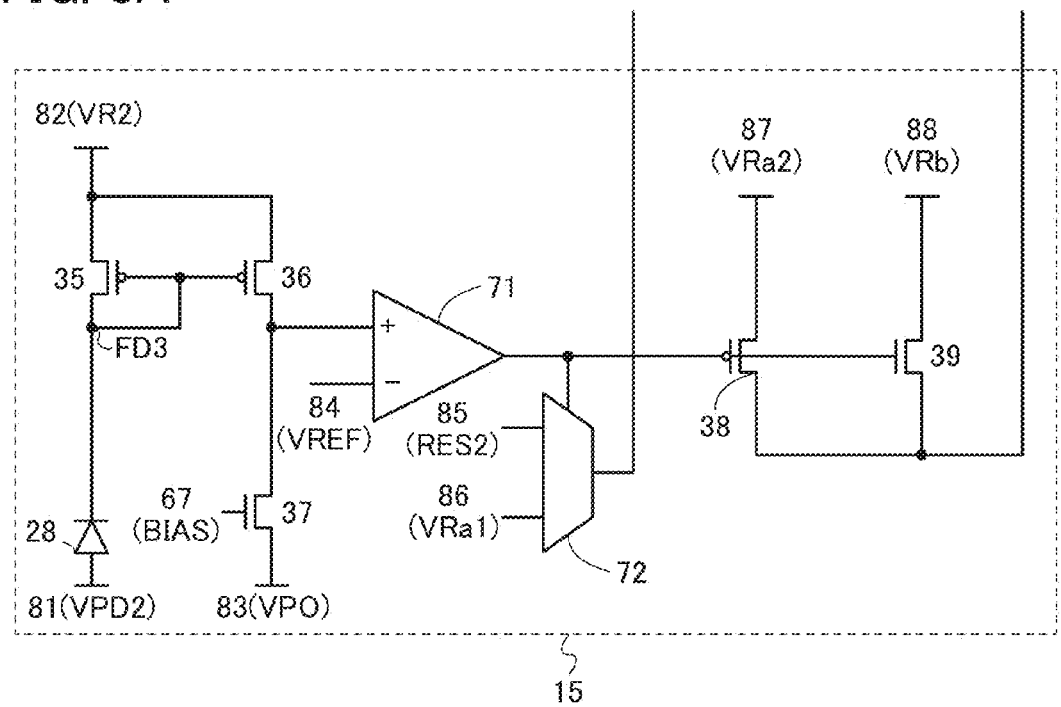
FIGS. 8A and 8B each illustrate a circuit of an imaging device.

The configuration of the circuit 15 in FIG. 8A is different from that of the circuit 15 in FIG. 5 in that the inverter 73 is not included and the transistor 39 is an n-ch transistor.

Figure 8B:
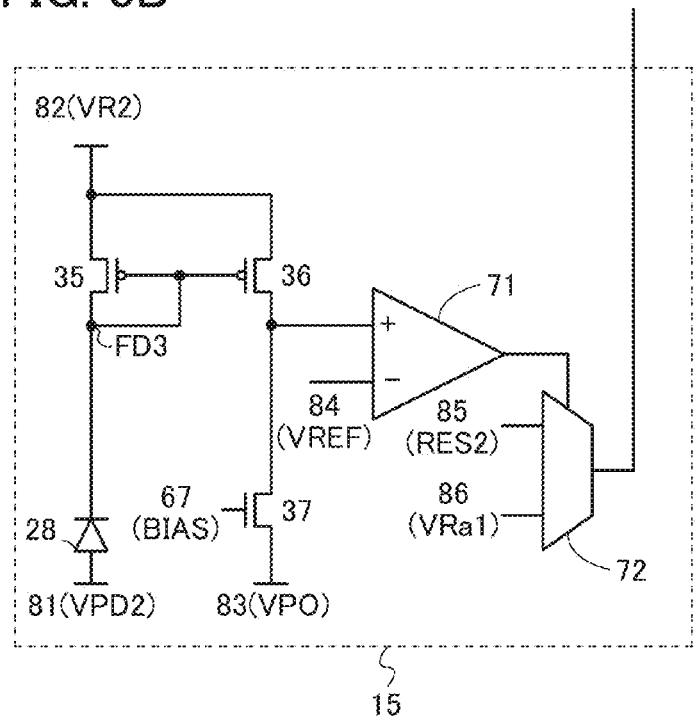

The configuration of the circuit 15 in FIG. 8B is different from that of the circuit 15 in FIG. 5 in that the transistor 38, the transistor 39, the inverter 73, the wiring 87 (VRa2), and the wiring 88 (VRb) are not included. In this case, the potential VR1 of the wiring 52 (VR1) is switched manually or by another circuit which is not illustrated so that the desired operation region of the photoelectric conversion element 20 can be achieved.

Figure 9A:
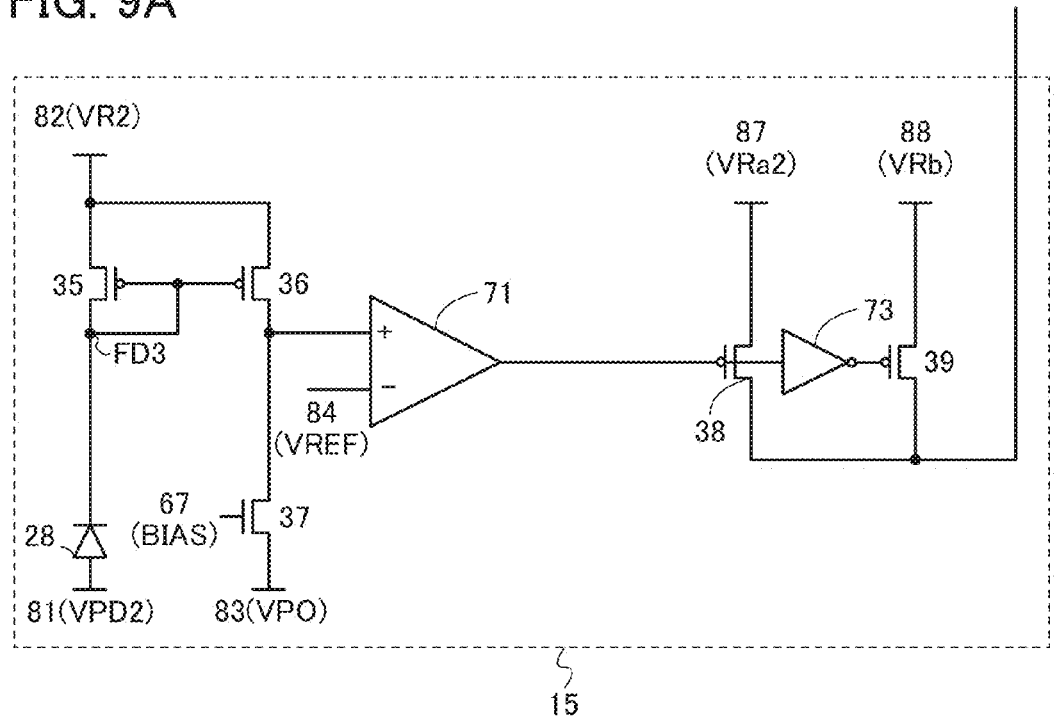
FIGS. 9A and 9B each illustrate a circuit of an imaging device.

The configuration of the circuit 15 in FIG. 9A is different from that of the circuit 15 in FIG. 5 in that the selector 72, the wiring 85 (RES2), and the wiring 86 (VRa1) are not included. In this case, the potential RES1 of the wiring 62 (RES1) is switched manually or by another circuit which is not illustrated in accordance with the imaging mode and the operation region of the photoelectric conversion element 20.

Figure 9B:
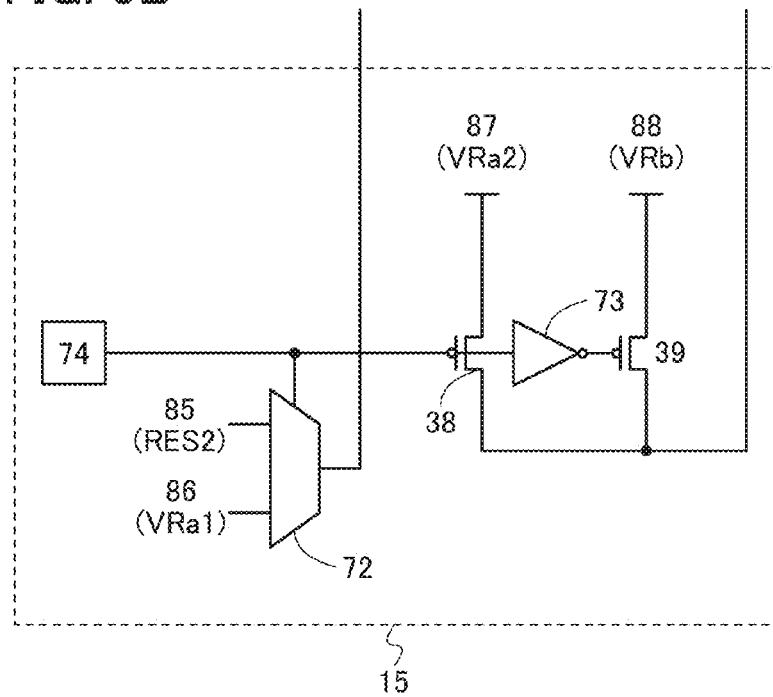

The configuration of the circuit 15 in FIG. 9B is different from that of the circuit 15 in FIG. 5 in that the photoelectric conversion element 28, the transistors 35 to 37, the comparator 71, the wiring 81 (VPD2), the wiring 82 (VR2), and the wiring 83 (VPO) are not included and a circuit 74 is included. The circuit 74 is electrically connected to the selection signal input terminal of the selector 72 and the gate of the transistor 38. In addition, the circuit 74 has a function of outputting an H level or L level signal. With the configuration illustrated in FIG. 9B, the signal output from the circuit 74 is controlled, whereby the imaging mode and the operation region of the photoelectric conversion element 20 can be switched manually.

With any of the configurations in FIGS. 8A and 8B and FIGS. 9A and 9B, the area occupied by the circuit 15 can be reduced. Accordingly, the imaging device of one embodiment of the present invention can be downsized.

Figure 10A:
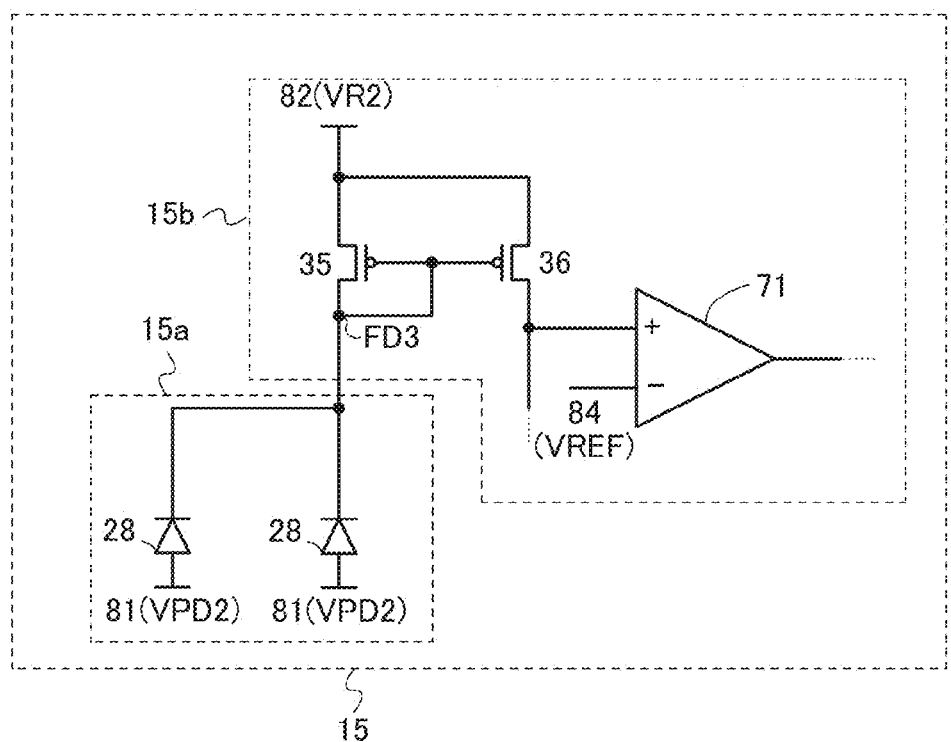
FIGS. 10A and 10B each illustrate a circuit of an imaging device.
Figure 10B:
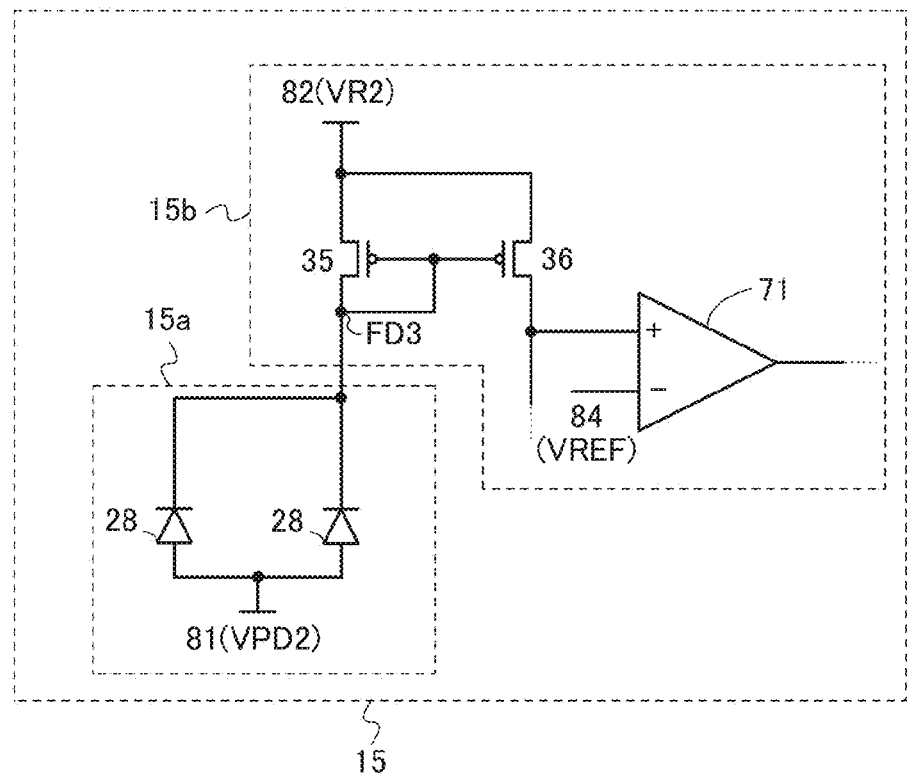

The configurations of the circuit 15 in FIGS. 10A and 10B are different from that of the circuit 15 in FIG. 5 in that a plurality of photoelectric conversion elements 28 are included. Two photoelectric conversion elements 28 may be provided as illustrated in FIGS. 10A and 10B. Alternatively, three or more photoelectric conversion elements 28 may be provided. Note that in FIGS. 10A and 10B, some structure elements and wirings are not illustrated.

In each of the circuits 15 having the configurations shown in FIGS. 10A and 10B, when at least one of the plurality of photoelectric conversion elements 28 is irradiated with light having high illuminance, the comparator 71 outputs an H level signal. That is, for example, imaging can be performed in the normal region in the normal imaging mode.

In FIGS. 10A and 10B, a circuit 15a indicates the photoelectric conversion element 28 and the wiring 81 (VPD2), and a circuit 15b indicates the other components. Note that for the configuration of the circuit 15b, any of the configurations in FIG. 5, FIGS. 7A and 7B, FIGS. 8A and 8B, and FIGS. 9A and 9B can be referred to as appropriate.

Although other terminals of the photoelectric conversion elements 28 are connected to different wirings 81 (VPD2) in FIG. 10A, other terminals of the photoelectric conversion elements 28 may be connected to one wiring 81 (VPD2) as illustrated in FIG. 10B.

Figure 11A:
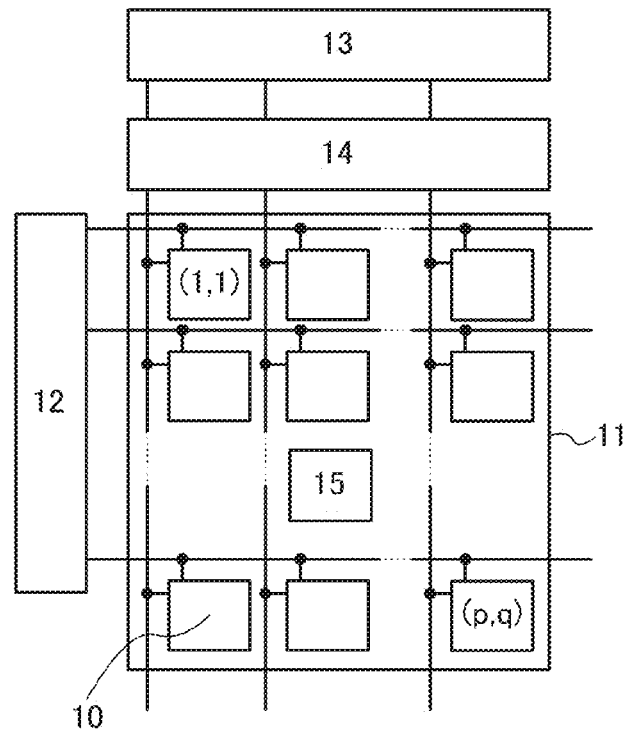
FIGS. 11A and 11B are each a block diagram illustrating an imaging device.

Modification examples of the imaging device of one embodiment of the present invention in FIG. 1 are shown in FIGS. 11A and 11B, FIGS. 12A and 12B, FIGS. 13A and 13B, and FIG. 14. An imaging device of one embodiment of the present invention in FIG. 11A is different from that in FIG. 1 in that the circuit 15 is provided in the pixel array 11. The circuit 15 can be provided at any position, and for example, the circuit 15 can be provided in the center of the pixel array 11. In the case where the circuit 15 is provided in the center of the pixel array 11, the imaging mode of the pixel 10 and the operation region of the photoelectric conversion element 20 can be controlled in accordance with the illuminance of light with which the center of the pixel array 11 is irradiated.

Figure 11B:
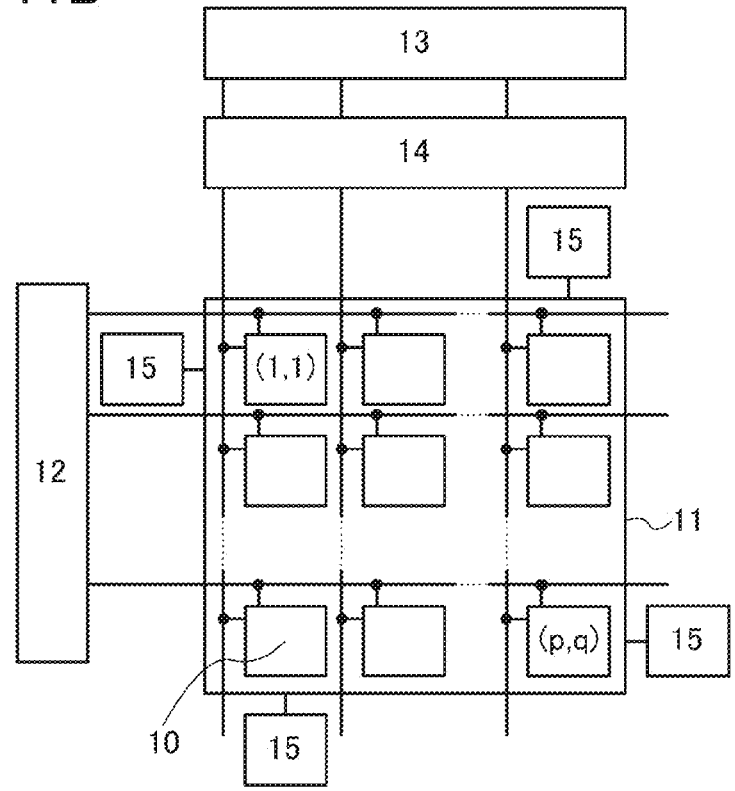

Furthermore, an imaging device of one embodiment of the present invention in FIG. 11B is different from that in FIG. 1 in that the plurality of circuits 15 are provided. For example, as illustrated in FIG. 11B, the circuits 15 may be provided at the four corners of the pixel array 11. With such a configuration, even when the illuminance of irradiation light differs depending on the positions, the imaging mode and the operation region of the photoelectric conversion element 20 can be controlled appropriately. For example, when an upper right portion of the pixel array 11 is irradiated with low illuminance light and a lower left portion of the pixel array 11 is irradiated with high illuminance light, in the pixels 10 in the upper right portion, imaging can be performed in the avalanche region in the wide dynamic range mode, and in the pixels 10 in the lower left portion, imaging can be performed in the normal region in the normal imaging mode.

Although the circuits 15 are provided at four positions in FIG. 11B, a given number of circuits 15 can be provided. For example, the circuits 15 may be provided at two or three positions. Alternatively, the circuits 15 may be provided at five or more positions. Furthermore, although the circuits 15 are provided at the four corners in FIG. 11B, the circuits 15 may be provided only at two positions of the upper right and lower left portions, for example. Alternatively, the circuits 15 may be provided only at two positions of the upper left and lower right portions, for example.

In each of the imaging devices of embodiments of the present invention illustrated in FIGS. 12A and 12B, FIGS. 13A and 13B, and FIG. 14, the circuit 15 includes the plurality of photoelectric conversion elements 28 and the circuit 15b as illustrated in FIGS. 10A and 10B.

Figure 12A:
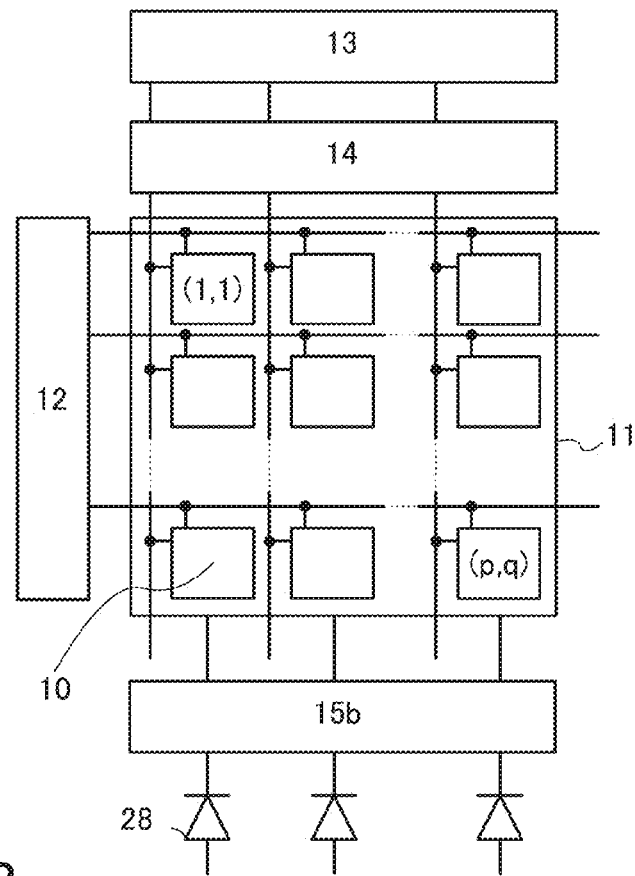
FIGS. 12A and 12B are each a block diagram illustrating an imaging device.

In FIG. 12A, the photoelectric conversion element 28 is provided for each column of the pixel array 11. Furthermore, in FIG. 12B, the photoelectric conversion element 28 is provided in each row of the pixel array 11.

Note that in the configuration in FIG. 12A, the photoelectric conversion element 28 can be provided in every plurality of columns. For example, the photoelectric conversion element 28 can be provided in any n-th column. Alternatively, the photoelectric conversion element 28 can be provided in each odd-numbered column or each even-numbered column. Alternatively, the photoelectric conversion element 28 can be provided in all the columns in multiples of 3. Alternatively, the photoelectric conversion element 28 can be provided in all the columns in multiples of 4. Alternatively, the photoelectric conversion element 28 can be provided in all the columns in multiples of a (a is any natural number of q or less). Alternatively, the photoelectric conversion element 28 can be provided in each column in the sum of b and a multiple of a (b is any natural number of a or less).

Figure 12B:
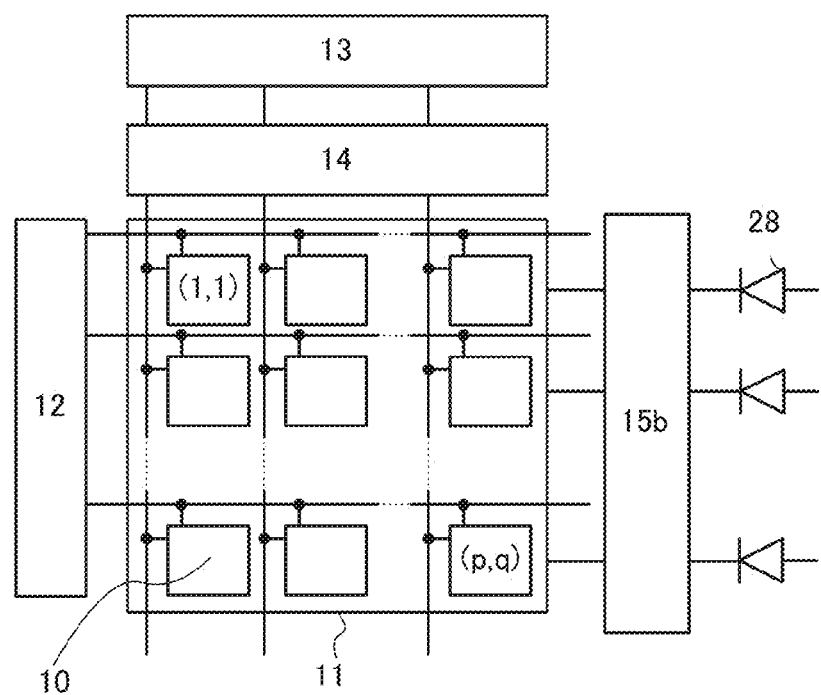

Note that in the configuration in FIG. 12B, the photoelectric conversion element 28 can be provided in every plurality of rows. For example, the photoelectric conversion element 28 can be provided in any m-th row. Alternatively, the photoelectric conversion element 28 can be provided in each odd-numbered row or each even-numbered row. Alternatively, the photoelectric conversion element 28 can be provided in all the rows in multiples of 3. Alternatively, the photoelectric conversion element 28 can be provided in all the rows in multiples of 4. Alternatively, the photoelectric conversion element 28 can be provided in all the rows in multiples of c (c is any natural number of p or less). Alternatively, the photoelectric conversion element 28 can be provided in each row in the sum of d and a multiple of c (d is any natural number of c or less).

Moreover, the configuration in FIG. 12A and the configuration in FIG. 12B can be combined with each other. For example, the photoelectric conversion element 28 can be provided in each column and each row. Alternatively, the photoelectric conversion element 28 can be provided in each odd-numbered column and each odd-numbered row. Alternatively, the photoelectric conversion element 28 can be provided in each odd-numbered column and each even-numbered row. Alternatively, the photoelectric conversion element 28 can be provided in all the columns in multiples of a and each row in the sum of d and a multiple of c.

Figure 13A:
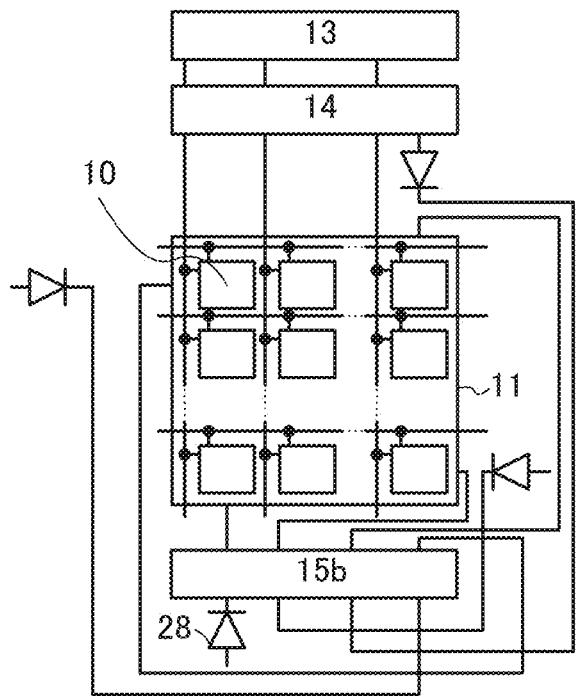
FIGS. 13A and 13B are each a block diagram illustrating an imaging device.
Figure 13B:
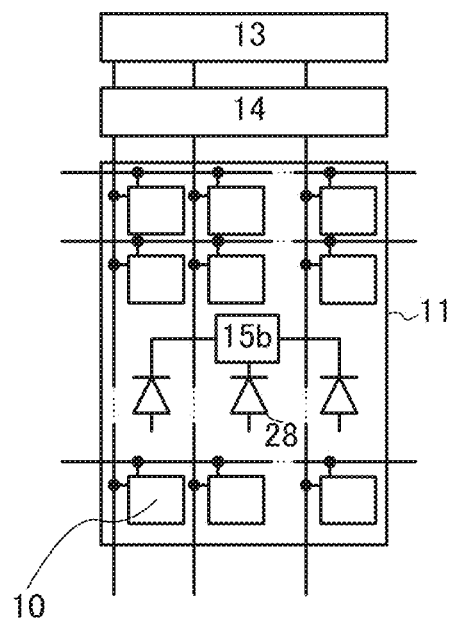

In FIG. 13A, the photoelectric conversion elements 28 are provided at the four corners of the pixel array 11. In FIG. 13B, the plurality of photoelectric conversion elements 28 and the circuit 15b are provided in the pixel array 11, for example, in the middle row of the pixel array 11.

Although the photoelectric conversion elements 28 are provided at all of the four corners of the pixel array 11 in FIG. 13A, the photoelectric conversion elements 28 are not necessarily provided at all of the four corners. For example, the photoelectric conversion elements 28 may be provided only at two positions of the upper right and lower left portions. Alternatively, the photoelectric conversion elements 28 may be provided only at two positions of the upper left and lower right portions. Moreover, the photoelectric conversion element 28 can be provided at any position other than the four corners of the pixel array 11.

The imaging device of one embodiment of the present invention having any of the configurations illustrated in FIGS. 12A and 12B and FIGS. 13A and 13B can lower the probability of operating the pixel 10 in an operation mode in the case where the illuminance of irradiation light is low, such as a wide dynamic range mode, even though the illuminance of irradiation light is high. As a result, for example, the limit of the amount of accumulated charge in imaging can be prevented from narrowing the dynamic range.

In the case where in the imaging device of one embodiment of the present invention having the configuration in FIG. 1, the circuit 15 is provided only in the first column of the pixel array 11, the light with which the first column is irradiated is low, and the light with which any column of the remaining columns is irradiated is high, all of the pixels 10 are operated in the operation mode in the case where the illuminance of irradiation light is low, e.g., in the wide dynamic range mode. In contrast, in the imaging device in FIG. 12A, as long as any column of the pixel array 11 is irradiated with high illuminance light, all of the pixels 10 can be operated in the operation mode in the case where the illuminance of irradiation light is high, e.g., in the normal imaging mode.

Figure 14:
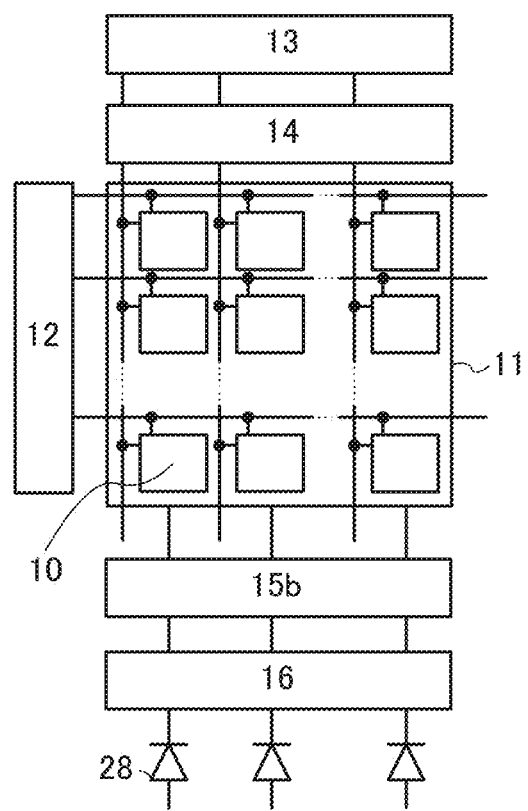
FIG. 14 is a block diagram illustrating an imaging device.

FIG. 14 shows a modification example of the imaging device of one embodiment of the present invention in FIG. 12A, and the imaging device is different from that in FIG. 12A in that a circuit 16 is provided between the photoelectric conversion element 28 and the circuit 15b. The circuit 16 functions as an arithmetic circuit for, for example, calculating the minimum value, the maximum value, and the average value of current flowing through the photoelectric conversion elements 28.

With the configuration in FIG. 14, the operation mode of the pixel 10 can be controlled more appropriately. For example, when the average value of current flowing through the photoelectric conversion elements 28 is calculated by the circuit 16, a small number of photoelectric conversion elements 28 are irradiated with high illuminance light, and the remaining large number of photoelectric conversion elements 28 are irradiated with low illuminance light, the pixels 10 can be operated in the operation mode in the case where the illuminance of irradiation light is low, e.g., in the wide dynamic range mode.

Note that the configurations shown in FIG. 1, FIG. 2, FIG. 5, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, and FIG. 14 can be optionally combined with each other.

This embodiment can be implemented in appropriate combination with any of the structures described in the other embodiments.

Embodiment 2

In this embodiment, modification examples of the pixel 10 of the imaging device of one embodiment of the present invention are described with reference to drawings.

Figure 15A:
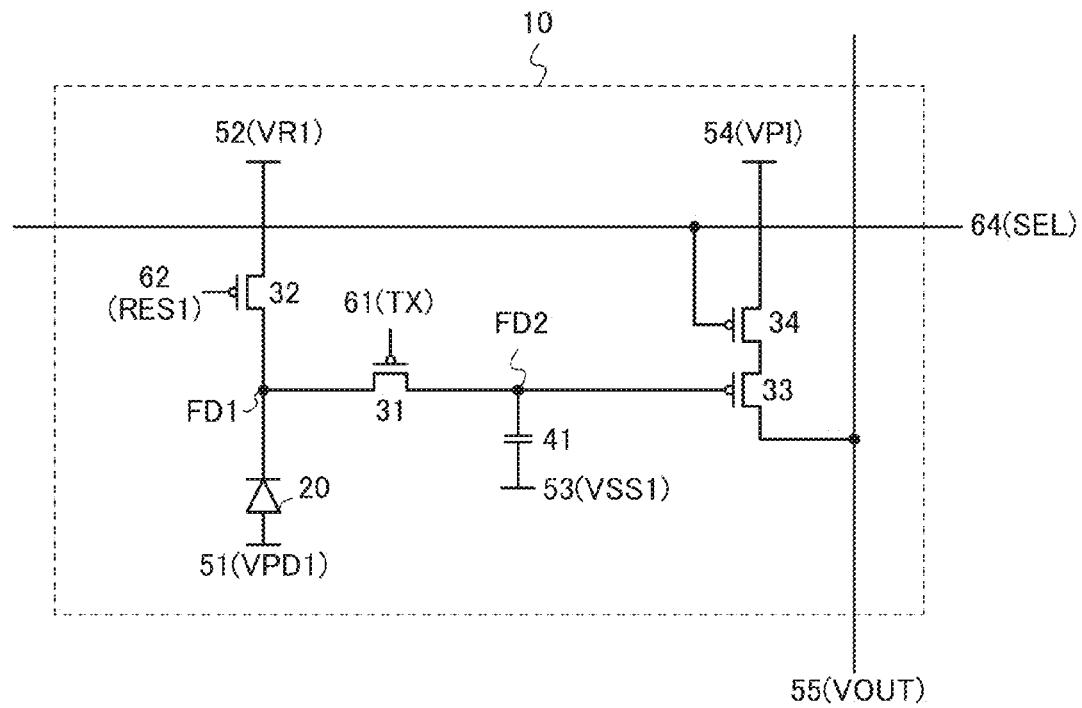
FIGS. 15A and 15B each illustrate a pixel circuit of an imaging device.

The pixel 10 included in the imaging device of one embodiment of the present invention can have a configuration illustrated in FIG. 15A as well as the configuration illustrated in FIG. 2. FIG. 15A is different from FIG. 2 in that the transistors 31 to 34 are all p-ch transistors. When the magnitude relationships of the potentials are reversed as appropriate, for example, FIG. 3 and FIG. 4A can be referred to for the operations in the normal imaging mode and in the wide dynamic range mode, respectively. Note that some of the transistors 31 to 34 may be p-ch transistors. Alternatively, CMOS transistors may be employed.

Figure 15B:
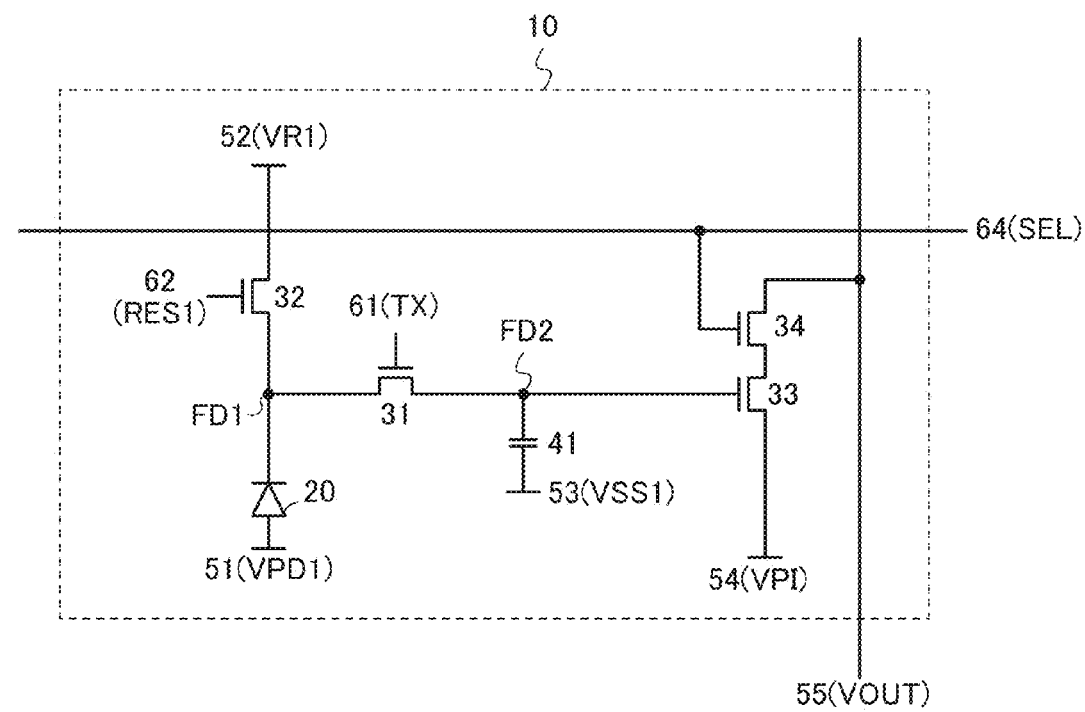

Although the transistor 34 lies between the transistor 33 and the wiring 54 (VPI) in FIG. 2, the transistor 33 may lie between the transistor 34 and the wiring 54 (VPI) as shown in FIG. 15B.

Figure 16A:
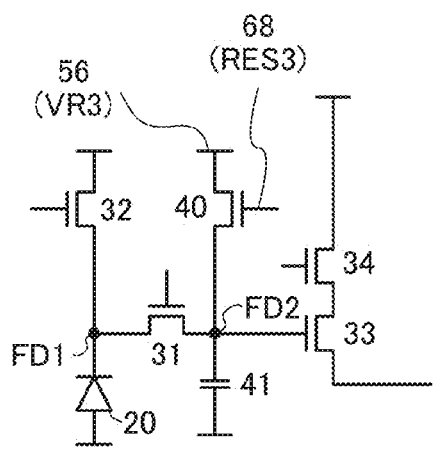
FIGS. 16A to 16C each illustrate a pixel circuit of an imaging device.
Figure 16B:
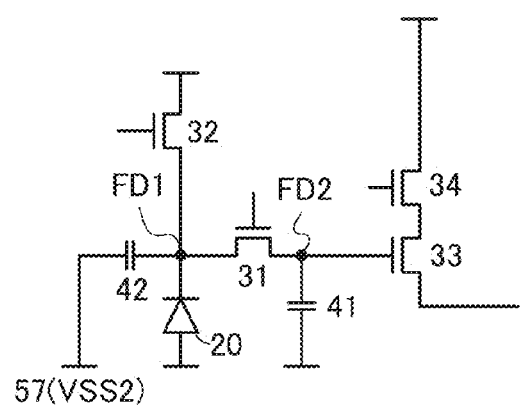
Figure 16C:
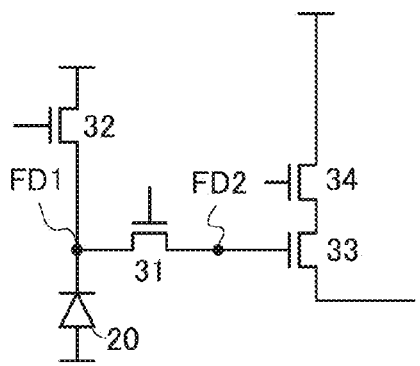

The pixels 10 included in the imaging device of one embodiment of the present invention may have any of configurations in FIGS. 16A to 16C.

FIG. 16A shows a configuration in which a transistor 40 is added to the pixel 10 in FIG. 2. One of a source and a drain of the transistor 40 is electrically connected to the node FD2. The other of the source and the drain of the transistor 40 is electrically connected to a wiring 56 (VR3). A gate of the transistor 40 is electrically connected to a wiring 68 (RES3).

Here, the wiring 56 (VR3) can function as a power supply line. In addition, the wiring 68 (RES3) can serve as a signal line.

The potential of the wiring 56 (VR3) can be set at an H level, for example, but operation can also be performed by applying a different potential.

When the pixel 10 has the configuration in FIG. 16A, in the normal imaging mode, the potential of the gate of the transistor 40 is set at an H level to reset the node FD2.

FIG. 16B shows a configuration in which a capacitor 42 is added to the pixel 10 in FIG. 2. One terminal of the capacitor 42 is electrically connected to the node FD1. The other terminal of the capacitor 42 is electrically connected to a wiring 57 (VSS2).

Here, the wiring 57 (VSS2) can serve as a power supply line. The potential of the wiring 57 (VSS2) can be set at an L level, for example, but operation can also be performed by applying a different potential.

When the pixel 10 has the configuration in FIG. 16B, charge can be held in the node FD1. As a result, the retention time of imaging data can be increased.

FIG. 16C shows a configuration in which the capacitor 41 is removed from the pixel 10 in FIG. 2. In this case, charge is accumulated in the node FD2 with the use of gate capacitance of the transistor 33, parasitic capacitance of the wiring electrically connected to the node FD2, and the like.

With the configuration in FIG. 16C, in the imaging device of one embodiment of the present invention, an area occupied by one pixel can be reduced. Thus, definition of a display device can be increased.

Note that some wirings are not illustrated in FIGS. 16A to 16C.

Figure 17:
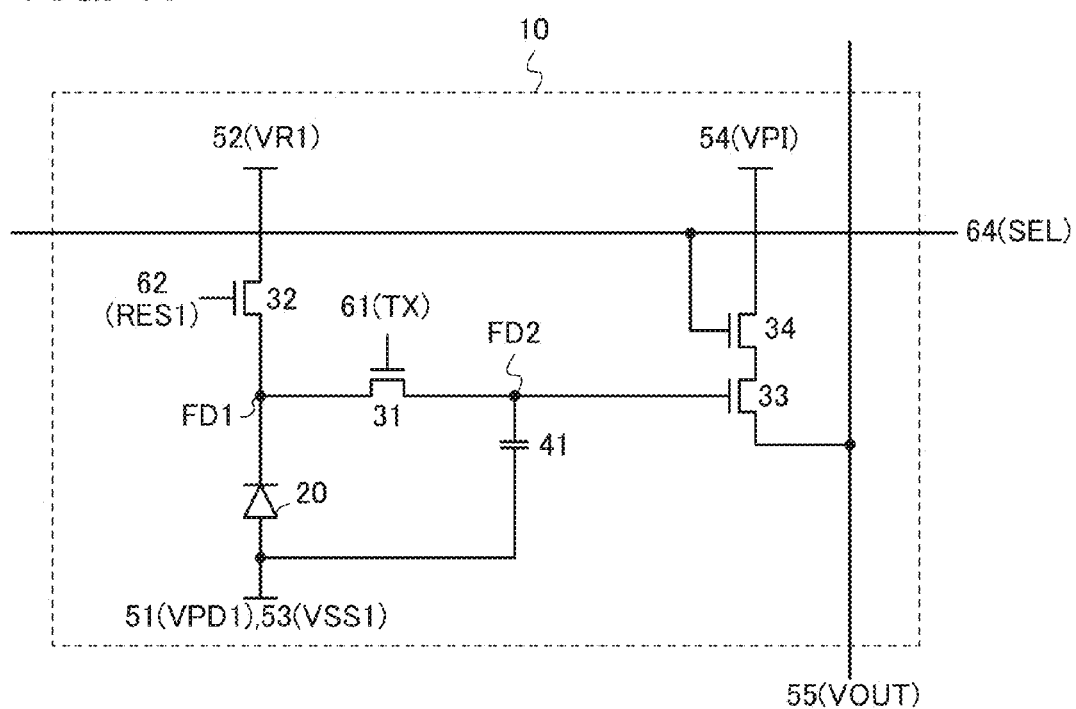
FIG. 17 illustrates a pixel circuit of an imaging device.

Although FIG. 2 illustrates wirings supplying the same potential as different wirings, one wiring may serve as those wirings. For example, as in the pixel 10 in FIG. 17, the wiring 51 (VPD1) and the wiring 53 (VSS1) to which an L level potential is applied may be one wiring.

The transistors 31 to 34 included in the pixel 10 having the structure shown in FIG. 2 may be transistors whose active layers or active regions contain oxide semiconductors (hereinafter referred to as OS transistors).

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, the off-state current of a transistor is lower than or equal to I means that there is $V_{gs}$ with which the off-state current of a transistor becomes lower than or equal to I in some cases. Furthermore, the off-state current of a transistor may refer to the off-state current in an off state at predetermined $V_{gs}$, the off-state current in an off state at $V_{gs}$ in a predetermined range, the off-state current in an off state at $V_{gs}$ with which sufficiently reduced off-state current is obtained, or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability of a semiconductor device including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state where the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is I or lower at a certain $V_{gs}$.

In this specification, the term leakage current sometimes expresses the same meaning as off-state current.

In this specification, the off-state current sometimes refers to a current that flows between a source and a drain when a transistor is off, for example.

The use of the OS transistor in the pixel 10 can broaden the dynamic range of imaging. In the circuit configuration in FIG. 2, the potential of the node FD1 is decreased when the illuminance of light with which the photoelectric conversion element 20 is irradiated is high, and thus the potential of the node FD2 is also decreased.

Since the OS transistor has extremely low off-state current, a current based on a gate potential can be accurately outputted even when the potential of the node FD2 (gate potential of the transistor 33) is extremely low. Accordingly, it is possible to broaden the dynamic range.

A period during which charge can be held in the node FD1 and the node FD2 can be extremely long owing to the low off-state current of the transistor. Therefore, a global shutter system in which imaging data is captured in all the pixels at the same time can be used without complicated circuit configurations and operating methods.

Figure 18A:
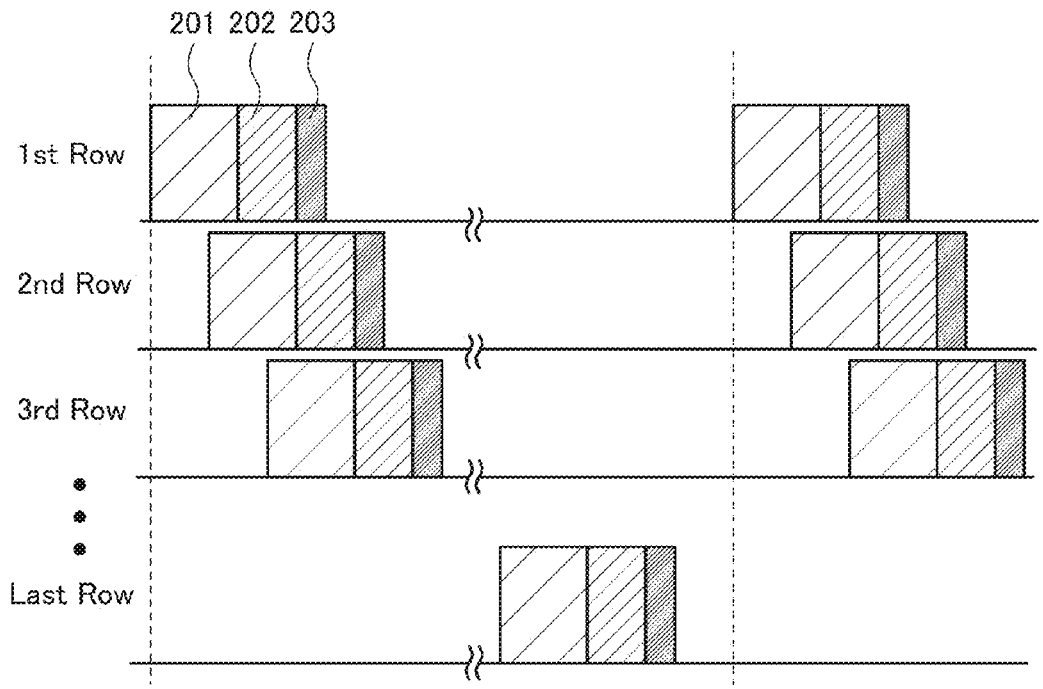
FIGS. 18A and 18B illustrate operations of a rolling shutter system and a global shutter system.
Figure 18B:
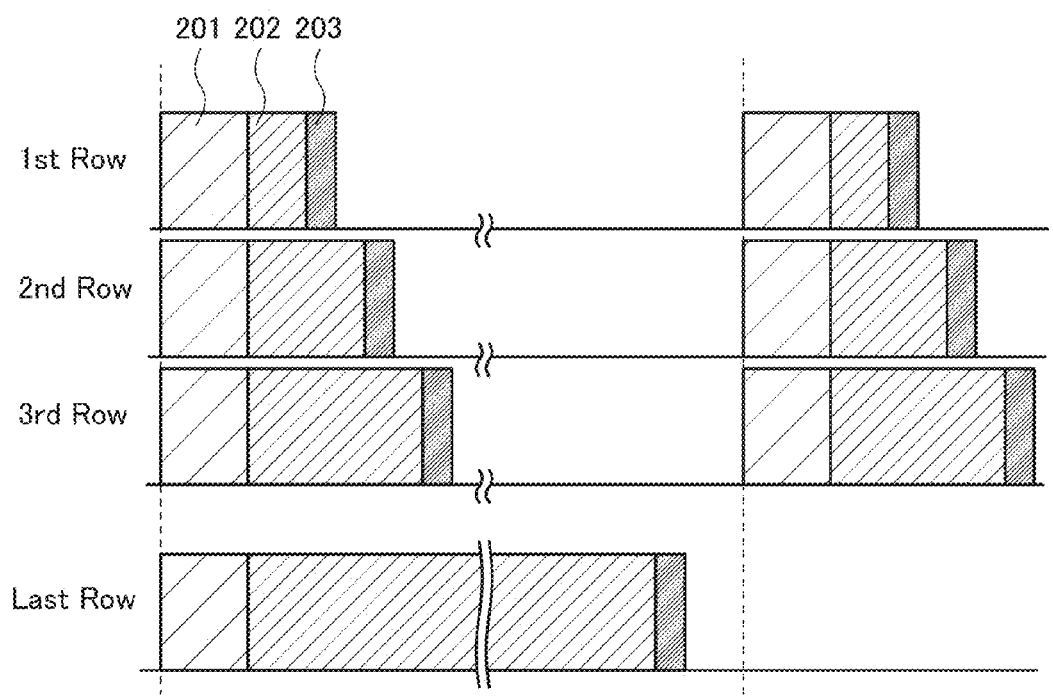

In a general imaging device where pixels are arranged in a matrix, a rolling shutter system is employed in which an imaging operation 201, a data retention operation 202, and a read operation 203 are performed row by row as illustrated in FIG. 18A. In the case of employing the rolling shutter system, simultaneousness of imaging is lost. Therefore, when an object moves, an image is distorted. For this reason, it is preferable to employ a global shutter system in which the imaging operation 201 can be performed simultaneously in all the rows and the read operation 203 can be sequentially performed row by row as illustrated in FIG. 18B. By employing the global shutter system, simultaneousness of imaging in all the pixels in the imaging device can be ensured, and an image with little distortion can be easily obtained even when an object moves.

An OS transistor is a high withstand voltage transistor which can withstand high voltage. When the pixel 10 is operated in the avalanche region, a relatively high voltage (e.g., higher than or equal to 10 V and lower than or equal to 50 V) is applied to the photoelectric conversion element 20; thus, OS transistors are preferably used as the transistors connected to the photoelectric conversion element 20. Specifically, OS transistors are preferably used as the transistors 31 and 32. An imaging device with high reliability can be provided.

In addition, the OS transistor has lower temperature dependence of change in electrical characteristics than a transistor whose active layer or active region contains silicon (hereinafter, such a transistor is referred to as a Si transistor), and thus can be used in an extremely wide range of temperatures. Therefore, an imaging device and a semiconductor device that include OS transistors are suitable for use in automobiles, aircrafts, and spacecrafts.

A transistor connected to either the node FD1 or the node FD2 needs to be a transistor with low noise. The channel of a transistor including two or three oxide semiconductor layers to be described later is a buried channel, which has significantly high resistance to noise. Thus, the use of the transistor leads to an image with low noise.

Because OS transistors are used as the transistors 31 to 34, the pixel can be composed of OS transistors and a photoelectric conversion element formed using silicon. Such a configuration facilitates an increase in the effective area of the photoelectric conversion element because a Si transistor need not be formed in the pixel. Thus, the photosensitivity can be improved.

Not only the pixel 10 but also peripheral circuits such as the circuits 12 to 15 may include OS transistors. A configuration in which the peripheral circuits are composed only of OS transistors requires no process of forming a Si transistor, and thus is effective in reducing cost of the imaging device. A configuration in which the peripheral circuits are composed only of OS transistors and p-ch Si transistors requires no process of forming an n-ch Si transistor, and thus is effective in reducing cost of the imaging device. Moreover, the peripheral circuits can be CMOS circuits, resulting in lower power consumption of the peripheral circuits, that is, lower power consumption of the imaging device.

In another example, OS transistors are used as the transistors 31 and 32, and Si transistors are used as the transistors 33 and 34.

The Si transistor has a characteristic of excellent field-effect mobility as compared to the OS transistor. Thus, the amount of current flowing in a transistor functioning as an amplifier transistor or a selection transistor can be increased. For example, in FIG. 2, the amount of current flowing in the transistors 33 and 34 can be increased depending on charge accumulated in the node FD2.

Figure 19A:
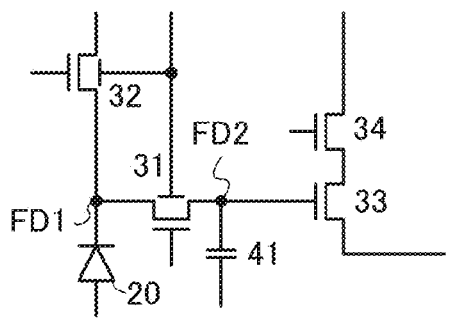
FIGS. 19A to 19F each illustrate a pixel circuit of an imaging device.
Figure 19B:
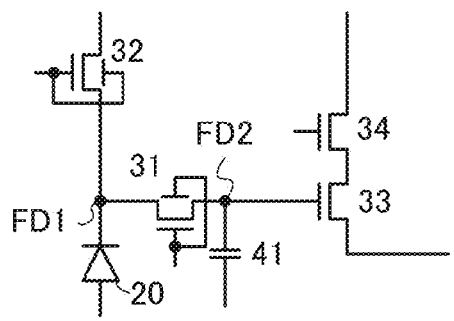
Figure 19C:
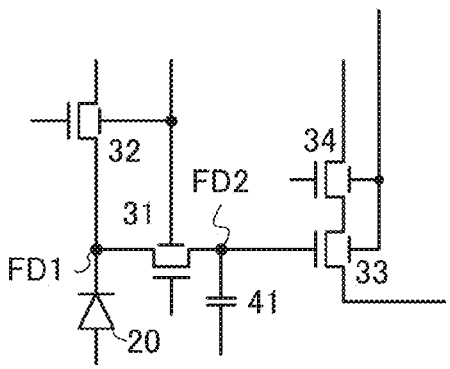
Figure 19D:
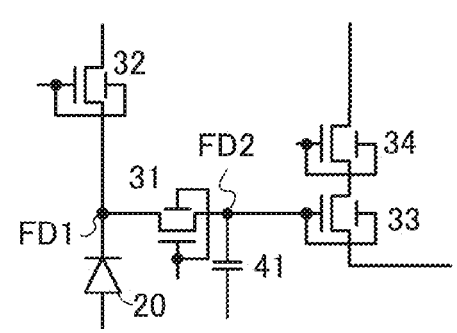

The transistors 31 and 32 in the pixels 10 may each include a back gate as illustrated in FIGS. 19A and 19B. FIG. 19A illustrates a configuration in which a constant potential is applied to the back gates, which enables control of the threshold voltages. FIG. 19B illustrates a configuration in which the same potential is applied to the back gates and front gates, which enables an increase in on-state current. The transistors 31 to 34 may each have a back gate as illustrated in FIGS. 19C and 19D.

Figure 19E:
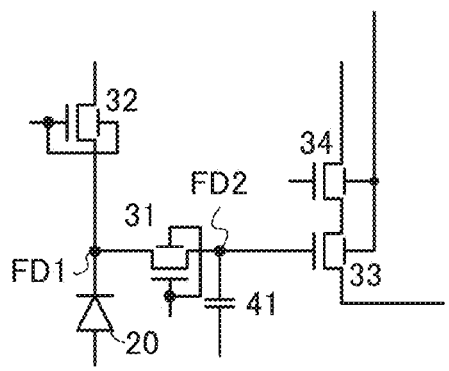
Figure 19F:
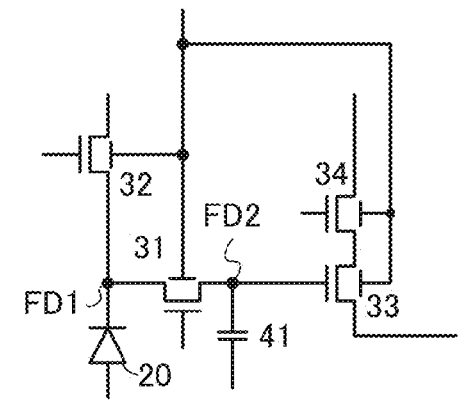

Moreover, as illustrated in FIG. 19E, a configuration in which the same potential is applied to a front gate and a back gate and a configuration in which a constant potential is applied to a back gate may be optionally combined as necessary for the transistors in one pixel. Furthermore, a circuit configuration in which a back gate is not provided may be optionally combined with any of the above configurations. As the configuration in which a constant potential is applied to a back gate, for example, a configuration in which the same potential is applied to all the back gates can be employed as illustrated in FIG. 19F, for example.

Note that some wirings are not illustrated in FIGS. 19A to 19F.

Since an OS transistor has lower on-state current than a Si transistor, it is particularly preferable that the OS transistor have a back gate. For example, in the case where the transistors 31 to 34 are OS transistors, the transistors 31 to 34 preferably have back gates. In the case where the transistors 31 and 32 are OS transistors, for example, the transistors 31 and 32 preferably have back gates.

Note that any of the configurations in FIG. 2, FIGS. 15A and 15B, FIGS. 16A to 16C, FIG. 17, and FIGS. 19A to 19F can be optionally combined with one another.

This embodiment can be implemented in appropriate combination with any of the structures described in the other embodiments.

Embodiment 3

In this embodiment, specific structure examples of the imaging device of one embodiment of the present invention will be described below with reference to drawings.

Figure 20A:
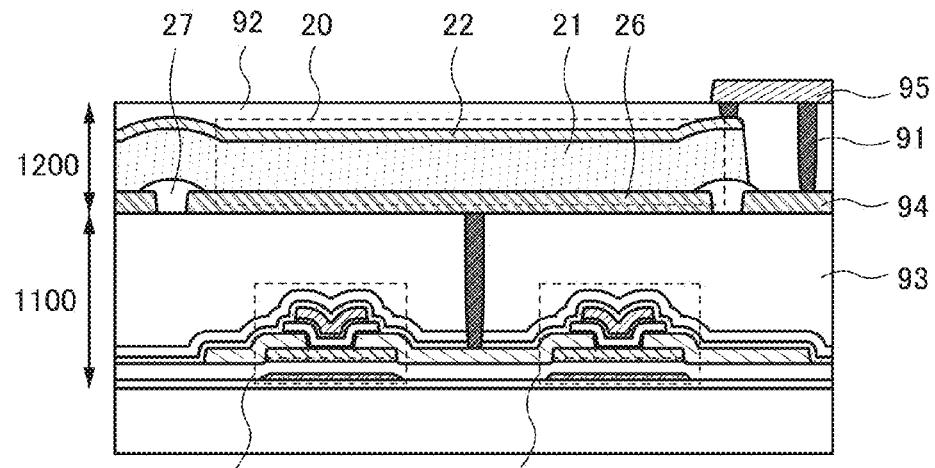
FIGS. 20A to 20C are cross-sectional views each illustrating a structure of an imaging device.

FIG. 20A illustrates an example of a cross-sectional view of the imaging device of one embodiment of the present invention and illustrates a specific connection between the photoelectric conversion element 20, the transistor 31, and the transistor 32 which are included in each of the pixels 10 in FIG. 1. Note that the transistors 33 and 34 are not illustrated in FIG. 20A. The imaging device includes a tier 1100 including the transistors 31 to 34 and a tier 1200 including the photoelectric conversion element 20.

Although the wirings, electrodes, and conductors 91 are illustrated as independent components in cross-sectional views in this embodiment, some of them are provided as one component in some cases when they are electrically connected to each other. In addition, a structure in which a gate, a source, or a drain of the transistor is connected to the wirings through a conductor 91 is only an example. The gate, the source, and the drain of the transistor might each function as a wiring.

Over the components, an insulating layer 92, an insulating layer 93, and the like that can function as protective films, interlayer insulating layers, or planarization films are provided. For example, an inorganic insulating film such as a silicon oxide film or a silicon oxynitride film can be used as each of the insulating layers 92 and 93 and the like. Alternatively, an organic insulating film such as an acrylic resin film or a polyimide resin film may be used. Top surfaces of the insulating layers 92 and 93 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In some cases, a layer that is not illustrated in the drawing is included in the stacked-layer structure. One or more of the layers illustrated in the drawing are not included in some cases.

Figure 20B:
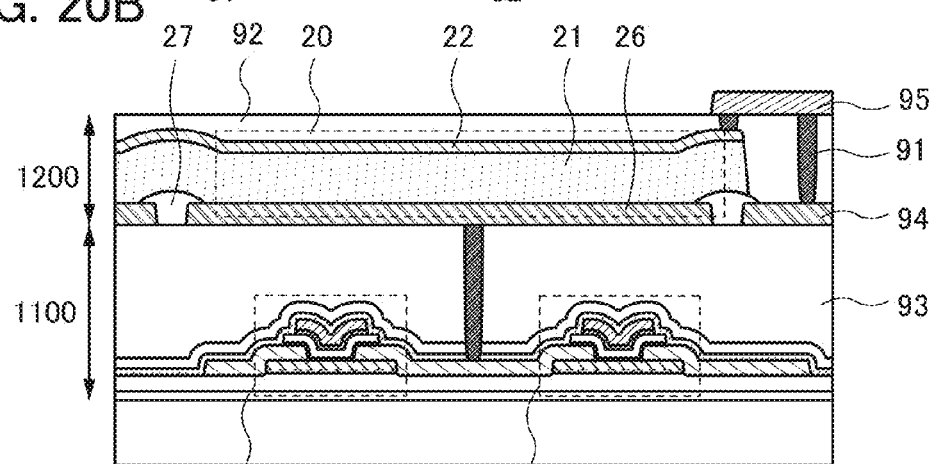
Figure 20C:
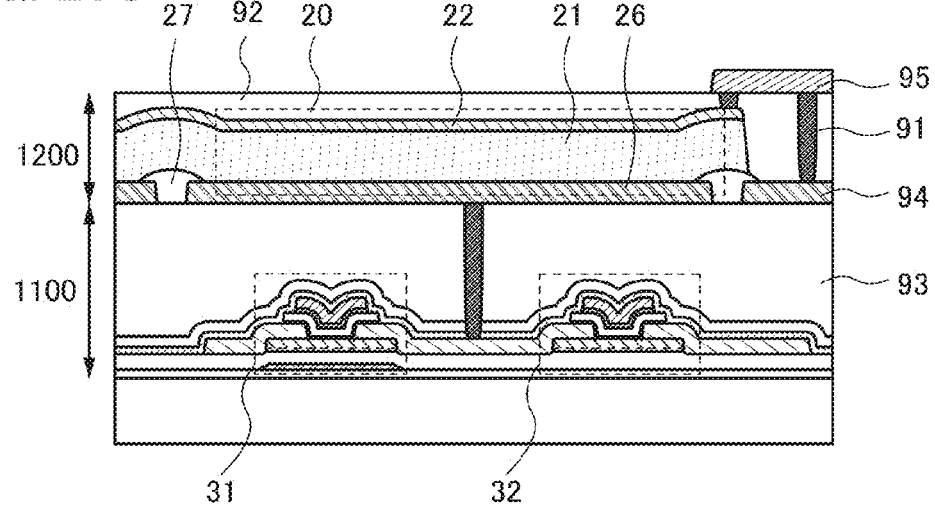

Note that although each transistor includes a back gate in FIG. 20A, each transistor does not necessarily include a back gate as illustrated in FIG. 20B. Alternatively, one or more transistors, for example, only the transistor 31, as illustrated in FIG. 20C, may include a back gate. The back gate might be electrically connected to a front gate of the transistor, which faces the back gate. Note that different fixed potentials might be supplied to the back gate and the front gate. The presence or absence of the back gate can also be applied to another imaging device described in this embodiment.

For the photoelectric conversion element 20, the selenium-based material can be used, as described above. Alternatively, CIS or CIGS can be used. The selenium-based material has a high light-absorption coefficient, making a photoelectric conversion layer 21 thin easily.

In the photoelectric conversion element 20 containing the selenium-based material, for example, the photoelectric conversion layer 21 can be provided between a light-transmitting conductive layer 22 and an electrode 26 formed using a metal material or the like. Since CIS and CIGS are p-type semiconductors, an n-type semiconductor such as cadmium sulfide or zinc sulfide may be provided in contact with the p-type semiconductor in order to form a junction.

Figure 21A:
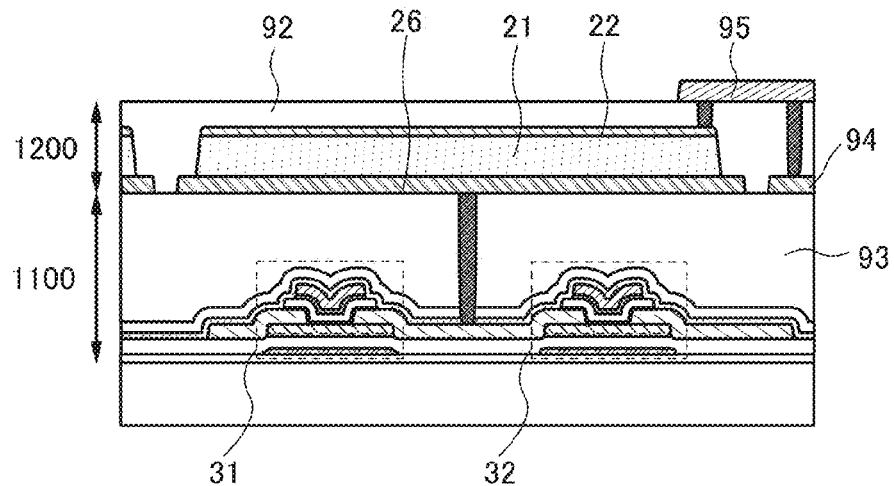
FIGS. 21A to 21C are cross-sectional views each illustrating a structure of an imaging device.
Figure 21B:
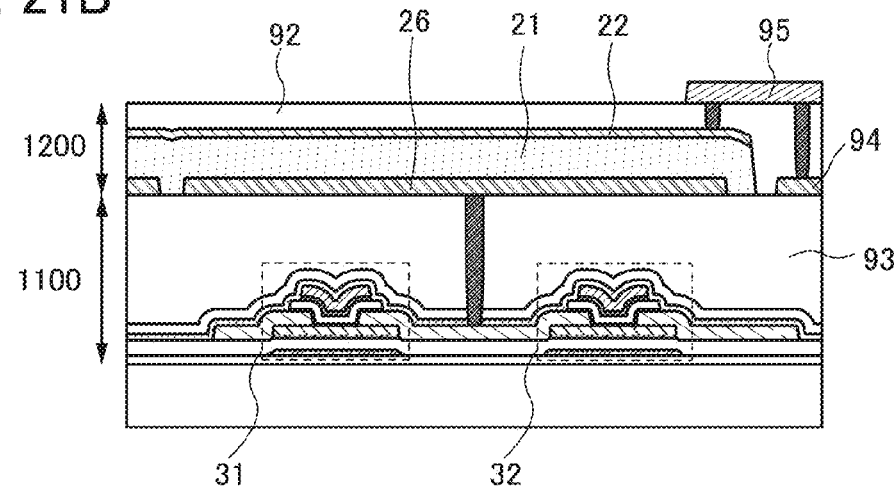
Figure 21C:
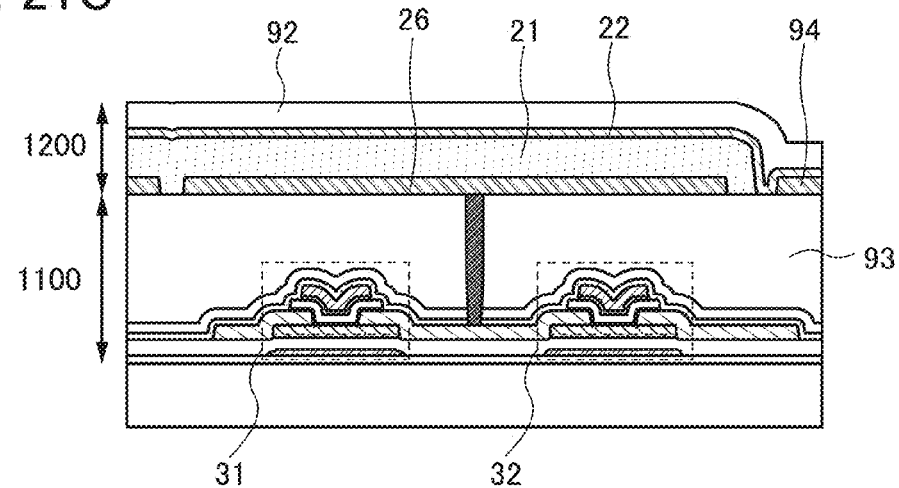
Figure 22A:
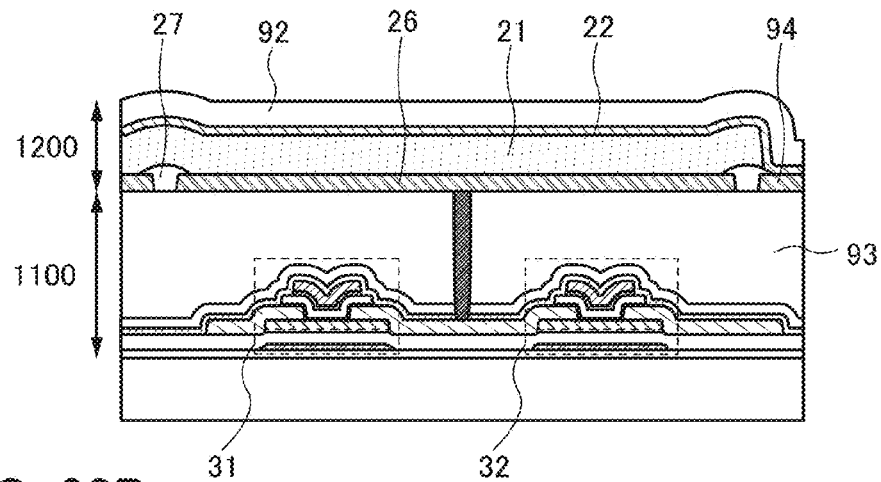
FIGS. 22A to 22C are cross-sectional views each illustrating a structure of an imaging device.

Although the photoelectric conversion layer 21 and the light-transmitting conductive layer 22 are not divided between pixels in FIG. 20A, they may be divided between circuits as illustrated in FIG. 21A. In a region between pixels where the electrode 26 is not provided, a partition wall 27 formed of an insulator is preferably provided, thereby preventing generation of a crack in the photoelectric conversion layer 21 and the light-transmitting conductive layer 22. However, the partition wall 27 is not necessarily provided as illustrated in FIG. 21B. Although the light-transmitting conductive layer 22 and a wiring 94 are connected to each other through a wiring 95 and a conductor 91 in FIG. 20A, the light-transmitting conductive layer 22 and the wiring 94 may be in direct contact with each other as in FIG. 21C and FIG. 22A.

Figure 22B:
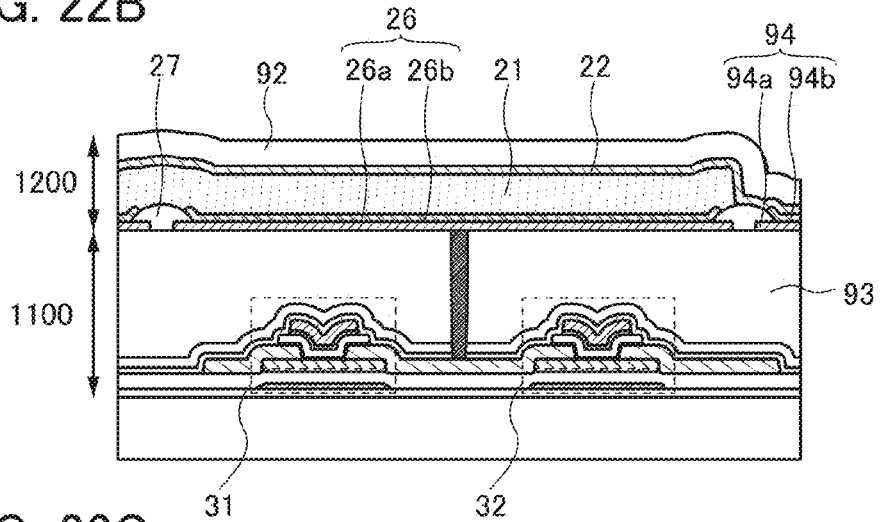

The electrode 26, the wiring 94, and the like may each be a multilayer. For example, as illustrated in FIG. 22B, the electrode 26 can include two conductive layers 26a and 26b and the wiring 94 can include two conductive layers 94a and 94b. In the structure in FIG. 22B, for example, the conductive layers 26a and 94a may be made of a low-resistance metal or the like, and the conductive layer 26b may be made of a metal or the like that exhibits an excellent contact property with the photoelectric conversion layer 21. Such a structure can improve the electrical characteristics of the photoelectric conversion element. Furthermore, even when the conductive layer 94a contains a metal that causes electrolytic corrosion by being in contact with the light-transmitting conductive layer 22, the electrolytic corrosion can be prevented because the conductive layer 94b is between the conductive layer 94a and the light-transmitting conductive layer 22.

The conductive layers 26a and 94a can be formed using, for example, aluminum, titanium, or a stack of titanium, aluminum, and titanium that are layered in this order. The conductive layers 26b and 94b can be formed using, for example, molybdenum, tungsten, or the like.

Figure 22C:
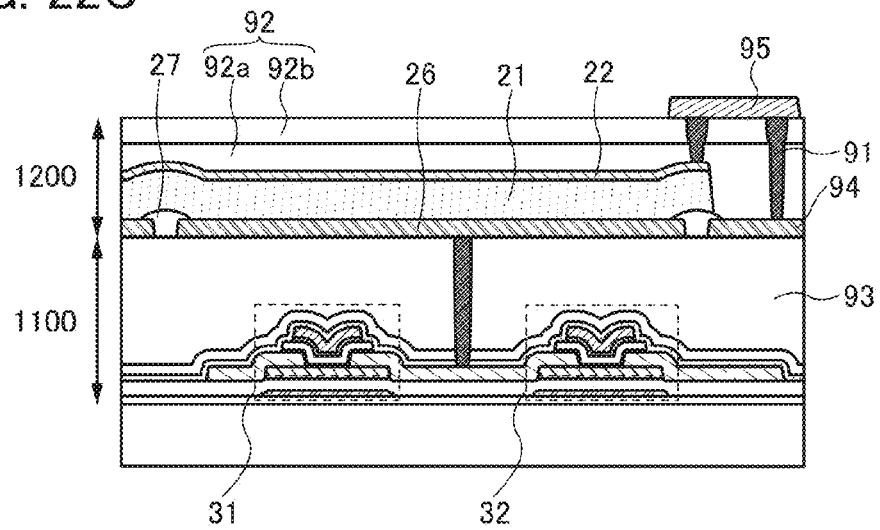

The insulating layer 92 and the like may each be a multilayer. In the case where the insulating layer 92 includes insulating layers 92a and 92b that have different etching rates as illustrated in FIG. 22C, for example, the conductor 91 has a difference in level. In the case where another insulating layer used as an interlayer insulating layer or a planarization film is a multilayer, the conductor 91 also has a difference in level. Although the insulating layer 92 is formed using two layers here, the insulating layer 92 and another insulating layer may each be formed using three or more layers.

Note that the partition wall 27 can be formed using an inorganic insulator, an insulating organic resin, or the like. The partition wall 27 may be colored black or the like in order to shield the transistors and the like from light and/or to determine the area of a light-receiving portion in each pixel.

As the photoelectric conversion element 20, a PIN diode element formed using an amorphous silicon film, a microcrystalline silicon film, or the like may be used, as described above.

Figure 23:
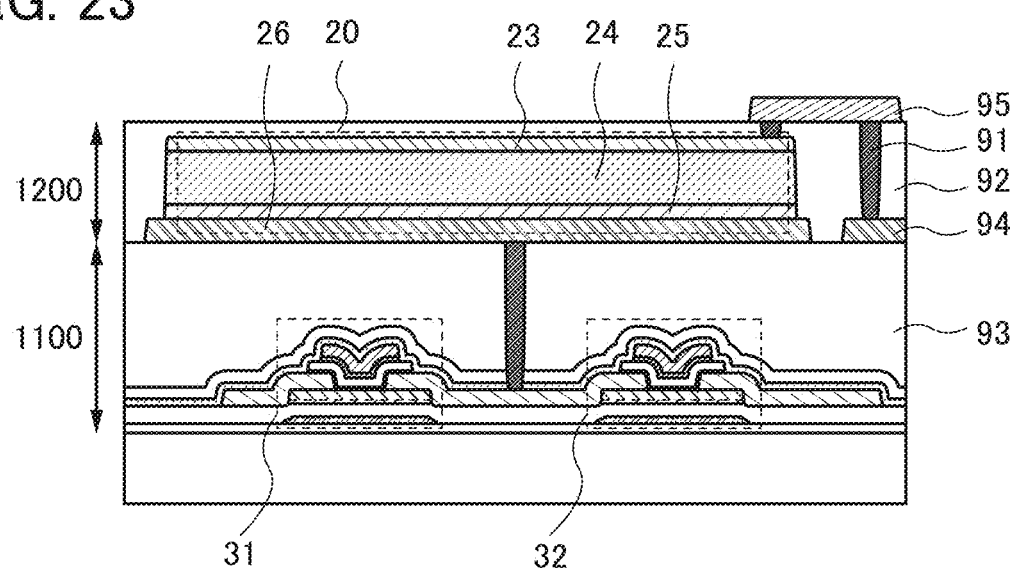
FIG. 23 is a cross-sectional view illustrating a structure of an imaging device.

FIG. 23 illustrates an example in which a thin film PIN photodiode is used as the photoelectric conversion element 20. In the photodiode, a p-type semiconductor layer 25, an i-type semiconductor layer 24, and an n-type semiconductor layer 23 are stacked in this order. The i-type semiconductor layer 24 is preferably formed using amorphous silicon. The n-type semiconductor layer 23 and the p-type semiconductor layer 25 can each be formed using amorphous silicon, microcrystalline silicon, or the like that includes a dopant imparting the corresponding conductivity type. A photodiode in which a photoelectric conversion layer is formed using amorphous silicon has high photosensitivity in a visible light wavelength region, and thus can easily sense weak visible light.

In the photoelectric conversion element 20 illustrated in FIG. 23, the p-type semiconductor layer 25 is electrically connected to the electrode 26. Furthermore, the n-type semiconductor layer 23 is electrically connected to the wiring 94 through the conductor 91.

FIGS. 24A to 24F show other examples of the structure of the photoelectric conversion element 20 having a configuration of a PIN thin film photodiode and the connection between the photoelectric conversion element 20 and the wirings. Note that the structure of the photoelectric conversion element 20 and the connection between the photoelectric conversion element 20 and the wirings are not limited thereto, and other configurations may be applied.

Figure 24A:
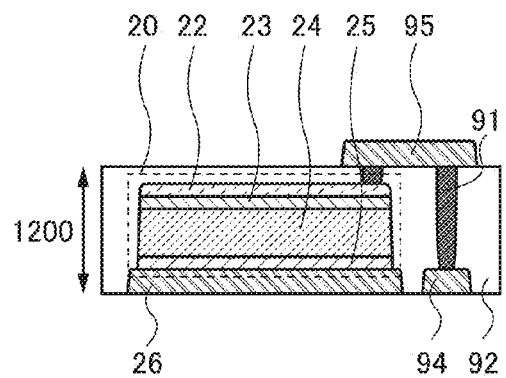
FIGS. 24A to 24F are cross-sectional views each illustrating a structure of an imaging device.

FIG. 24A illustrates a structure of the photoelectric conversion element 20 that includes the light-transmitting conductive layer 22 in contact with the n-type semiconductor layer 23. The light-transmitting conductive layer 22 serves as an electrode and can increase the output current of the photoelectric conversion element 20.

For the light-transmitting conductive layer 22, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 22 is not limited to a single layer, and may be a stacked layer of different films.

Figure 24B:
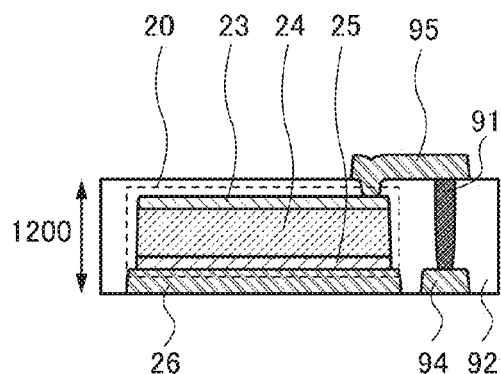

FIG. 24B illustrates a structure in which the n-type semiconductor layer 23 of the photoelectric conversion element 20 is directly connected to the wiring 95.

Figure 24C:
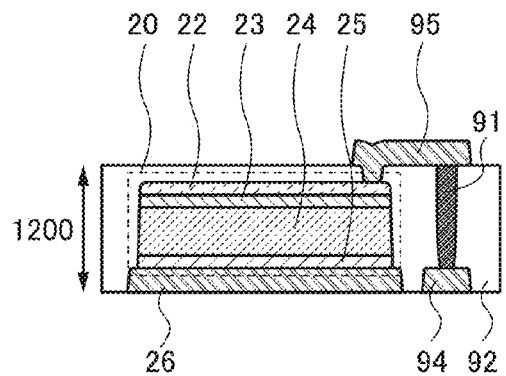

FIG. 24C illustrates a structure of the photoelectric conversion element 20 in which the light-transmitting conductive layer 22 is in contact with the n-type semiconductor layer 23 and the wiring 95 is electrically connected to the light-transmitting conductive layer 22.

Figure 24D:
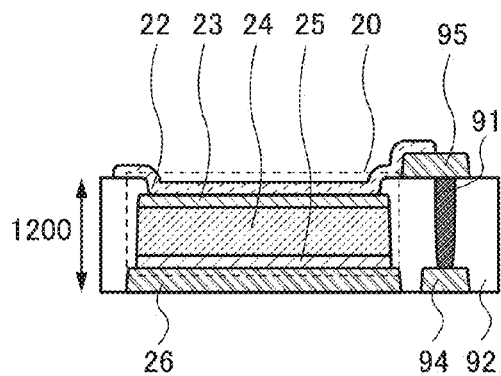

FIG. 24D illustrates a structure in which an opening exposing the n-type semiconductor layer 23 is provided in an insulating layer covering the photoelectric conversion element 20, and the light-transmitting conductive layer 22 that covers the opening is electrically connected to the wiring 95.

Figure 24E:
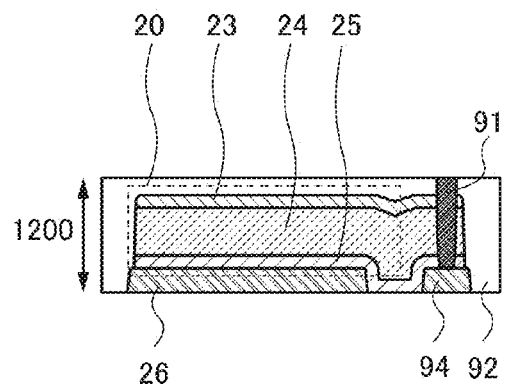

FIG. 24E illustrates a structure including the conductor 91 which penetrates the photoelectric conversion element 20. In the structure, the wiring 94 is electrically connected to the n-type semiconductor layer 23 through the conductor 91. Note that in the drawing, the wiring 94 appears to be electrically connected to the electrode 26 through the p-type semiconductor layer 25. However, because of a high electric resistance in the lateral direction of the p-type semiconductor layer 25, the resistance between the wiring 94 and the electrode 26 is extremely high when there is an appropriate distance therebetween. Thus, the photoelectric conversion element 20 has diode characteristics without a short circuit between the anode and the cathode. Note that two or more conductors 91 that are electrically connected to the n-type semiconductor layer 23 may be provided.

Figure 24F:
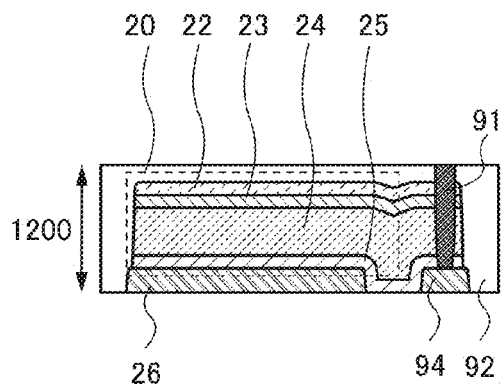

FIG. 24F illustrates a structure in which the photoelectric conversion element 20 in FIG. 24E is provided with the light-transmitting conductive layer 22 in contact with the n-type semiconductor layer 23.

Note that each of the photoelectric conversion elements 20 illustrated in FIGS. 24D to 24F has an advantage of having a large light-receiving area because wirings and the like do not overlap with a light-receiving region.

Figure 25:
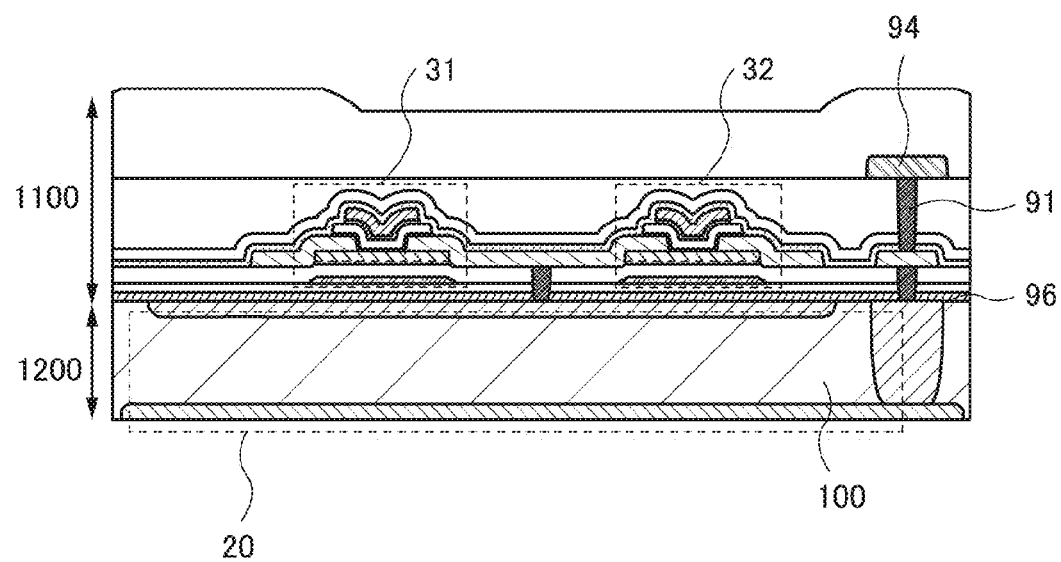
FIG. 25 is a cross-sectional view illustrating a structure of an imaging device.

Alternatively, as illustrated in FIG. 25, the photoelectric conversion element 20 may be a photodiode including a silicon substrate 100 as a photoelectric conversion layer.

The photoelectric conversion element 20 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 21 does not need to be divided between circuits as illustrated in FIG. 20A. Therefore, the imaging device of one embodiment of the present invention can be manufactured with a high yield at low cost. In contrast, a photodiode including the silicon substrate 100 as the photoelectric conversion layer requires difficult processes such as a polishing process and a bonding process.

Figure 26A:
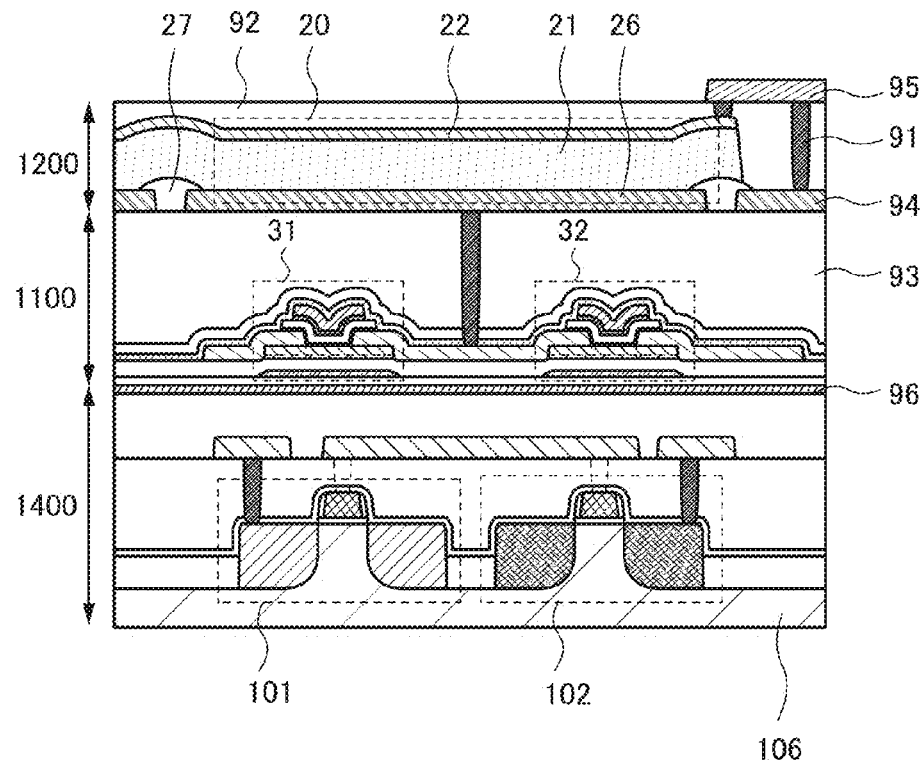
FIGS. 26A to 26C are cross-sectional views and a circuit diagram illustrating a structure of an imaging device.
Figure 26B:
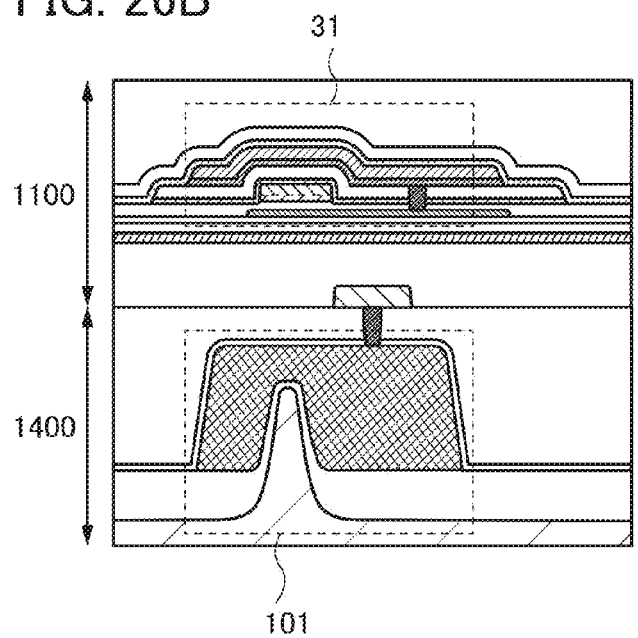

Furthermore, the imaging device of one embodiment of the present invention may have a multilayer structure including a silicon substrate 106 in which a circuit is formed. For example, as illustrated in FIG. 26A, the pixel circuit may overlap with a tier 1400 that includes a transistor 101 and a transistor 102 whose active regions are formed in the silicon substrate 106. FIG. 26B is a cross-sectional view illustrating the transistors in the channel width direction.

Figure 26C:
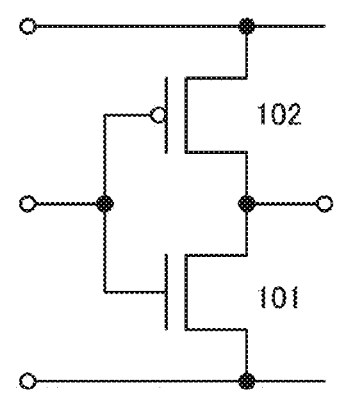

The circuit formed in the silicon substrate 106 can have a function of reading a signal outputted from the pixel circuit and converting the signal, for example. The circuit may include, for example, a CMOS inverter as illustrated in the circuit diagram in FIG. 26C. A gate of the transistor 101 (n-ch transistor) is electrically connected to a gate of the transistor 102 (p-ch transistor). One of a source and a drain of one of the transistors 101 and 102 is electrically connected to one of a source and a drain of the other transistor. The other of the source and the drain of the one transistor and the other of the source and the drain of the other transistor are electrically connected to different wirings.

Each of the silicon substrate 100 and the silicon substrate 106 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 25 and FIG. 26A, an insulating layer 96 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers provided in the vicinity of the oxide semiconductor layer that is the active layer of the transistor 31 or the like causes generation of carriers in the oxide semiconductor layer, and thus may reduce the reliability of the transistor 31 or the like. For this reason, the insulating layer 96 that has a function of preventing diffusion of hydrogen is preferably provided between one layer including the Si transistor and another layer stacked thereover that includes the OS transistor. Hydrogen is confined in the one layer owing to the insulating layer 96, so that the reliability of the transistors 101 and 102 can be improved. Furthermore, diffusion of hydrogen from the one layer to the other layer is inhibited, leading to an improvement in the reliability of the transistor 31 or the like.

The insulating layer 96 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 26A, a circuit (e.g., a driver circuit) formed in the silicon substrate 106, the transistor 31 or the like, and the photoelectric conversion element 20 or the like can overlap with each other; thus, the integration degree of pixels can be increased. In other words, the resolution of the imaging device can be increased. Such a structure is suitable for an imaging device with, for example, 4K2K, 8K4K, or 16K8K pixels. Note that since the 8K4K imaging device includes thirty-three million pixels, it can also be referred to as "33M." Furthermore, for example, a structure may be employed in which Si transistors are formed as the transistors 33 and 34 included in the pixel 10 and there is a region where the transistors 33 and 34 overlap with the transistors 31 and 32 and the photoelectric conversion element 20. In that case, the transistors 31 and 32 are OS transistors.

In the imaging device in FIG. 26A, the photoelectric conversion element 20 is not provided on the silicon substrate 106. Therefore, an optical path for the photoelectric conversion element 20 can be ensured without being influenced by the transistors or wirings, and a pixel with a high aperture ratio can be formed.

Figure 27A:
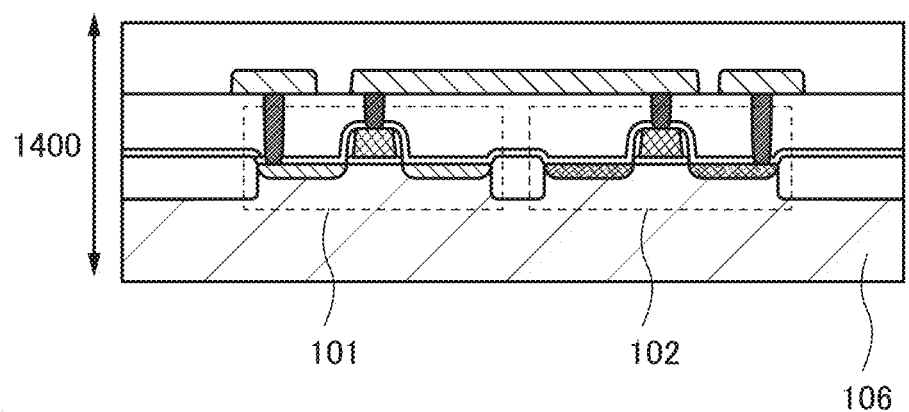
FIGS. 27A and 27B are cross-sectional views each illustrating a structure of an imaging device.
Figure 27B:
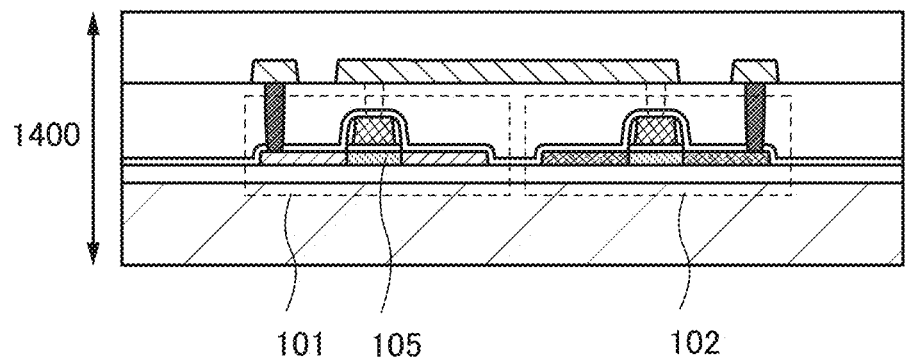

Although FIGS. 26A and 26B show fin type Si transistors, planar type transistors may be used as illustrated in FIG. 27A. Alternatively, as illustrated in FIG. 27B, transistors each including an active layer 105 formed using a silicon thin film may be used. The active layer 105 can be formed using polycrystalline silicon or single crystal silicon of a silicon-on-insulator (SOI) structure.

The imaging device of one embodiment of the present invention can also have a structure in FIG. 28.

An imaging device in FIG. 28 is a modification example of the imaging device in FIG. 26A. A CMOS inverter is formed using an OS transistor and a Si transistor.

Here, the transistor 102 provided in the tier 1400 is a p-ch Si transistor, and the transistor 101 provided in the tier 1100 is an n-ch OS transistor. When only the p-ch transistor is provided in the silicon substrate 106, a step of forming a well, an n-type impurity layer, or the like can be omitted.

Although selenium or the like is used for the photoelectric conversion element 20 in the imaging device in FIG. 28, a thin film PIN photodiode may be used as in FIG. 23.

In the imaging device in FIG. 28, the transistor 101 can be formed through the same process as the transistors 31 and 32 formed in the tier 1100. Thus, the manufacturing process of the imaging device can be simplified.

Figure 29:
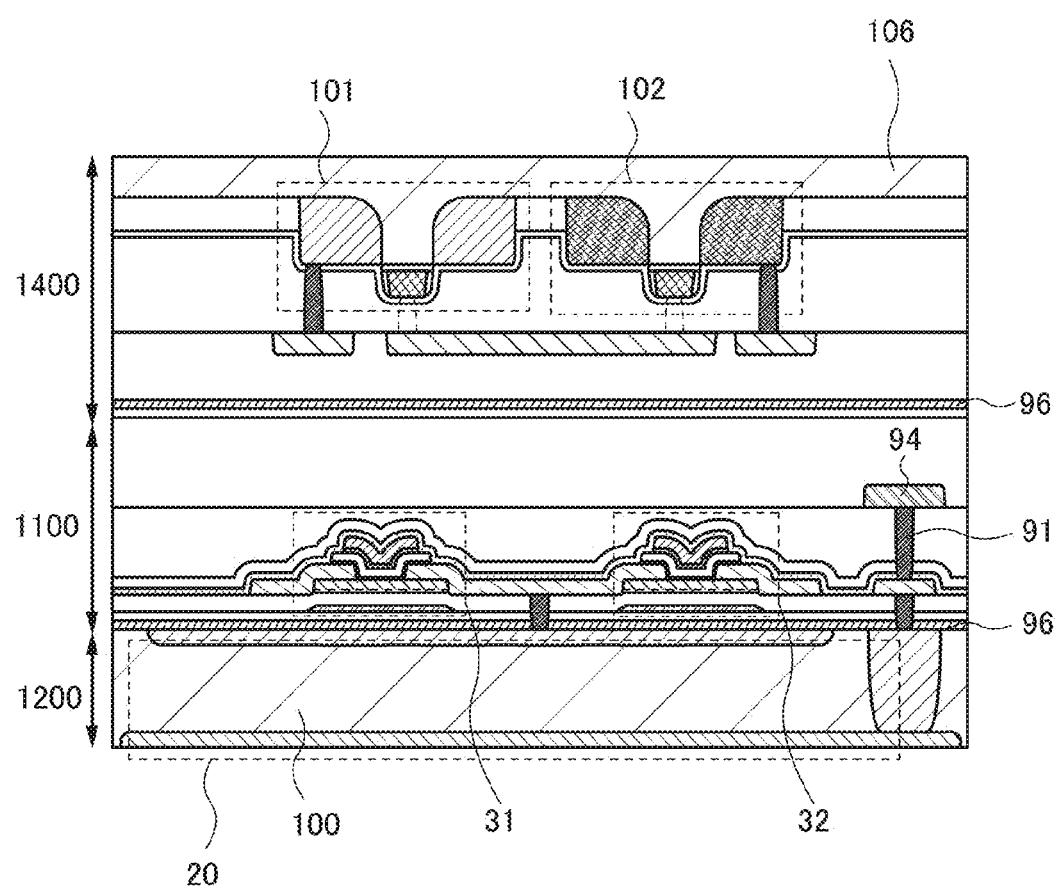
FIG. 29 is a cross-sectional view illustrating a structure of an imaging device.

As illustrated in FIG. 29, the imaging device of one embodiment of the present invention may have a structure where a pixel and the silicon substrate 106 in which a circuit is formed are attached to each other. Note that the pixel includes a photodiode formed in the silicon substrate 100 and OS transistors formed over the photodiode. Such a structure facilitates an increase in the effective area of the photodiode formed in the silicon substrate 100. Furthermore, when the integration degree of the circuit formed in the silicon substrate 106 is improved using miniaturized Si transistors, a high-performance semiconductor device can be provided.

Figure 30A:
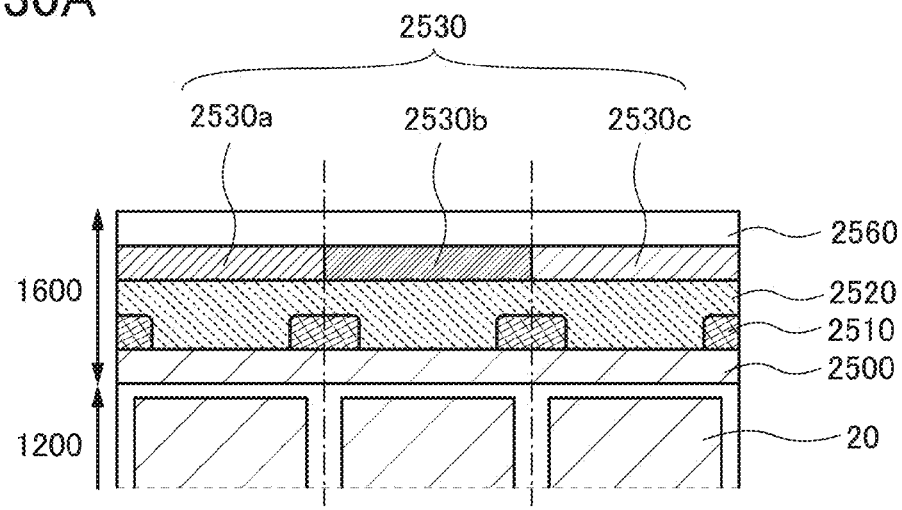
FIGS. 30A to 30C are cross-sectional views each illustrating a structure of an imaging device.

FIG. 30A is a cross-sectional view of an example of a mode in which a color filter and the like are added to the imaging device. The cross-sectional view illustrates part of a region including pixel circuits of three pixels. An insulating layer 2500 is formed over the tier 1200 where the photoelectric conversion element 20 is formed. As the insulating layer 2500, a silicon oxide film or the like with a high visible-light transmitting property can be used. A silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film that functions as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 30B:
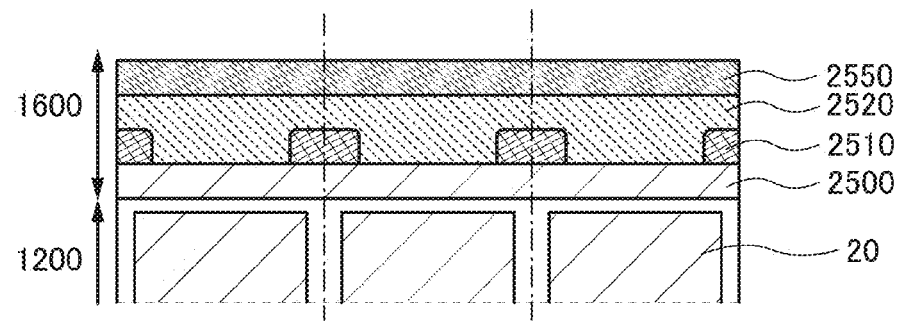

As illustrated in FIG. 30B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

When a scintillator is used for the optical conversion layer 2550, an imaging device that takes an image visualizing the intensity of radiation, which is used for an X-ray imaging device or the like, can be obtained. Radiation such as X-rays that passes through a subject to enter a scintillator is converted into light (fluorescence) such as visible light or ultraviolet light owing to a phenomenon known as photoluminescence. Then, the photoelectric conversion element 20 detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. Materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known, for example.

In the photoelectric conversion element 20 containing a selenium-based material, radiation such as X-rays can be directly converted into charge; thus, the scintillator is unnecessary.

A microlens array 2540 may be provided over the color filters 2530a, 2530b, and 2530c. Light transmitting lenses included in the microlens array 2540 passes through the color filters positioned thereunder and enters the photoelectric conversion element 20. Note that a region other than the tier 1200 in FIGS. 30A to 30C is referred to as a layer 1600.

Figure 30C:
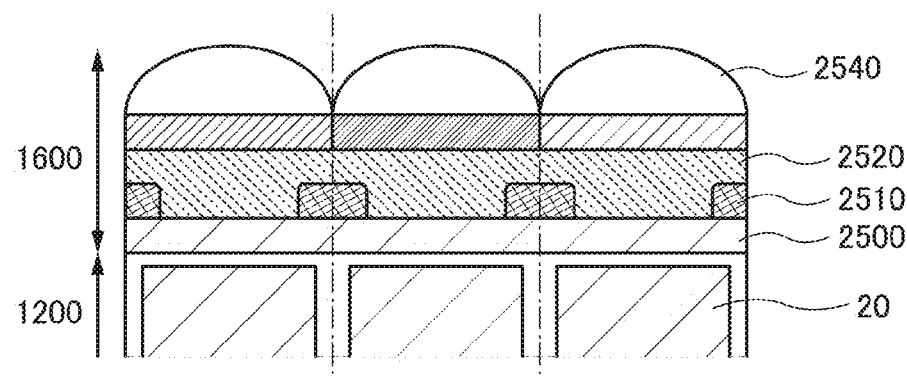
Figure 31:
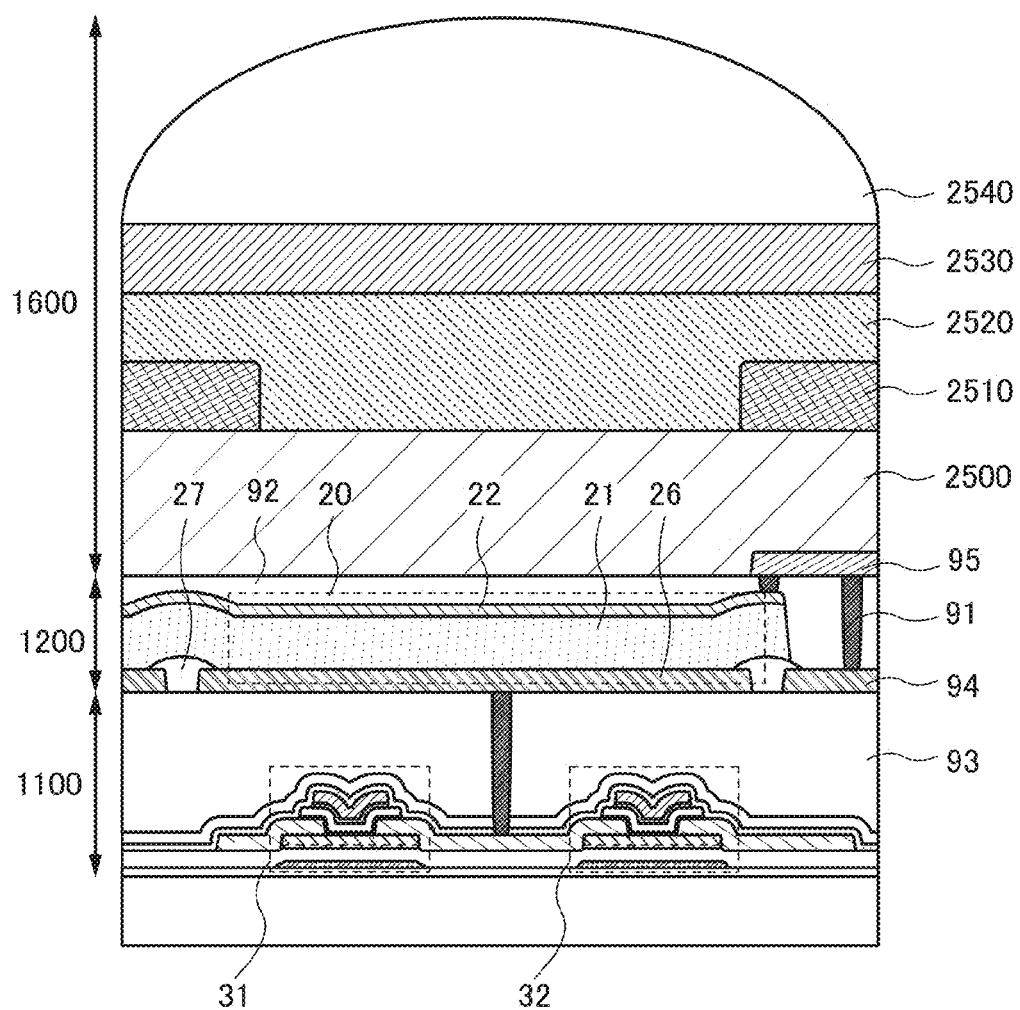
FIG. 31 is a cross-sectional view illustrating a structure of an imaging device.
Figure 32:
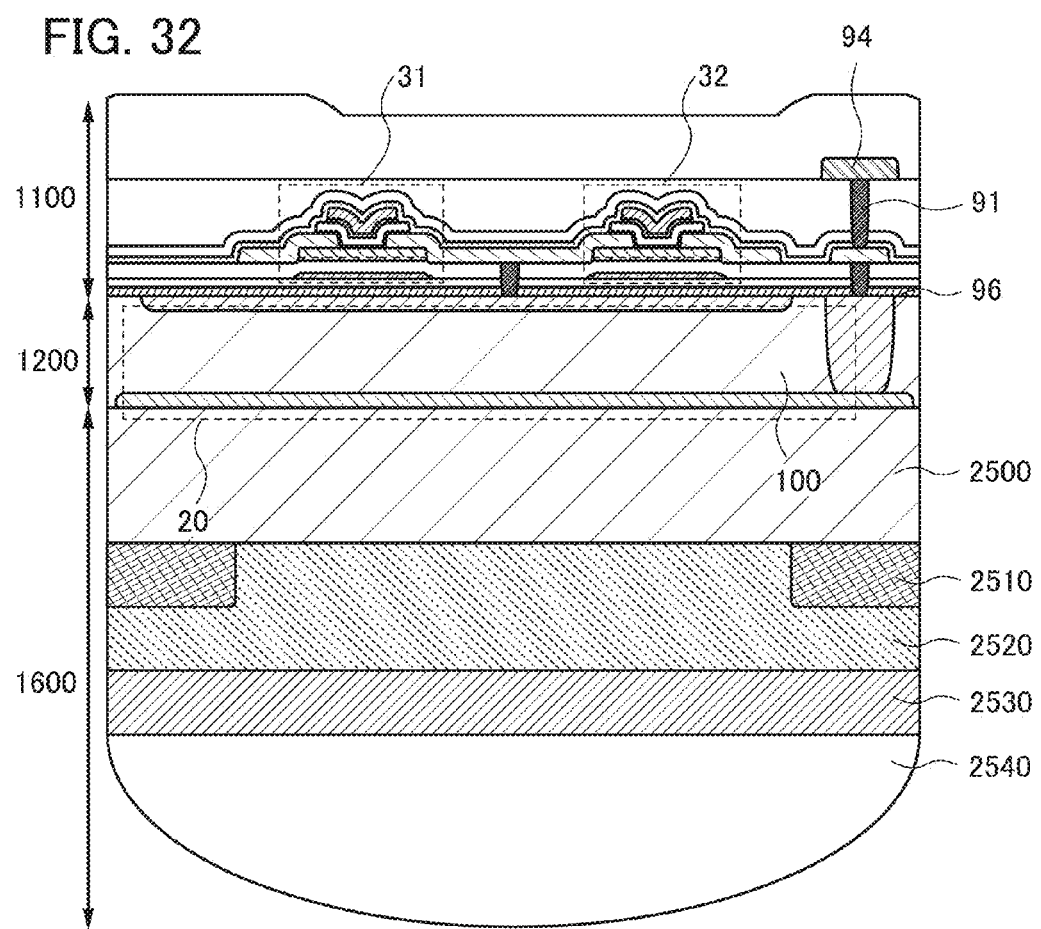
FIG. 32 is a cross-sectional view illustrating a structure of an imaging device.

The specific structure of the imaging device in FIG. 30C is illustrated in FIG. 31 by taking an example of the imaging device in FIG. 20A. In addition, the specific structure of the imaging device in FIG. 30C is illustrated in FIG. 32 by taking an example of the imaging device in FIG. 25.

Figure 33:
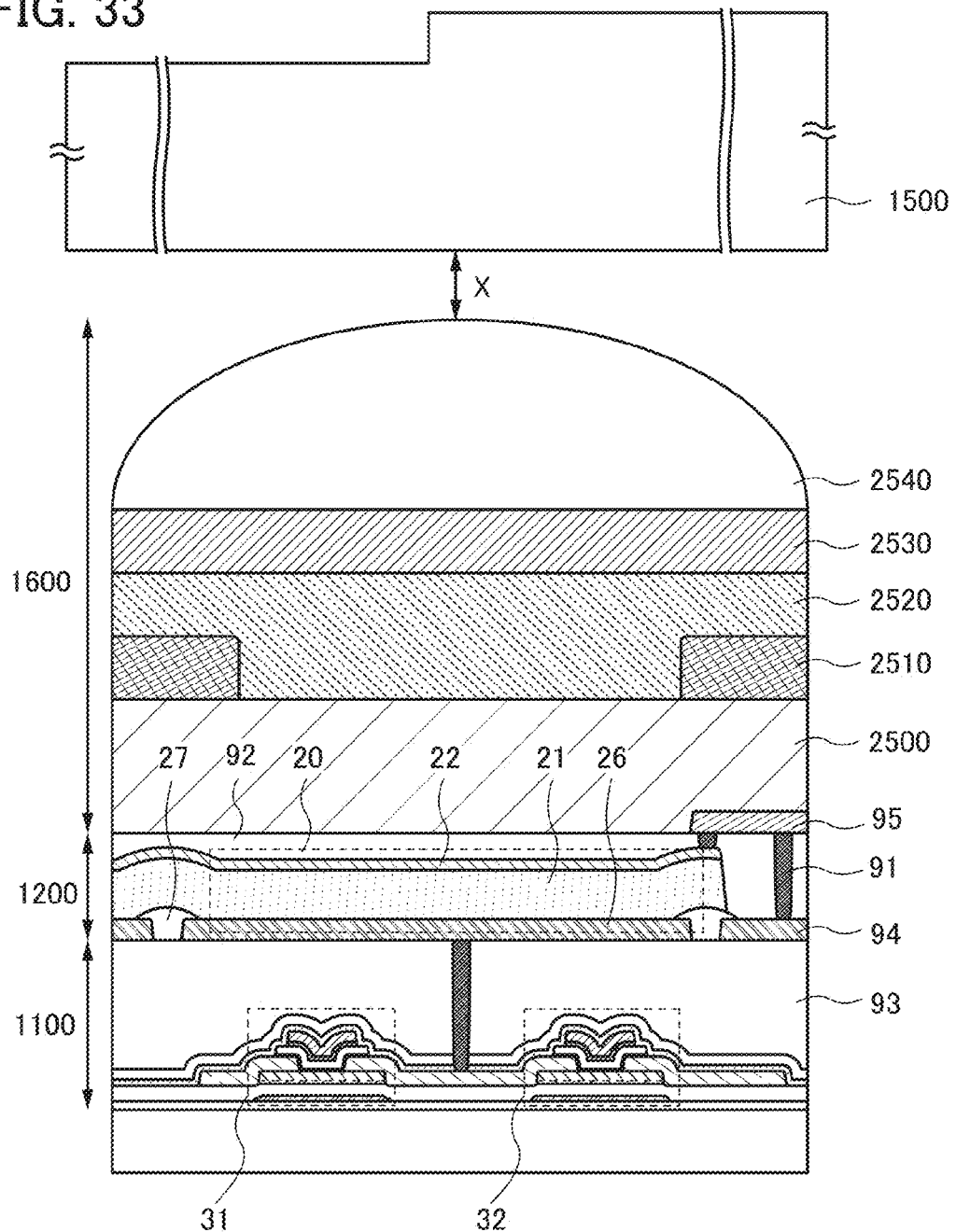
FIG. 33 is a cross-sectional view illustrating a structure of an imaging device.
Figure 34:
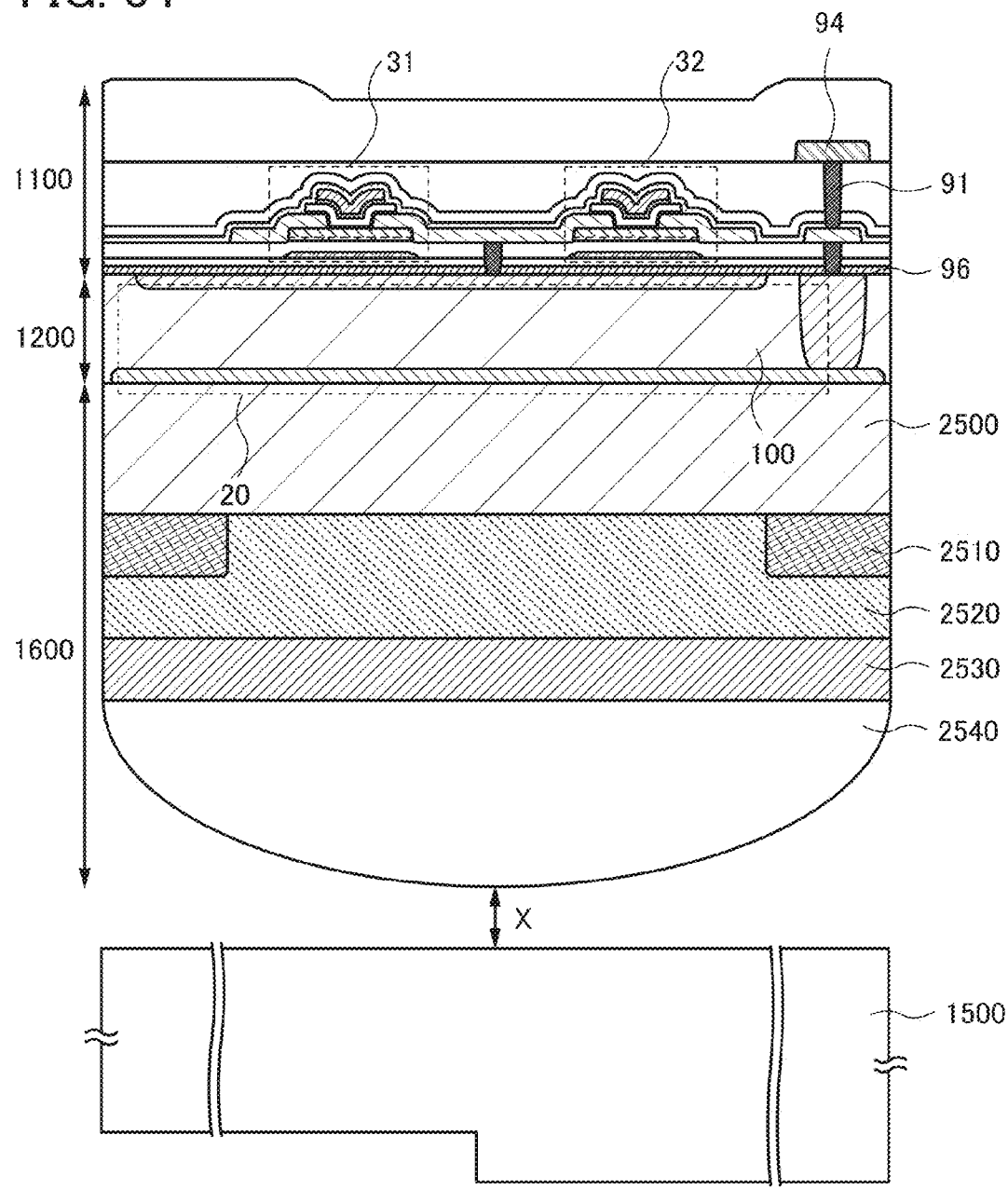
FIG. 34 is a cross-sectional view illustrating a structure of an imaging device.

The imaging device of one embodiment of the present invention may be combined with a diffraction grating 1500 as illustrated in FIG. 33 and FIG. 34. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Further alternatively, a stack including the inorganic insulating film and the organic insulating film may be used.

The diffraction grating 1500 can be formed by a lithography process using a photosensitive resin or the like. Alternatively, the diffraction grating 1500 can be formed by a lithography process and an etching process. Further alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, and preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Further alternatively, a liquid such as silicone oil may be provided. Even in the case where the microlens array 2540 is not provided, the space X may be provided between the color filter 2530 and the diffraction grating 1500.

As illustrated in FIG. 35A1 and FIG. 35B1, the imaging device of one embodiment of the present invention may be bent. FIG. 35A1 illustrates a state in which the imaging device is bent in the direction of dashed-two dotted line X1-X2. FIG. 35A2 is a cross-sectional view illustrating a portion indicated by dashed-two dotted line X1-X2 in FIG. 35A1. FIG. 35A3 is a cross-sectional view illustrating a portion indicated by dashed-two dotted line Y1-Y2 in FIG. 35A1.

FIG. 35B1 illustrates a state where the imaging device is bent in the direction of dashed-two dotted line X3-X4 and the direction of dashed-two dotted line Y3-Y4. FIG. 35B2 is a cross-sectional view illustrating a portion indicated by dashed-two dotted line X3-X4 in FIG. 35B1. FIG. 35B3 is a cross-sectional view illustrating a portion indicated by dashed-two dotted line Y3-Y4 in FIG. 35B1.

Bending the imaging device can reduce field curvature and astigmatism. Thus, the optical design of a lens or the like, which is used in combination of the imaging device, can be facilitated. For example, the number of lenses used for aberration correction can be reduced; accordingly, the size or weight of semiconductor device or the like including the imaging device can be easily reduced. In addition, the quality of a captured image can be improved.

This embodiment can be implemented in appropriate combination with any of the structures described in the other embodiments.

Embodiment 4

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 36A:
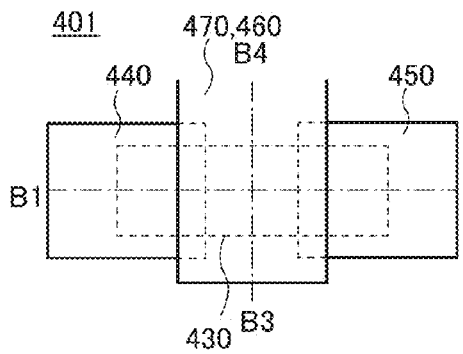
FIGS. 36A to 36F are top views and cross-sectional views illustrating transistors.
Figure 36B:
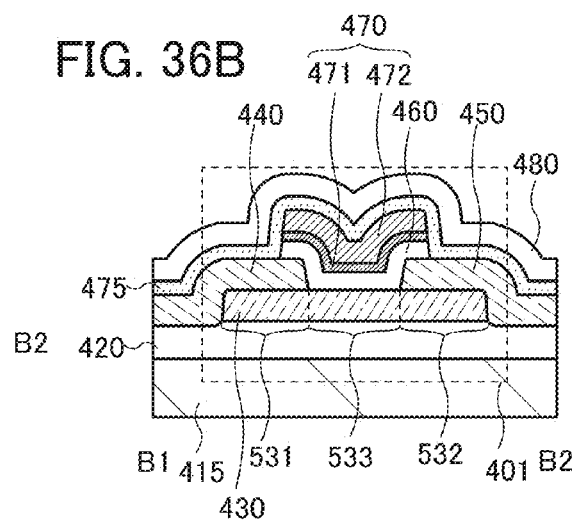
Figure 38A:
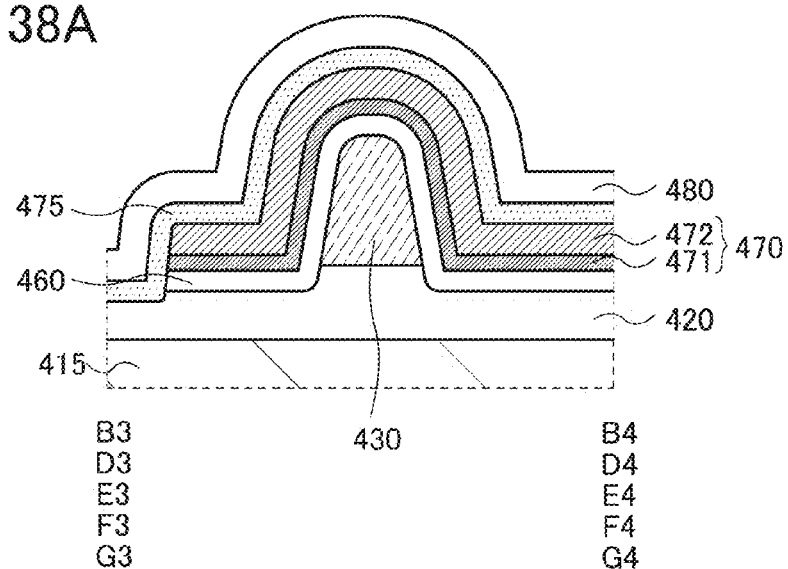
FIGS. 38A to 38D each illustrate a cross section of a transistor in a channel width direction.

FIG. 36A is a top view illustrating a transistor 401 in one embodiment of the present invention. A cross section in the direction of dashed-dotted line B1-B2 in FIG. 36A is illustrated in FIG. 36B. A cross section in the direction of dashed-dotted line B3-B4 in FIG. 36A is illustrated in FIG. 38A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating layer 420, an oxide semiconductor layer 430, a conductive layer 440, a conductive layer 450, an insulating layer 460, a conductive layer 470, an insulating layer 475, and an insulating layer 480.

The insulating layer 420 is in contact with the substrate 415. The oxide semiconductor layer 430 is in contact with the insulating layer 420. The conductive layer 440 and the conductive layer 450 are in contact with the insulating layer 420 and the oxide semiconductor layer 430. The insulating layer 460 is in contact with the insulating layer 420, the oxide semiconductor layer 430, the conductive layer 440, and the conductive layer 450. The conductive layer 470 is in contact with the insulating layer 460. The insulating layer 475 is in contact with the insulating layer 420, the conductive layer 440, the conductive layer 450, and the conductive layer 470. The insulating layer 480 is in contact with the insulating layer 475.

Here, in the oxide semiconductor layer 430, a region in contact with the conductive layer 440, a region in contact with the conductive layer 450, and a region in contact with the insulating layer 460 are referred to as a region 531, a region 532, and a region 533, respectively.

Furthermore, the conductive layers 440 and 450 are electrically connected to the oxide semiconductor layer 430.

The conductive layer 440 can function as one of a source and a drain. The conductive layer 450 functions as the other of the source and the drain. The insulating layer 460 functions as a gate insulating layer. The conductive layer 470 functions as a gate.

The region 531, the region 532, and the region 533 which are illustrated in FIG. 36B functions as one of a source region and a drain region, the other of the source region and the drain region, and a channel formation region, respectively.

Each of the conductive layers 440 and 450 is a single layer in the drawing, but also may be a stack of two or more layers. The conductive layer 470 includes two layers, a conductive layer 471 and a conductive layer 472, in the drawing, but also may be a single layer or a stack of three or more layers. The same applies to other transistors described in this embodiment.

The insulating layer 480 may function as a planarization film as necessary.

Figure 36C:
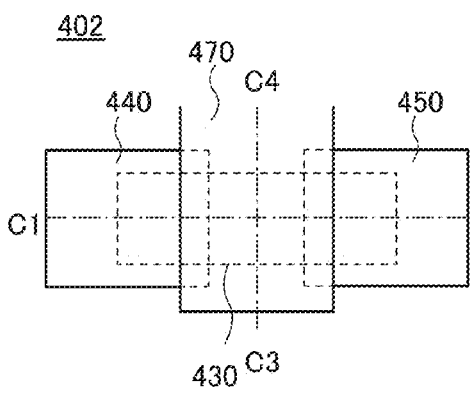
Figure 36D:
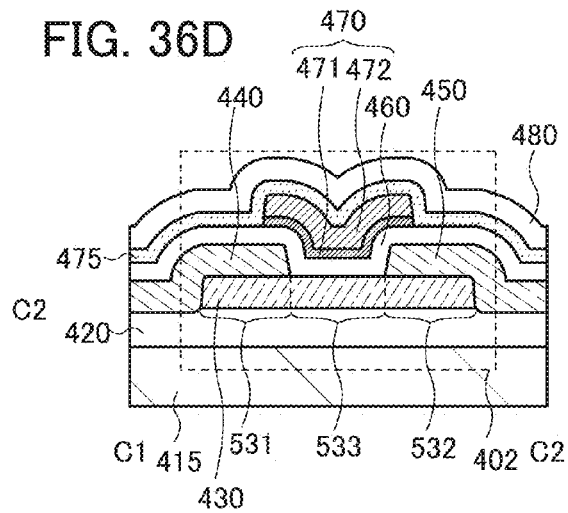
Figure 38B:
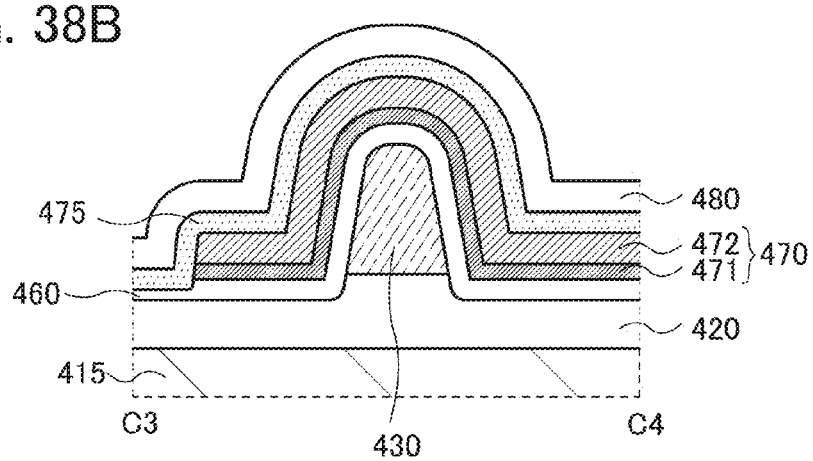

The transistor in one embodiment of the present invention may have a structure illustrated in FIGS. 36C and 36D. FIG. 36C is a top view of a transistor 402. A cross section in the direction of dashed-dotted line C1-C2 in FIG. 36C is illustrated in FIG. 36D. A cross section in the direction of dashed-dotted line C3-C4 in FIG. 36C is illustrated in FIG. 38B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating layer 460 is not aligned with an end portion of the conductive layer 470. In the transistor 402, wide areas of the conductive layers 440 and 450 are covered with the insulating layer 460 and accordingly the electric resistance between the conductive layer 470 and the conductive layers 440 and 450 is high; therefore, the transistor 402 has a feature of low gate leakage current.

The transistors 401 and 402 each have a top-gate structure including regions where the conductive layer 470 overlaps with the conductive layers 440 and 450. To reduce parasitic capacitance, the width of each of the regions in the channel length direction is preferably greater than or equal to 3 nm and less than 300 nm. Since an offset region is not formed in the oxide semiconductor layer 430 in this structure, a transistor with a high on-state current can be easily formed.

Figure 36E:
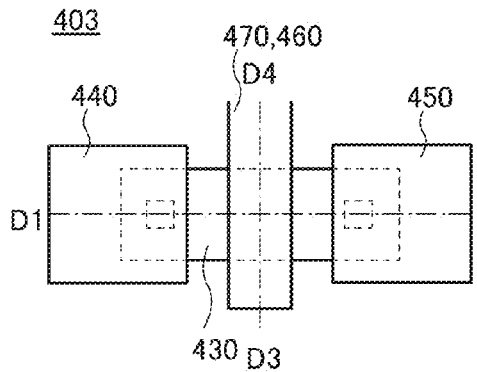
Figure 36F:
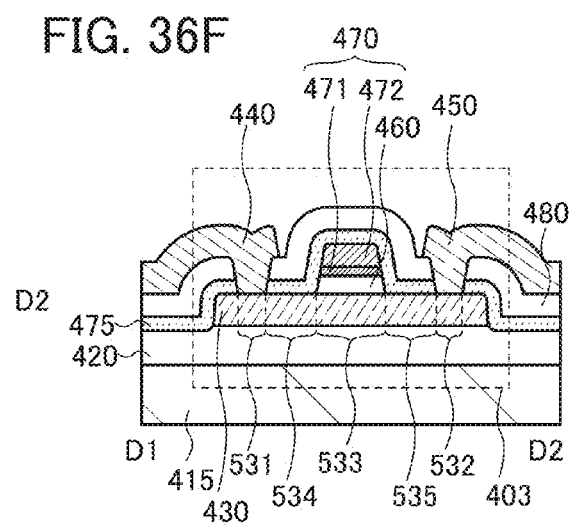

The transistor in one embodiment of the present invention may have a structure illustrated in FIGS. 36E and 36F. FIG. 36E is a top view of a transistor 403. A cross section in the direction of dashed-dotted line D1-D2 in FIG. 36E is illustrated in FIG. 36F. A cross section in the direction of dashed-dotted line D3-D4 in FIG. 36E is illustrated in FIG. 38A. The direction of dashed-dotted line D1-D2 is referred to as a channel length direction, and the direction of dashed-dotted line D3-D4 is referred to as a channel width direction.

In the transistor 403, the insulating layer 420 is in contact with the substrate 415; the oxide semiconductor layer 430 is in contact with the insulating layer 420; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, and the conductive layer 470; the insulating layer 480 is in contact with the insulating layer 475; and the conductive layer 440 and the conductive layer 450 are in contact with the oxide semiconductor layer 430 and the insulating layer 480.

Openings are formed in the insulating layers 475 and 480, and the conductive layers 440 and 450 are electrically connected to the oxide semiconductor layer 430 through the openings.

The transistor 403 may further include, for example, an insulating layer (planarization film) in contact with the conductive layers 440 and 450 and the insulating layer 480 as necessary.

In the oxide semiconductor layer 430, a region that is in contact with the insulating layer 475 and is sandwiched between the region 531 and the region 533 is referred to as a region 534, and a region that is in contact with the insulating layer 475 and is sandwiched between the region 532 and the region 533 is referred to as a region 535.

Figure 37A:
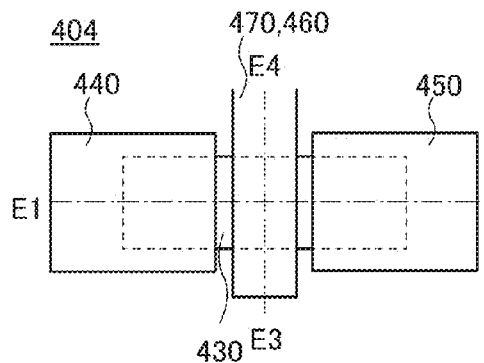
FIGS. 37A to 37F are top views and cross-sectional views illustrating transistors.
Figure 37B:
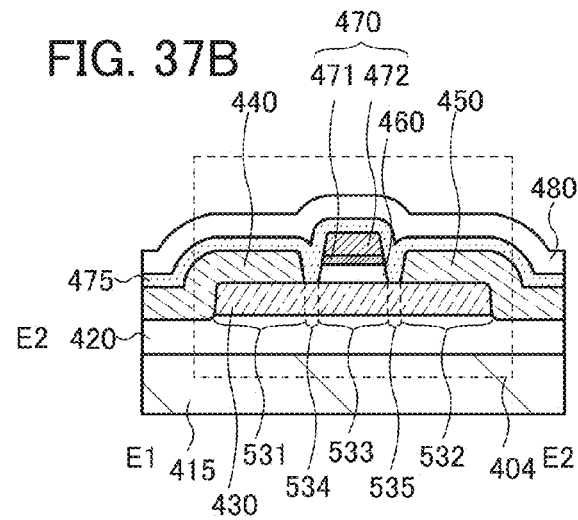

The transistor in one embodiment of the present invention may have a structure illustrated in FIGS. 37A and 37B. FIG. 37A is a top view of a transistor 404. A cross section in the direction of dashed-dotted line E1-E2 in FIG. 37A is illustrated in FIG. 37B. A cross section in the direction of dashed-dotted line E3-E4 in FIG. 37A is illustrated in FIG. 38A. The direction of dashed-dotted line E1-E2 is referred to as a channel length direction, and the direction of dashed-dotted line E3-E4 is referred to as a channel width direction in some cases.

In the transistor 404, the insulating layer 420 is in contact with the substrate 415; the oxide semiconductor layer 430 is in contact with the insulating layer 420; the conductive layers 440 and 450 are in contact with the insulating layer 420 and the oxide semiconductor layer 430; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, the conductive layer 440, the conductive layer 450, and the conductive layer 470; and the insulating layer 480 is in contact with the insulating layer 475.

The transistor 404 is different from the transistor 403 in that the conductive layers 440 and 450 in contact with the oxide semiconductor layer 430 cover end portions of the oxide semiconductor layer 430.

The transistors 403 and 404 each have a self-aligned structure that does not include regions where the conductive layer 470 overlaps with the conductive layers 440 and 450. A transistor with a self-aligned structure, which has extremely low parasitic capacitance between a gate and a source and between the gate and a drain, is suitable for applications that require high-speed operation.

Figure 37C:
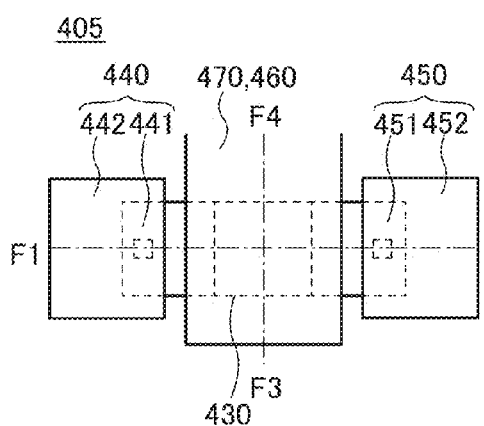
Figure 37D:
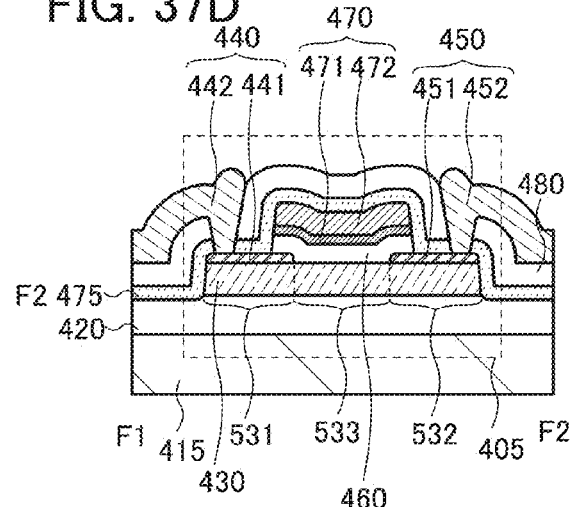

The transistor in one embodiment of the present invention may have a structure illustrated in FIGS. 37C and 37D. FIG. 37C is a top view of a transistor 405. A cross section in the direction of dashed-dotted line F1-F2 in FIG. 37C is illustrated in FIG. 37D. A cross section in the direction of dashed-dotted line F3-F4 in FIG. 37C is illustrated in FIG. 38A. The direction of dashed-dotted line F1-F2 is referred to as a channel length direction, and the direction of dashed-dotted line F3-F4 is referred to as a channel width direction in some cases.

In the transistor 405, the conductive layer 440 includes two layers, a conductive layer 441 and a conductive layer 442, and the conductive layer 450 includes two layers, a conductive layer 451 and a conductive layer 452. The insulating layer 420 is in contact with the substrate 415. The oxide semiconductor layer 430 is in contact with the insulating layer 420. The conductive layer 441 and the conductive layer 451 are in contact with the oxide semiconductor layer 430. The insulating layer 460 is in contact with the insulating layer 420, the oxide semiconductor layer 430, the conductive layer 441, and the conductive layer 451. The conductive layer 470 is in contact with the insulating layer 460. The insulating layer 475 is in contact with the insulating layer 420, the conductive layer 441, the conductive layer 451, and the conductive layer 470. The insulating layer 480 is in contact with the insulating layer 475. The conductive layer 442 is in contact with the conductive layer 441 and the insulating layer 480. The conductive layer 452 is in contact with the conductive layer 451 and the insulating layer 480.

The conductive layers 441 and 451 are in contact with the top surface of the oxide semiconductor layer 430 and are not in contact with a side surface of the oxide semiconductor layer 430.

The transistor 405 may further include, for example, an insulating layer in contact with the conductive layers 442 and 452 and the insulating layer 480 as necessary.

The conductive layer 441 and the conductive layer 451 are electrically connected to the oxide semiconductor layer 430. Furthermore, the conductive layer 442 is electrically connected to the conductive layer 441, and the conductive layer 452 is electrically connected to the conductive layer 451.

In the oxide semiconductor layer 430, a region overlapping with the conductive layer 441 is the region 531 that can function as one of a source region and a drain region, and a region overlapping with the conductive layer 451 is the region 532 that can function as the other of the source region and the drain region.

Figure 37E:
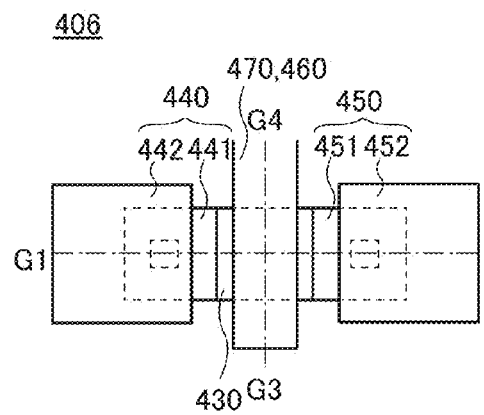
Figure 37F:
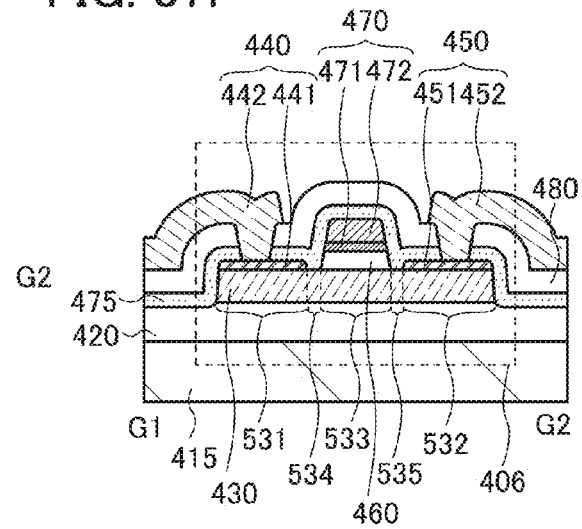

The transistor in one embodiment of the present invention may have a structure illustrated in FIGS. 37E and 37F. FIG. 37E is a top view of a transistor 406. A cross section in the direction of dashed-dotted line G1-G2 in FIG. 37E is illustrated in FIG. 37F. A cross section in the direction of dashed-dotted line G3-G4 in FIG. 37E is illustrated in FIG. 38A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive layer 440 includes two layers, the conductive layers 441 and 442, and the conductive layer 450 includes two layers, the conductive layers 451 and 452.

In the structures of the transistors 405 and 406, the conductive layers 440 and 450 are not in contact with the insulating layer 420. These structures make the insulating layer 420 less likely to be deprived of oxygen by the conductive layers 440 and 450 and facilitate oxygen supply from the insulating layer 420 to the oxide semiconductor layer 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers that functions as a source and a drain; thus, contact resistance between the oxide conductor layer and the conductive layers that functions as a source and a drain can be reduced.

Although the transistors 401 to 406 in FIGS. 36A to 36F, FIGS. 37A to 37F, and FIGS. 38A to 38D are examples in which the oxide semiconductor layer 430 is a single layer, the oxide semiconductor layer 430 may be a stacked layer. FIG. 39A is a top view of the oxide semiconductor layer 430, and FIGS. 39B and 39C are cross-sectional views of the oxide semiconductor layer 430 having a two-layer structure of an oxide semiconductor layer 430a and an oxide semiconductor layer 430b. FIGS. 39D and 39E are cross-sectional views of the oxide semiconductor layer 430 having a three-layer structure of the oxide semiconductor layer 430a, the oxide semiconductor layer 430b, and an oxide semiconductor layer 430c.

The oxide semiconductor layers 430a and 430c can also be referred to as insulating layers because no channel region is formed therein.

Oxide semiconductor layers with different compositions, for example, can be used as the oxide semiconductor layer 430a, the oxide semiconductor layer 430b, and the oxide semiconductor layer 430c.

The oxide semiconductor layer 430 in the transistors 401 to 406 can be replaced by the oxide semiconductor layer 430 in FIGS. 39B and 39C or FIGS. 39D and 39E.

Figure 40A:
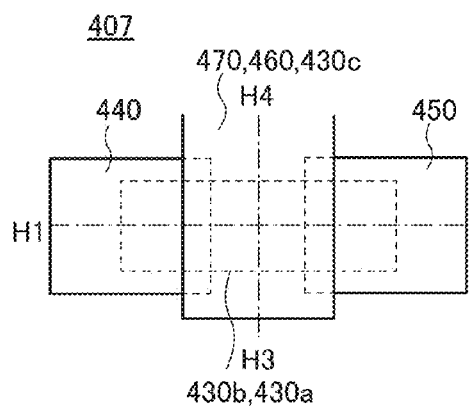
FIGS. 40A to 40F are top views and cross-sectional views illustrating transistors.
Figure 40B:
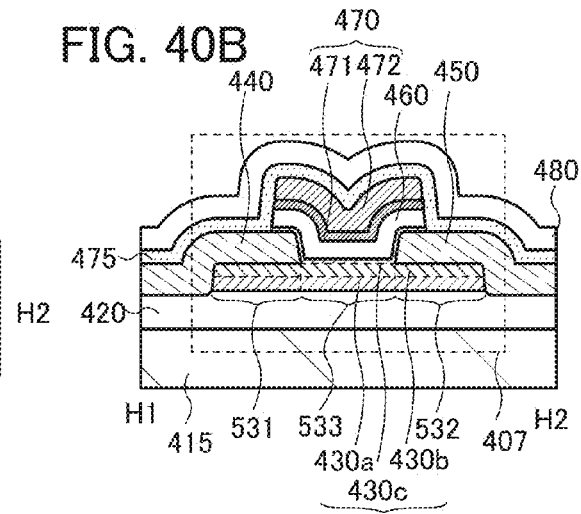
Figure 40C:
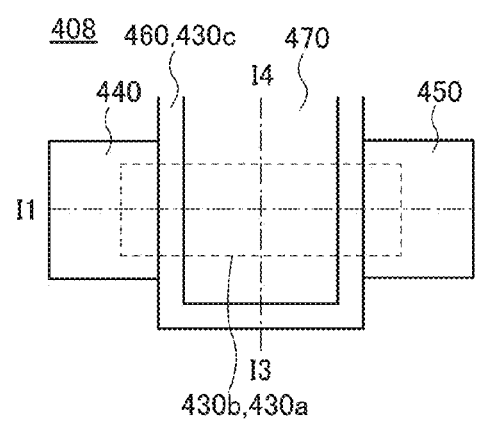
Figure 40D:
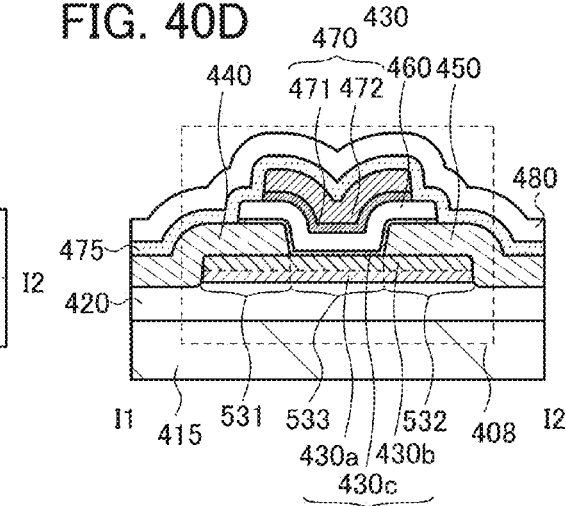
Figure 40E:
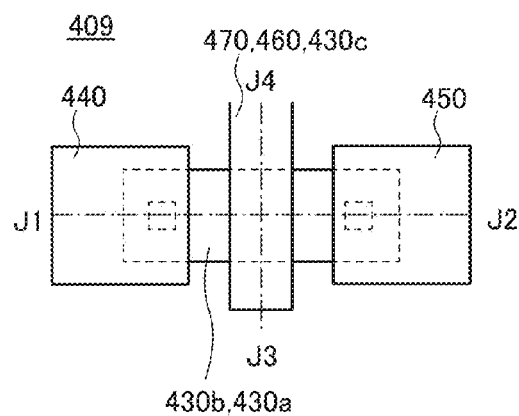
Figure 40F:
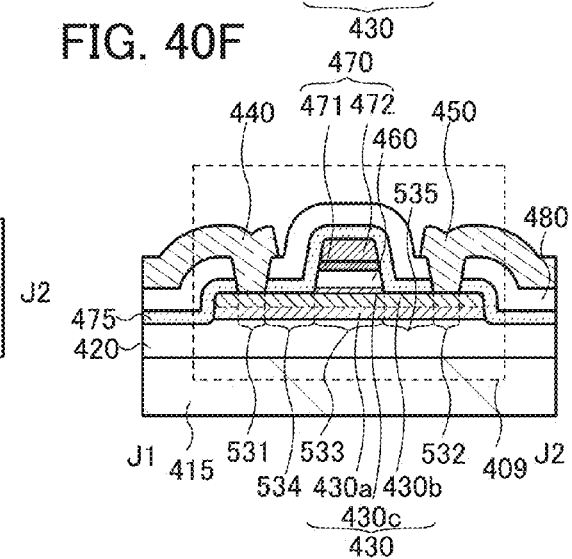
Figure 41A:
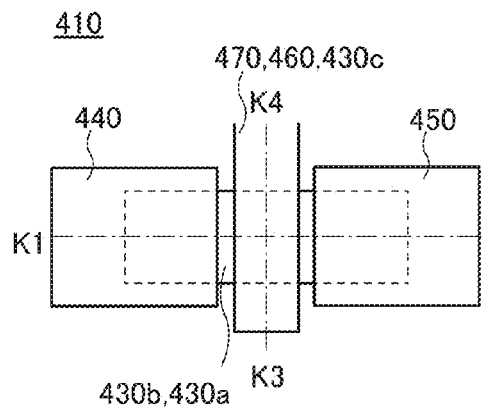
FIGS. 41A to 41F are top views and cross-sectional views illustrating transistors.
Figure 41B:
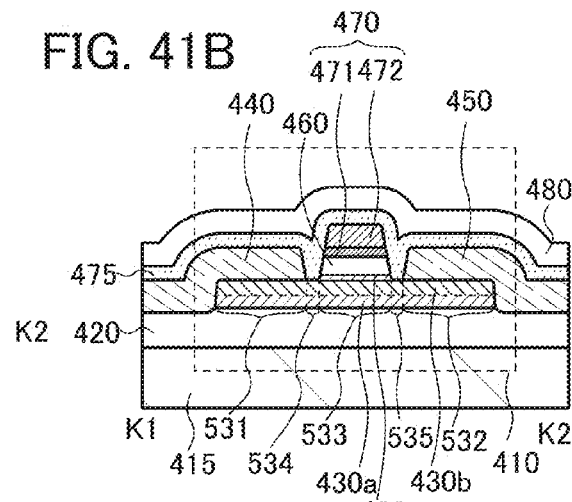
Figure 41C:
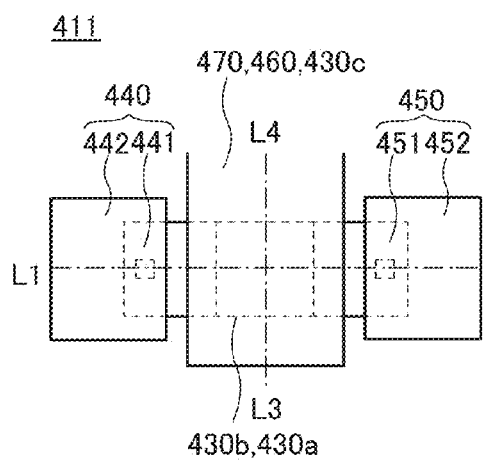
Figure 41D:
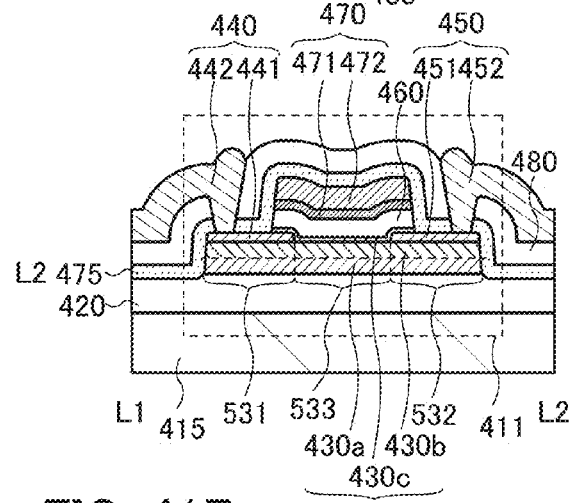
Figure 41E:
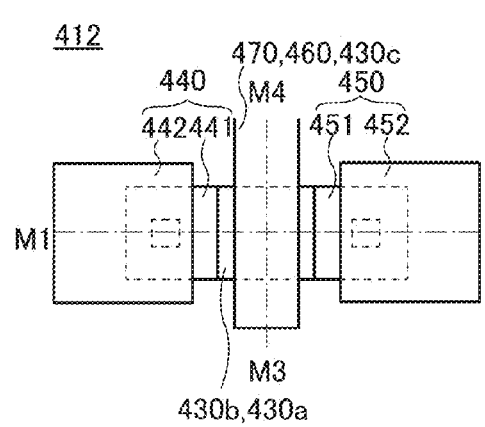
Figure 41F:
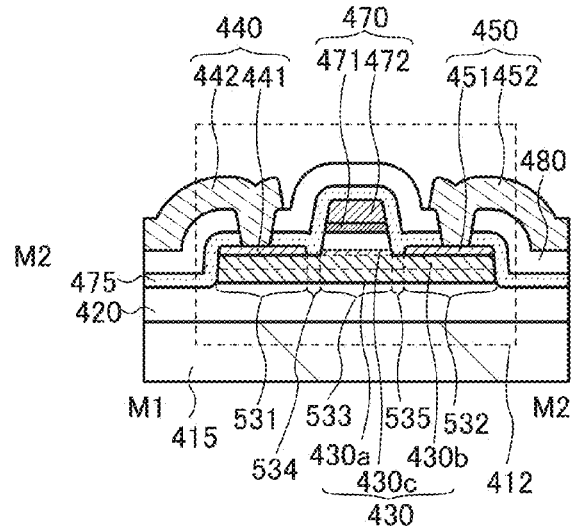
Figure 42A:
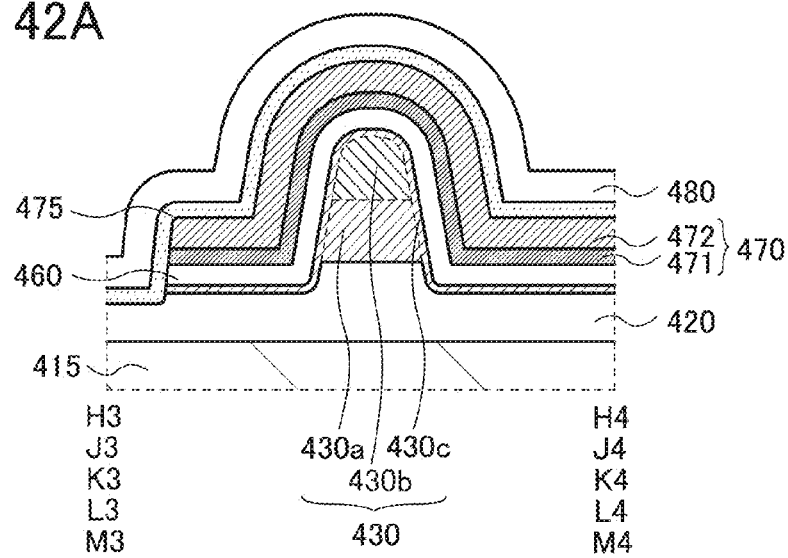
FIGS. 42A to 42D each illustrate a cross section of a transistor in a channel width direction.
Figure 42B:
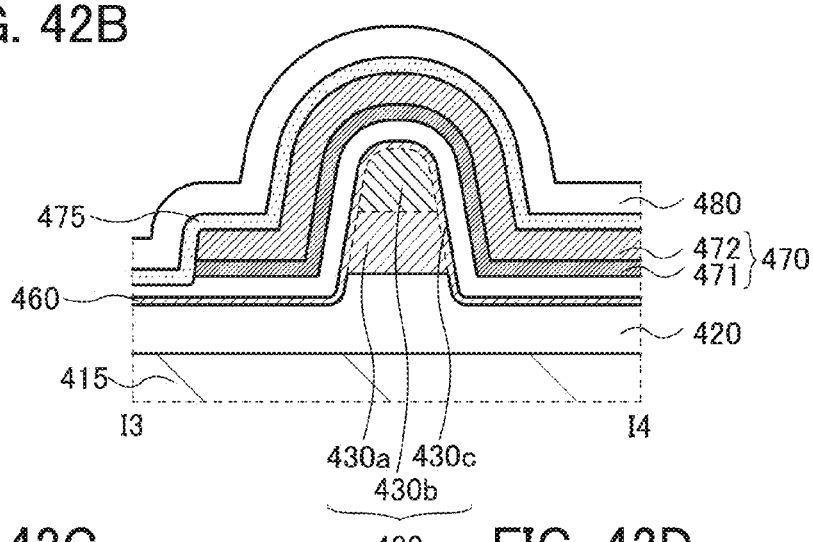

The transistor in one embodiment of the present invention may have a structure illustrated in FIGS. 40A to 40F, FIGS. 41A to 41F, and FIGS. 42A to 42D. FIGS. 40A, 40C, and 40E and FIGS. 41A, 41C, and 41E are top views of transistors 407, 408, 409, 410, 411, and 412, respectively. FIG. 40B is a cross section in the direction of dashed-dotted line H1-H2 in FIG. 40A. FIG. 40D is a cross section in the direction of dashed-dotted line I1-I2 in FIG. 40C. FIG. 40F is a cross section in the direction of dashed-dotted line J1-J2 in FIG. 40E. FIG. 41B is a cross section in the direction of dashed-dotted line K1-K2 in FIG. 41A. FIG. 41D is a cross section in the direction of dashed-dotted line L1-L2 in FIG. 41C. FIG. 41F is a cross section in the direction of dashed-dotted line M1-M2 in FIG. 41E. FIG. 42A illustrates each of cross sections in the directions of dashed-dotted lines H3-H4 in FIG. 40A, J3-J4 in FIG. 40E, K3-K4 in FIG. 41A, L3-L4 in FIG. 41C, and M3-M4 in FIG. 41E. FIG. 42B is a cross section in the direction of dashed-dotted line I3-I4 in FIG. 40C. The directions of dashed-dotted lines H1-H2, I1-I2, J142, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 440 and 450.

The transistors 409, 410, and 412 each have the same structure as the transistors 403, 404, and 406 except that the oxide semiconductor layer 430 includes two layers (the oxide semiconductor layers 430a and 430b) in the regions 531, 532, 534, and 535 and that the oxide semiconductor layer 430 includes three layers (the oxide semiconductor layers 430a to 430c) in the region 533.

The transistor 411 has the same structure as the transistor 405 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 441 and 451.

Figure 38C:
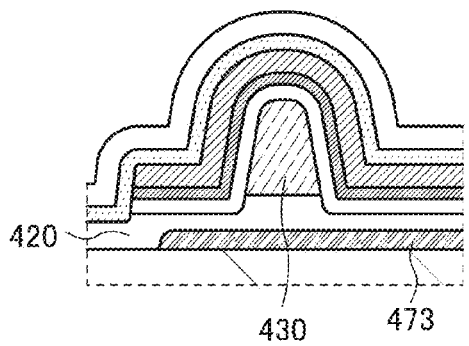
Figure 39A:
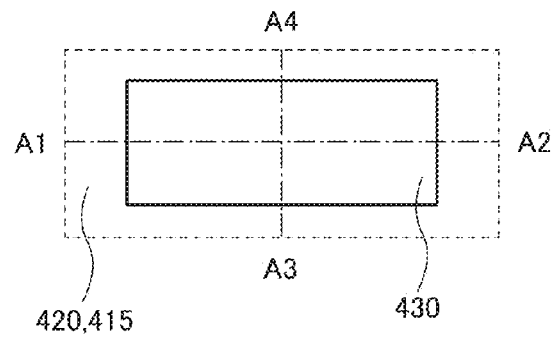
FIGS. 39A to 39E are a top view and cross-sectional views illustrating oxide semiconductor layers.
Figure 39B:
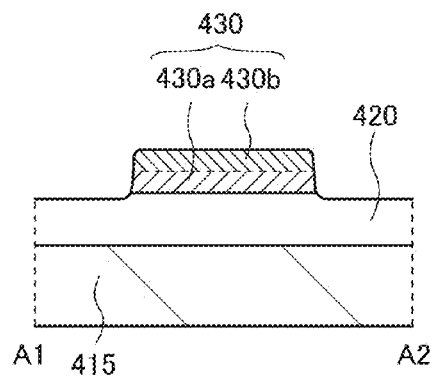
Figure 39D:
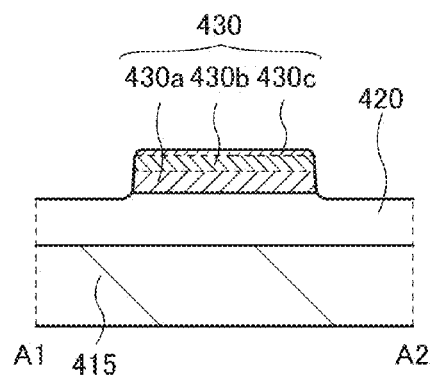
Figure 39C:
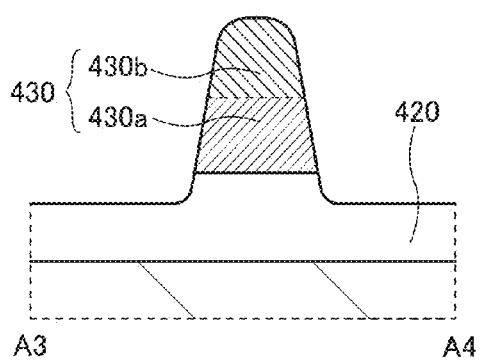
Figure 39E:
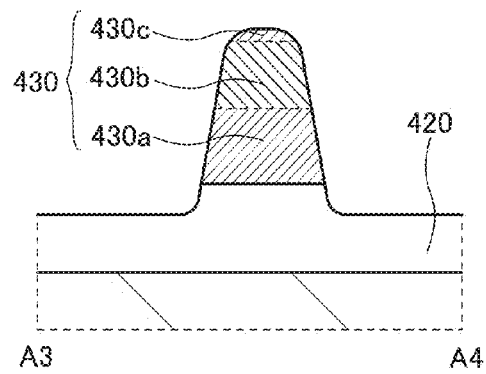
Figure 42C:
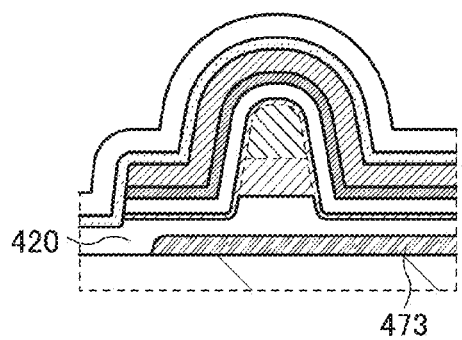

The transistor in one embodiment of the present invention may include a conductive layer 473 between the oxide semiconductor layer 430 and the substrate 415 as illustrated in cross-sectional views in the channel length directions of the transistors 401 to 412 illustrated in FIGS. 43A to 43F and FIGS. 44A to 44F, the cross-sectional view in the channel width direction of each of the transistors 401 to 406 illustrated in FIG. 38C, and the cross-sectional view in the channel width direction of each of the transistors 407 to 412 illustrated in FIG. 42C. The conductive layer 473 is used as a second gate electrode (also referred to as a back gate electrode), whereby the channel formation region in the oxide semiconductor layer 430 is electrically surrounded by the conductive layers 470 and 473. Such a transistor structure is referred to as a surrounded channel (s-channel) structure. Such a structure can increase the on-state current, and can control the threshold voltage. In the cross-sectional views in FIGS. 43A to 43F and FIGS. 44A to 44F, the width of the conductive layer 473 may be smaller than that of the oxide semiconductor layer 430. Moreover, the width of the conductive layer 473 may be shorter than that of the conductive layer 470.

Figure 38D:
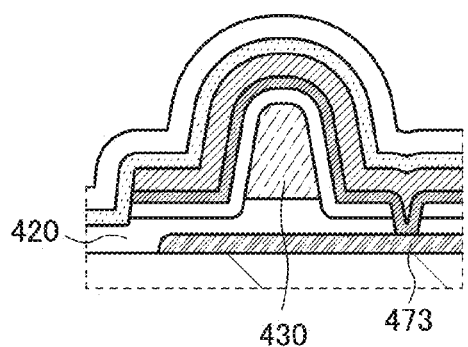
Figure 42D:
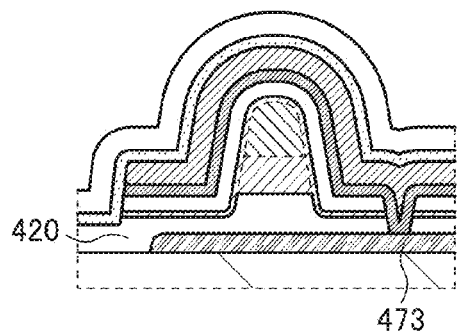
Figure 43A:
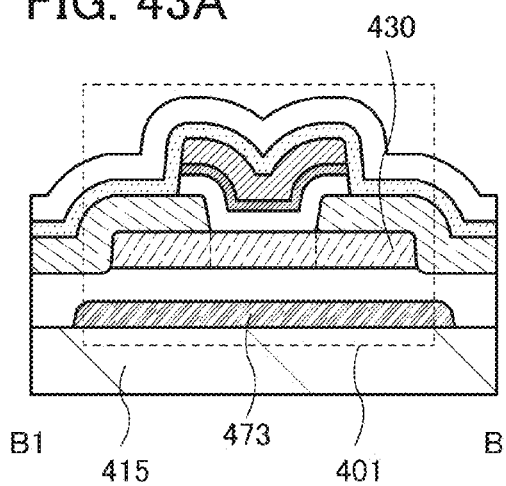
FIGS. 43A to 43F each illustrate a cross section of a transistor in a channel length direction.
Figure 43B:
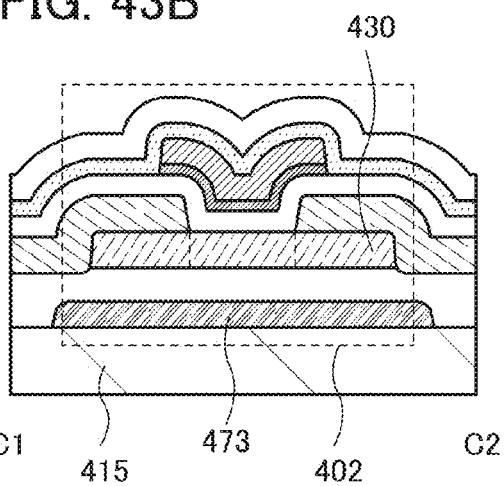
Figure 43C:
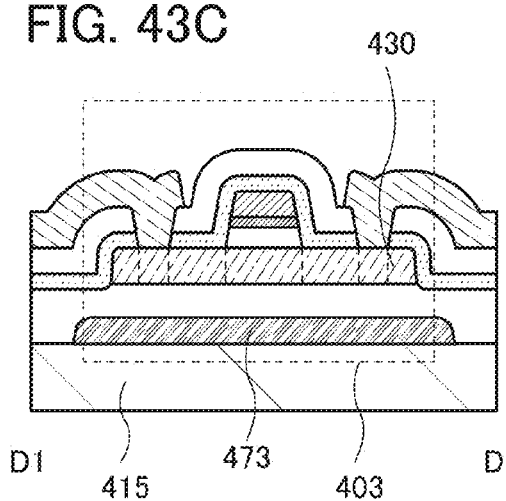
Figure 43D:
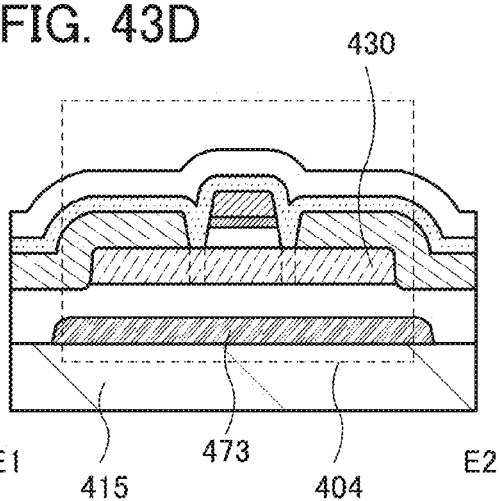
Figure 43E:
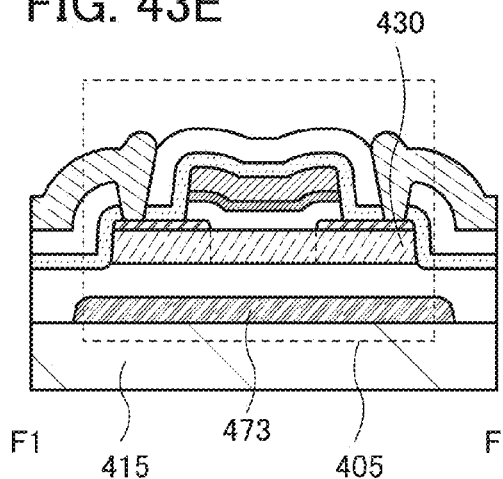
Figure 43F:
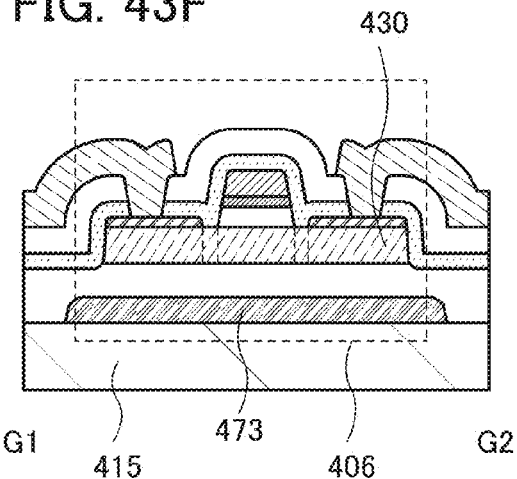
Figure 44A:
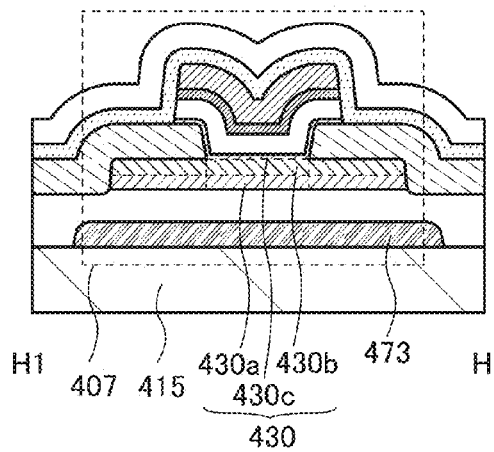
FIGS. 44A to 44F each illustrate a cross section of a transistor in a channel length direction.
Figure 44B:
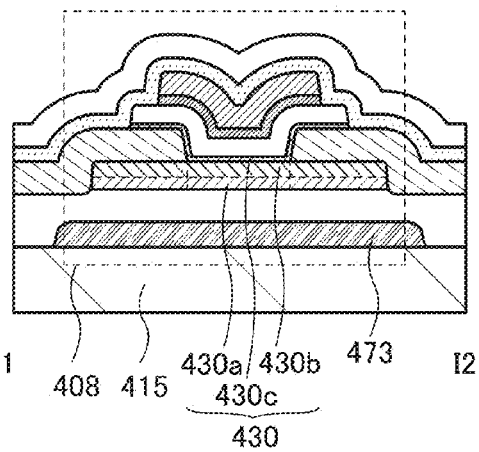
Figure 44C:
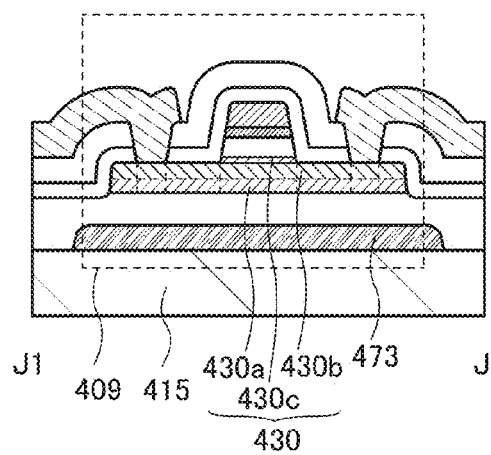
Figure 44D:
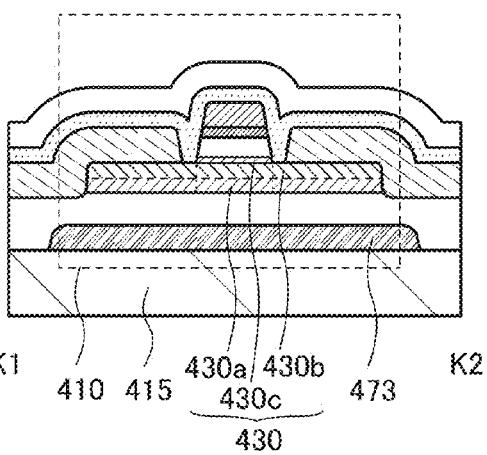
Figure 44E:
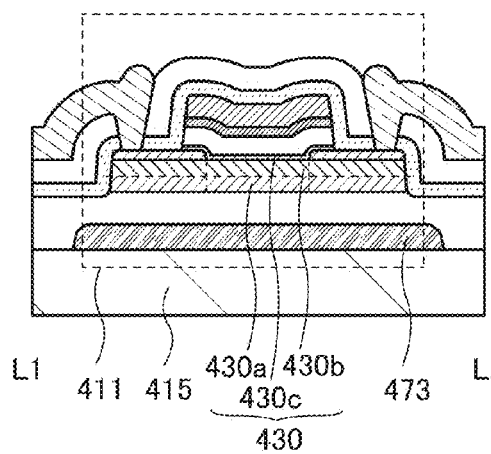
Figure 44F:
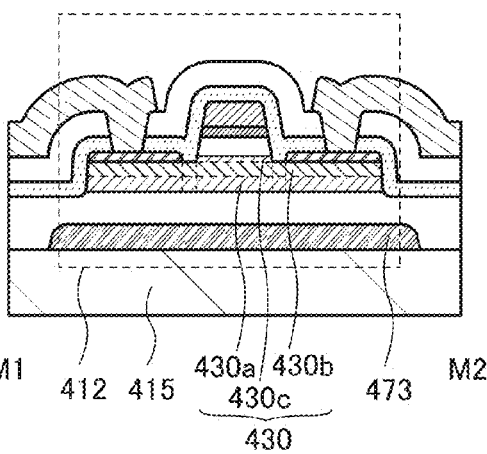

In order to increase the on-state current, for example, the conductive layers 470 and 473 are made to have the same potential, and the transistor is driven as a double-gate transistor. Furthermore, in order to control the threshold voltage, a fixed potential that is different from the potential of the conductive layer 470 is applied to the conductive layer 473. To set the conductive layers 470 and 473 at the same potential, for example, as illustrated in FIG. 38D and FIG. 42D, the conductive layers 470 and 473 may be electrically connected to each other through a contact hole.

The transistor in one embodiment of the present invention may have a structure illustrated in FIGS. 45A to 45C. FIG. 45A is a top view. FIG. 45B illustrates a cross-sectional view taken along dashed-dotted line N1-N2 in FIG. 45A. FIG. 45C illustrates a cross-sectional view taken along dashed-dotted line N3-N4 in FIG. 45A. Note that for simplification of the drawing, some components are not illustrated in the top view in FIG. 45A.

In the transistor 413, the insulating layer 420 is in contact with the substrate 415; the oxide semiconductor layer 430 (the oxide semiconductor layers 430a to 430c) is in contact with the insulating layer 420; the conductive layer 440 and the conductive layer 450 are in contact with the oxide semiconductor layer 430b; the insulating layer 460 is in contact with the oxide semiconductor layer 430c; the conductive layer 470 is in contact with the insulating layer 460; and the insulating layer 480 is in contact with the insulating layer 420, the conductive layer 440, and the conductive layer 450. Note that the oxide semiconductor layer 430c, the insulating layer 460, and the conductive layer 470 are provided in an opening reaching the oxide semiconductor layer 430b in the insulating layer 480.

In the transistor 413, a region where the conductive layer 470 overlaps with the conductive layer 440 or the conductive layer 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 45B and 45C, the transistor 413 is preferably subjected to a chemical mechanical polishing (CMP) method or the like to have a flat top surface, although not necessarily.

Figure 46A:
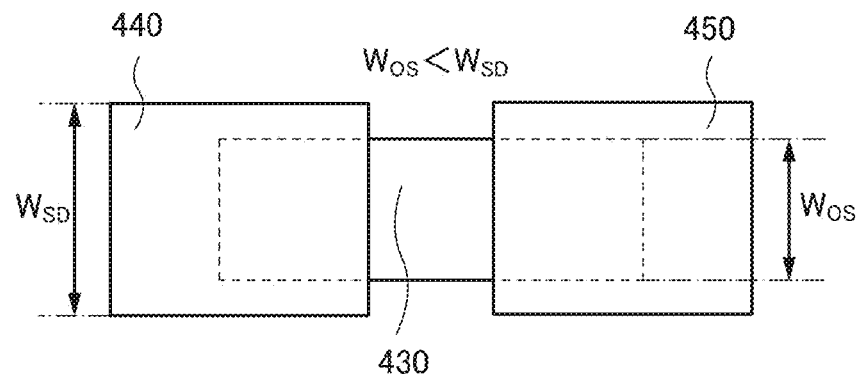
FIGS. 46A to 46C are top views each illustrating a transistor.
Figure 46B:
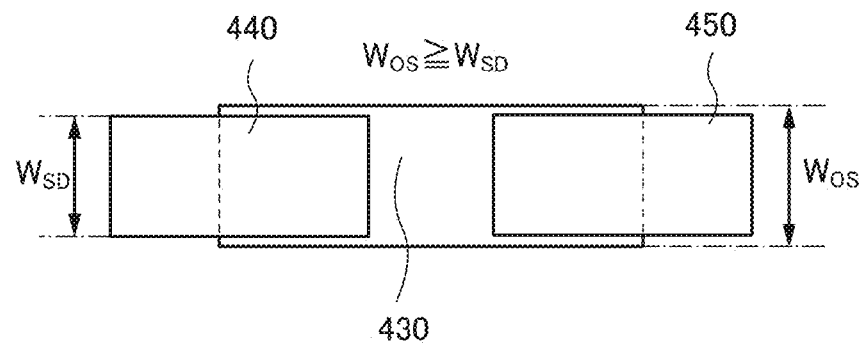
Figure 46C:
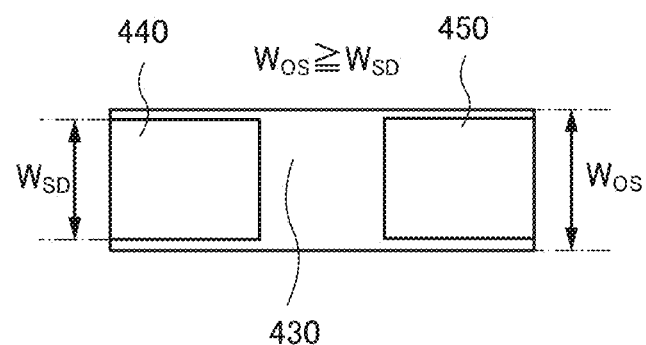

The conductive layer 440 and the conductive layer 450 in the transistor in one embodiment of the present invention may each have a width ($W_{SD}$) longer than the width ($W_{OS}$) of the oxide semiconductor layer as illustrated in the top view in FIG. 46A or shorter as illustrated in the top view in FIG. 46B. When $W_{OS} \geq W_{SD}$ ($W_{SD}$ is less than or equal to $W_{OS}$) is satisfied, a gate electric field is easily applied to the entire oxide semiconductor layer 430, so that electrical characteristics of the transistor can be particularly improved. As illustrated in FIG. 46C, the conductive layers 440 and 450 may be formed only in regions overlapping with the oxide semiconductor layer 430.

Note that FIGS. 46A to 46C only illustrate the oxide semiconductor layer 430, the conductive layer 440, and the conductive layer 450.

In the transistor including the oxide semiconductor layers 430a and 430b and the transistor including the oxide semiconductor layers 430a to 430c, selecting appropriate materials for the two or three layers forming the oxide semiconductor layer 430 makes current flow to the oxide semiconductor layer 430b. Since current flows to the oxide semiconductor layer 430b, the current is hardly influenced by interface scattering, leading to high on-state current. Thus, increasing the thickness of the oxide semiconductor layer 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 5

In this embodiment, components of the transistors described in Embodiment 4 are described in detail.

Note that there is no particular limitation on the type of the substrate 415. As the substrate 415, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Alternatively, a film of polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

As the substrate 415, a silicon substrate provided with a transistor, or the silicon substrate over which an insulating layer, a wiring, a conductor that functions as a contact plug, and the like are provided can be used. Note that when only p-ch transistors are formed using the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-ch transistor with the (110) plane can increase mobility.

A flexible substrate may be used as the substrate 415, and the transistor may be formed directly over the flexible substrate. Alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the separation layer, a stack including inorganic films, which are a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating layer 420 can have a function of supplying oxygen to the oxide semiconductor layer 430 as well as a function of preventing diffusion of impurities from a component included in the substrate 415. For this reason, the insulating layer 420 is preferably an insulating layer containing oxygen and further preferably, the insulating layer 420 is an insulating layer containing oxygen in which the oxygen content is higher than that in the stoichiometric composition. The insulating layer 420 is, for example, a film in which the amount of released oxygen when converted into oxygen atoms is greater than or equal to $1.0 \times 10^{19}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 415 is provided with another device, the insulating layer 420 also functions as an interlayer insulating layer. In that case, the insulating layer 420 is preferably subjected to planarization treatment such as chemical mechanical polishing (CMP) treatment so as to have a flat surface.

For example, the insulating layer 420 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. The insulating layer 420 may be a stack of any of the above materials.

In this embodiment, detailed description is given mainly on the case where the oxide semiconductor layer 430 of the transistor has a three-layer structure in which the oxide semiconductor layers 430a, 430b, and 430c are sequentially stacked from the insulating layer 420 side.

Note that in the case where the oxide semiconductor layer 430 is a single layer, a layer corresponding to the oxide semiconductor layer 430b described in this embodiment is used.

In the case where the oxide semiconductor layer 430 has a two-layer structure, a stack in which layers corresponding to the oxide semiconductor layer 430a and the oxide semiconductor layer 430b described in this embodiment are sequentially stacked from the insulating layer 420 side is used. In such a case, the oxide semiconductor layers 430a and 430b can be replaced with each other.

In the case where the oxide semiconductor layer 430 has a layered structure of four or more layers, for example, a structure in which another oxide semiconductor layer is added to the three-layer stack of the oxide semiconductor layer 430 described in this embodiment can be employed.

For the oxide semiconductor layer 430b, for example, an oxide semiconductor whose electron affinity (an energy difference between a vacuum level and the conduction band minimum) is higher than those of the oxide semiconductor layers 430a and 430c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 430a and 430c each contain one or more kinds of metal elements contained in the oxide semiconductor layer 430b. For example, the oxide semiconductor layers 430a and 430c are preferably formed using an oxide semiconductor whose conduction band minimum is closer to a vacuum level than that of the oxide semiconductor layer 430b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 470, a channel is formed in the oxide semiconductor layer 430b whose conduction band minimum is the lowest in the oxide semiconductor layer 430.

Furthermore, since the oxide semiconductor layer 430a contains one or more kinds of metal elements contained in the oxide semiconductor layer 430b, an interface state is unlikely to be formed at the interface between the oxide semiconductor layers 430a and 430b, compared with the interface between the oxide semiconductor layer 430b and the insulating layer 420 on the assumption that the oxide semiconductor layer 430b is in contact with the insulating layer 420. The interface state sometimes forms a channel; therefore, the threshold voltage of the transistor is changed in some cases. Thus, with the oxide semiconductor layer 430a, variations in electrical characteristics of the transistor, such as a threshold voltage, can be reduced. Moreover, the reliability of the transistor can be improved.

Since the oxide semiconductor layer 430c contains one or more kinds of metal elements contained in the oxide semiconductor layer 430b, scattering of carriers is unlikely to occur at the interface between the oxide semiconductor layers 430b and 430c, compared with the interface between the oxide semiconductor layer 430b and the gate insulating layer (the insulating layer 460) on the assumption that the oxide semiconductor layer 430b is in contact with the gate insulating layer. Thus, with the oxide semiconductor layer 430c, the field-effect mobility of the transistor can be increased.

For the oxide semiconductor layers 430a and 430c, for example, a material containing Al, Ti, Ga, Ge, Y, Zr, Sn, La, Ce, or Hf with a higher atomic ratio than that used for the oxide semiconductor layer 430b can be used. Specifically, the atomic ratio of any of the above metal elements in the oxide semiconductor layers 430a and 430c is 1.5 times or more, preferably 2 times or more, and further preferably 3 times or more as large as that in the oxide semiconductor layer 430b. Any of the above metal elements is strongly bonded to oxygen and thus can have a function of suppressing generation of an oxygen vacancy in the oxide semiconductor layers 430a and 430c. That is, an oxygen vacancy is less likely to be generated in the oxide semiconductor layers 430a and 430c than in the oxide semiconductor layer 430b.

An oxide semiconductor that can be used for each of the oxide semiconductor layers 430a, 430b, and 430c preferably contains at least In or Zn. Both In and Zn are preferably contained. In order to reduce variations in electrical characteristics of the OS transistor, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 430a, 430b, and 430c is an In-M-Zn oxide containing at least indium, zinc, and M (M is a metal such as Al, Ti, Ga, Ge, Y, Zr, Sn, La, Ce, or Hf), in the case where the oxide semiconductor layer 430a has an atomic ratio of In to M and Zn which is $x_1:y_1:z_1$, the oxide semiconductor layer 430b has an atomic ratio of In to M and Zn which is $x_2:y_2:z_2$, and the oxide semiconductor layer 430c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, and further preferably 3 times or more as large as $y_2/x_2$. At this time, when $y_2$ is greater than or equal to $x_2$ in the oxide semiconductor layer 430b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 430a and 430c are preferably less than 50 atomic % and greater than 50 atomic %, respectively, and further preferably less than 25 atomic % and greater than 75 atomic %, respectively. Furthermore, in the case where Zn and O are not taken into consideration, the proportion of In and the proportion of M in the oxide semiconductor layer 430b are preferably greater than 25 atomic % and less than 75 atomic %, respectively, and further preferably greater than 34 atomic % and less than 66 atomic %, respectively.

The indium content in the oxide semiconductor layer 430b is preferably higher than those in the oxide semiconductor layers 430a and 430c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 430b, a transistor having high field-effect mobility can be obtained.

The thickness of the oxide semiconductor layer 430a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 430b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 430c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 430b is preferably thicker than the oxide semiconductor layer 430c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide layer has a carrier density lower than $1\times10^{15}/cm^3$, lower than $1\times10^{13}/cm^3$, lower than $8\times10^{11}/cm^3$, or lower than $1\times10^8/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 430a, 430b, and 430c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, and further preferably lower than $1\times10^{18}$ atoms/cm$^3$. The oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$. The concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, and further preferably lower than $1\times10^{18}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating layer of the transistor, an insulating layer containing silicon is used in many cases; thus, it is preferable that, as in the transistor in one embodiment of the present invention, a region of the oxide semiconductor layer that serves as a channel not be in contact with the gate insulating layer for the above reason. In the case where a channel is formed at the interface between the gate insulating layer and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating layer.

Accordingly, with the oxide semiconductor layer 430 having a layered structure including the oxide semiconductor layers 430a, 430b, and 430c, a channel can be formed in the oxide semiconductor layer 430b; thus, the transistor can have high field-effect mobility and stable electrical characteristics.

In a band structure, the conduction band minimums of the oxide semiconductor layers 430a, 430b, and 430c are continuous. This can be understood also from the fact that the compositions of the oxide semiconductor layers 430a, 430b, and 430c are close to one another and oxygen is easily diffused among the oxide semiconductor layers 430a, 430b, and 430c. Thus, the oxide semiconductor layers 430a, 430b, and 430c have a continuous physical property though they have different compositions and form a stack. In the drawings, interfaces between the oxide semiconductor layers of the stack are indicated by dotted lines.

The oxide semiconductor layer 430 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 430a and 430c, and an In—Ga—Zn oxide whose atomic ratio of In to Ga and Zn is 1:1:1, 2:1:3, 5:5:6, or 3:1:2 can be used for the oxide semiconductor layer 430b. In each of the oxide semiconductor layers 430a to 430c, the proportion of each atom in the atomic ratio varies within a range of ±40% as a margin.

The oxide semiconductor layer 430b of the oxide semiconductor layer 430 serves as a well, so that a channel is formed in the oxide semiconductor layer 430b. Since the conduction band minimums are continuous, the oxide semiconductor layer 430 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 430a and 430c. The oxide semiconductor layer 430b can be distanced away from the trap levels owing to the existence of the oxide semiconductor layers 430a and 430c.

However, when the energy differences between the conduction band minimum of the oxide semiconductor layer 430b and the conduction band minimum of each of the oxide semiconductor layers 430a and 430c are small, an electron in the oxide semiconductor layer 430b might reach the trap level by passing over the energy differences. When the electron is trapped in the trap level, negative charge is generated at the interface with the insulating layer, so that the threshold voltage of the transistor is shifted in the positive direction.

The oxide semiconductor layers 430a, 430b, and 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 440 functioning as one of a source and a drain and the conductive layer 450 functioning as the other of the source and the drain, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 405, 406, 411, and 412, for example, it is possible to use W for the conductive layers 441 and 451 and use a stack of Ti and Al for the conductive layers 442 and 452.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 440 and 450, the conductive layers 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 440 and 450 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 460 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 460 may be a stack including any of the above materials. The insulating layer 460 may contain La, N, Zr, or the like as an impurity.

An example of a layered structure of the insulating layer 460 is described. The insulating layer 460 includes, for example, oxygen, nitrogen, silicon, or hafnium. Specifically, the insulating layer 460 preferably includes hafnium oxide and silicon oxide or silicon oxynitride.

Hafnium oxide and aluminum oxide have higher dielectric constants than silicon oxide and silicon oxynitride. Therefore, the insulating layer 460 using hafnium oxide or aluminum oxide can have larger thickness than the insulating layer 460 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 420 and 460 in contact with the oxide semiconductor layer 430, a film that releases less nitrogen oxide is preferably used. In the case where the oxide semiconductor is in contact with an insulating layer that releases a large amount of nitrogen oxide, the density of states due to nitrogen oxide increases in some cases. The density of states due to nitrogen oxide can be formed in the energy gap of the oxide semiconductor. For the insulating layers 420 and 460, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 420 and 460, a shift in the threshold voltage of the transistor can be reduced, which leads to reduced fluctuations in the electrical characteristics of the transistor.

For the conductive layer 470 functioning as a gate, for example, a conductive layer formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 471 and tungsten is used for the conductive layer 472 to form the conductive layer 470.

As the insulating layer 475, a silicon nitride film, an aluminum nitride film, or the like containing hydrogen can be used. In the transistors 403, 404, 406, 409, 410, and 412, the use of an insulating layer containing hydrogen is used as the insulating layer 475 allows the oxide semiconductor layer 430 to be partly changed to n-type because the oxide semiconductor layer 430 is partly in contact with the insulating layer 475. In addition, a nitride insulating layer functions as a blocking film against moisture and the like and can improve the reliability of the transistor.

An aluminum oxide film can also be used as the insulating layer 475. It is particularly preferable to use an aluminum oxide film as the insulating layer 475 in the transistors 401, 402, 405, 407, 408, and 411. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 430, preventing release of oxygen from the oxide semiconductor layer, and preventing unnecessary release of oxygen from the insulating layer 420. Furthermore, oxygen contained in the aluminum oxide film can be diffused into the oxide semiconductor layer.

Furthermore, the insulating layer 480 is preferably formed over the insulating layer 475. The insulating layer 480 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 480 may be a stack of any of the above materials.

Here, like the insulating layer 420, the insulating layer 480 preferably contains oxygen more than that in the stoichiometric composition. Oxygen released from the insulating layer 480 can be diffused into the channel formation region in the oxide semiconductor layer 430 through the insulating layer 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor layer 430c is formed to cover the oxide semiconductor layer 430b where a channel is formed; thus, a channel formation layer is not in contact with the gate insulating layer. Accordingly, scattering of carriers at the interface between the channel formation layer and the gate insulating layer can be reduced and the on-state current of the transistor can be increased.

In the transistor in one embodiment of the present invention, as described above, the gate (the conductive layer 470) is formed to electrically surround the oxide semiconductor layer 430 in the channel width direction; accordingly, a gate electric field is applied to the oxide semiconductor layer 430 in the direction perpendicular to the side surface in addition to the direction perpendicular to the top surface. In other words, a gate electric field is applied to the entire channel formation layer and an effective channel width is increased, leading to a further increase in on-state current.

Furthermore, in the transistor in one embodiment of the present invention in which the oxide semiconductor layer 430 has a two-layer structure or a three-layer structure, since the oxide semiconductor layer 430b where a channel is formed is provided over the oxide semiconductor layer 430a, an interface state is less likely to be formed. In the transistor in one embodiment of the present invention in which the oxide semiconductor layer 430 has a three-layer structure, since the oxide semiconductor layer 430b is positioned at the middle of the three-layer structure, the influence of an impurity that enters from upper and lower layers on the oxide semiconductor layer 430b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced chemical vapor deposition (CVD), such films may be formed by another method such as thermal CVD. Examples of the thermal CVD include MOCVD and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. That is, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed with a deposition apparatus using ALD, an $In(CH_3)_3$ gas and an $O_3$ gas are sequentially introduced plural times to form an In—O layer, a $Ga(CH_3)_3$ gas and an $O_3$ gas are sequentially introduced plural times to form a Ga—O layer, and then a $Zn(CH_3)_2$ gas and an $O_3$ gas are sequentially introduced plural times to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 6

A structure of an oxide semiconductor layer that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Figure 47A:
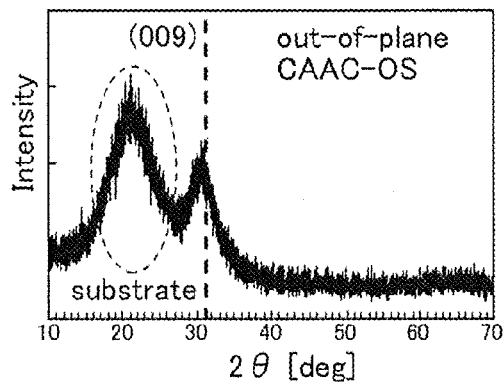
FIGS. 47A to 47E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 47A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 47B:
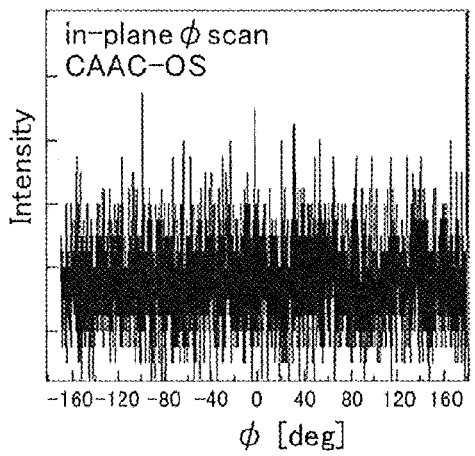
Figure 47C:
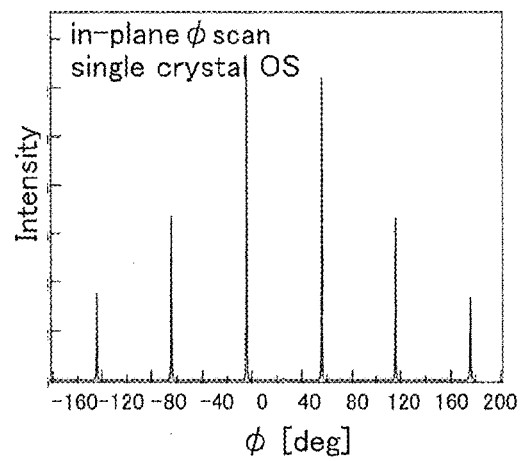

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 47B, a peak is not clearly observed. In contrast, in the case where single crystal $InGaZnO_4$ is subjected to φ scan with 2θ fixed at around 56°, as shown in FIG. 47C, six peaks which are derived from crystal planes equivalent to the (110) plane are observed. Accordingly, the structural analysis using XRD shows that the directions of a-axes and b-axes are irregularly oriented in the CAAC-OS.

Figure 47D:
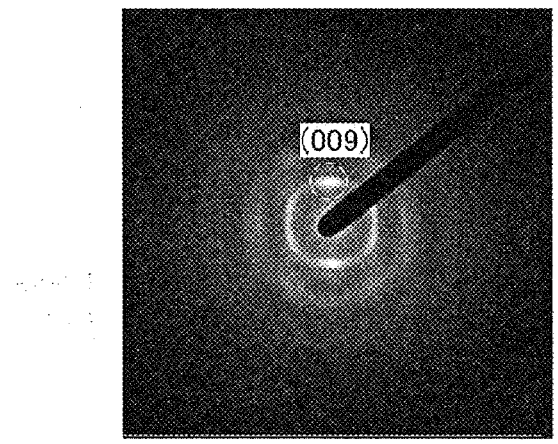
Figure 47E:
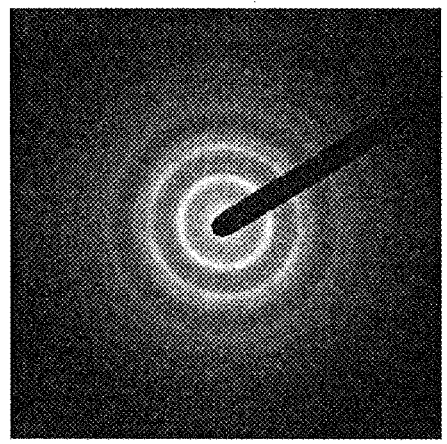

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 47D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 47E shows a diffraction pattern obtained in such a manner that an electron beam with a probe diameter of 300 nm is incident on the same sample in a direction perpendicular to the sample surface. As shown in FIG. 47E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 47E is considered to be derived from the (010) plane, the (100) plane, and the like of the $InGaZnO_4$ crystal. The second ring in FIG. 47E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 48A:
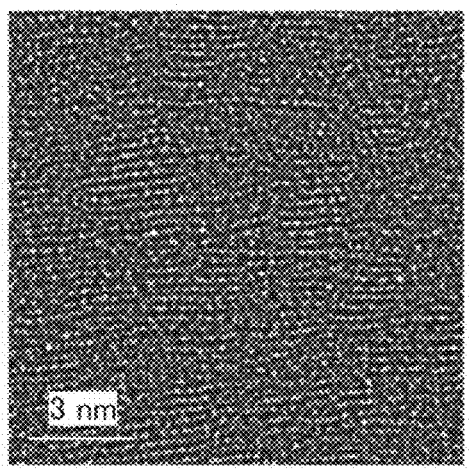
FIGS. 48A to 48E show a cross-sectional TEM image and plan-view TEM images of a CAAC-OS and images obtained through analysis thereof.

FIG. 48A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 48A shows pellets in which metal atoms are arranged in a layered manner. FIG. 48A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 48B:
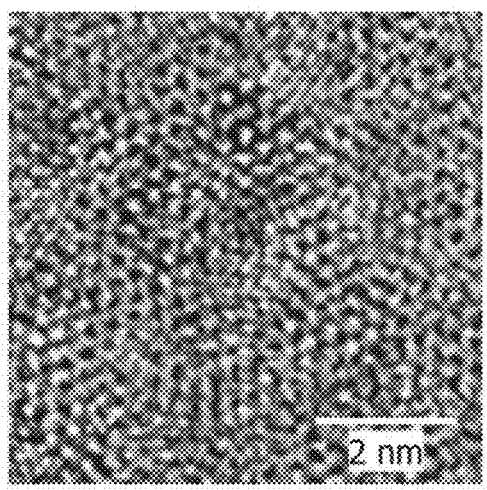
Figure 48C:
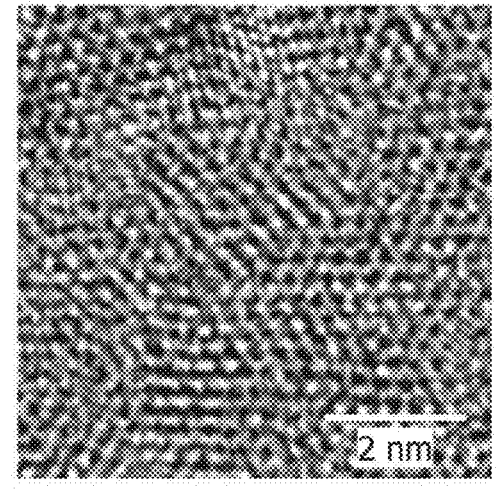
Figure 48D:
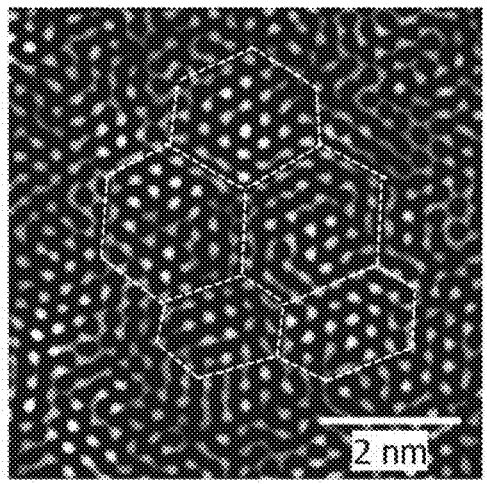
Figure 48E:
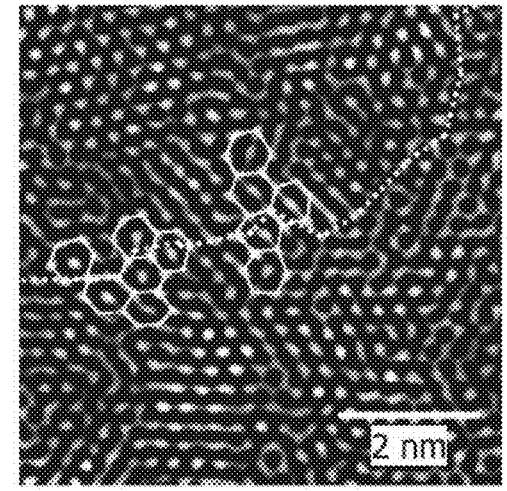

FIGS. 48B and 48C show Cs-corrected high-resolution TEM images of a plane of the CAAC-OS observed from a direction substantially perpendicular to the sample surface. FIGS. 48D and 48E are images obtained through image processing of FIGS. 48B and 48C. The method of image processing is as follows. The image in FIG. 48B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 48D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 48E, a dotted line denotes a portion where the direction of a lattice arrangement changes between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 49A:
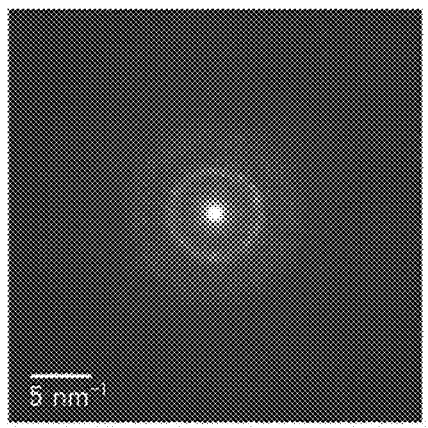
FIGS. 49A to 49D show electron diffraction patterns and a cross-sectional TEM image of an nc-OS.
Figure 49B:
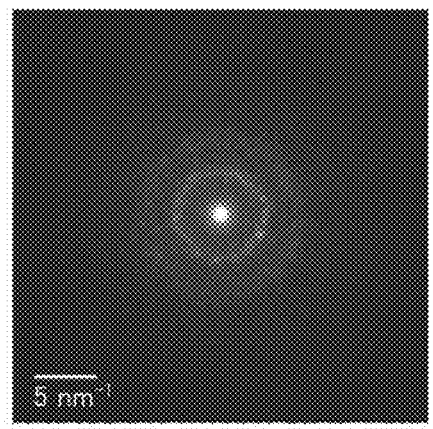

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 49A is observed. FIG. 49B shows a diffraction pattern obtained when an electron beam with a probe diameter of 1 nm is incident on the same sample. As shown in FIG. 49B, a plurality of spots are observed in a ring-like region. In other words, ordering in an nc-OS is not observed with an electron beam with a probe diameter of 50 nm but is observed with an electron beam with a probe diameter of 1 nm.

Figure 49C:
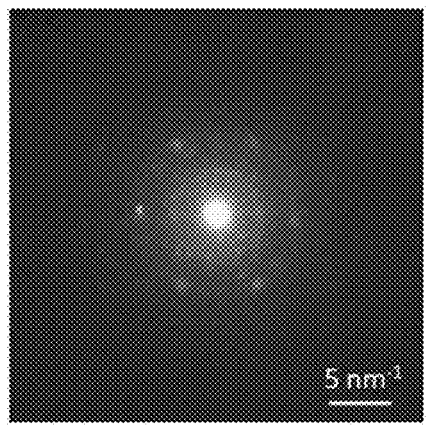

Furthermore, an electron diffraction pattern in which spots are arranged in an approximately hexagonal shape is observed in some cases as shown in FIG. 49C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 49D:
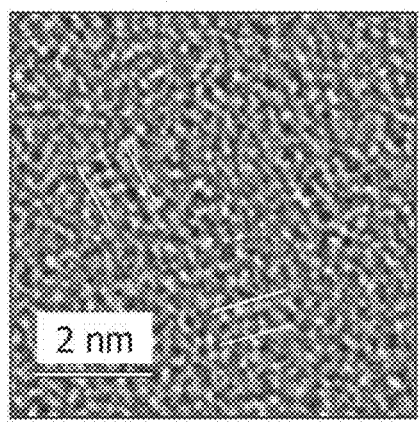

FIG. 49D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 49D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

FIGS. 50A and 50B are high-resolution cross-sectional TEM images of an a-like OS. FIG. 50A is the high-resolution cross-sectional TEM image of the a-like OS at the start of the electron irradiation. FIG. 50B is the high-resolution cross-sectional TEM image of a-like OS after the electron ($e^-$) irradiation at $4.3 \times 10^8$ $e^-/nm^2$. FIGS. 50A and 50B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 51:
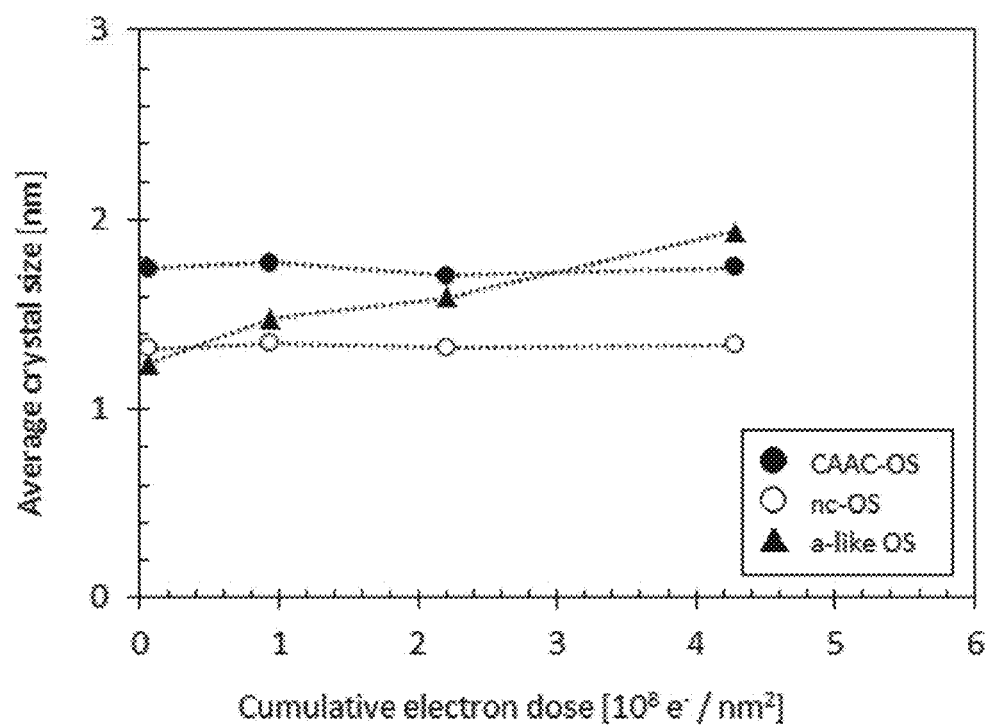
FIG. 51 shows a change in crystal part of an In—Ga—Zn oxide induced by electron irradiation.

FIG. 51 shows change in the average size of crystal parts (at 22 points to 30 points) in each sample. Note that the crystal part size corresponds to the length of a lattice fringe. FIG. 51 indicates that the crystal part size in the a-like OS increases with an increase in the cumulative electron dose in obtaining TEM images, for example. As shown in FIG. 51, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 51, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_OH$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The structures described in this embodiment can be used in appropriate combination with any of the structures described in the other embodiments.

Embodiment 7

In this embodiment, examples of a package and a module each including an image sensor chip will be described. The image sensor chip can employ the configuration of the imaging device of one embodiment of the present invention.

Figure 52A:
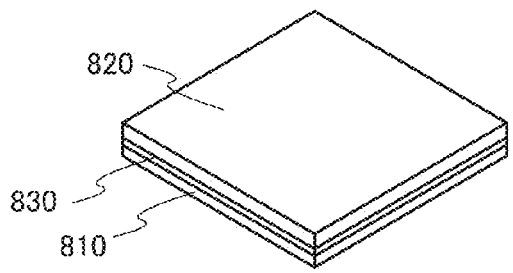
FIGS. 52A to 52D are perspective views and a cross-sectional view illustrating a package including an imaging device.

FIG. 52A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 52B:
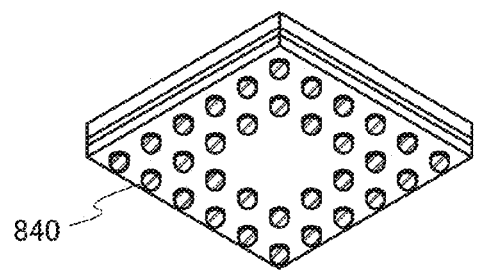

FIG. 52B is an external perspective view showing the bottom surface side of the package. The package has a ball grid array (BGA) structure including solder balls as bumps 840 on the bottom surface. Instead of the BGA, a land grid array (LGA), a pin grid array (PGA), or the like may be employed.

Figure 52C:
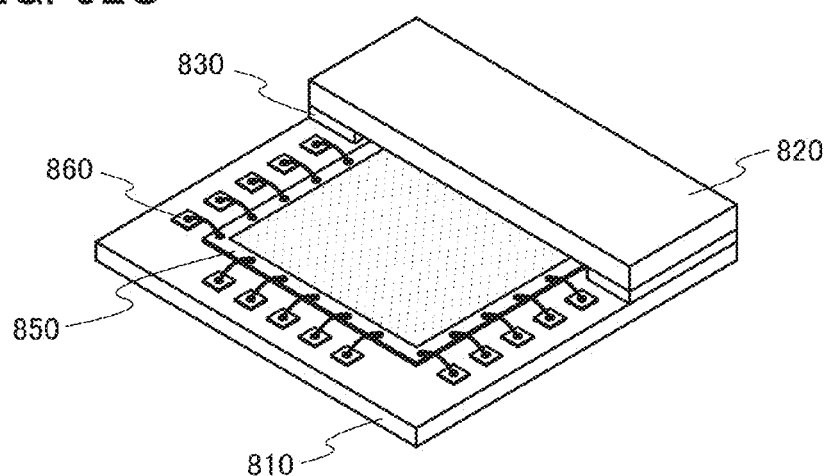
Figure 52D:
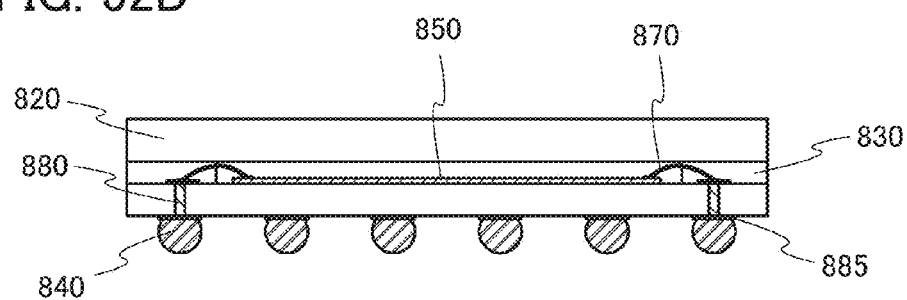

FIG. 52C is a perspective view of the package in which the cover glass 820 and the adhesive 830 are partly illustrated. FIG. 52D is a cross sectional view of the package. Electrode pads 860 are formed over the package substrate 810, and the electrode pads 860 and the bumps 840 are electrically connected via through holes 880 and lands 885. The electrode pads 860 are electrically connected to electrodes of the image sensor chip 850 through wires 870.

Figure 53A:
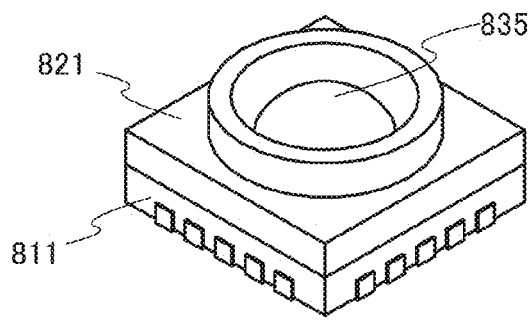
FIGS. 53A to 53D are perspective views and a cross-sectional view of a package including an imaging device.

FIG. 53A is an external perspective view showing the top surface side of a camera module in which an image sensor chip and a lens integrated with each other in a package. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 53B:
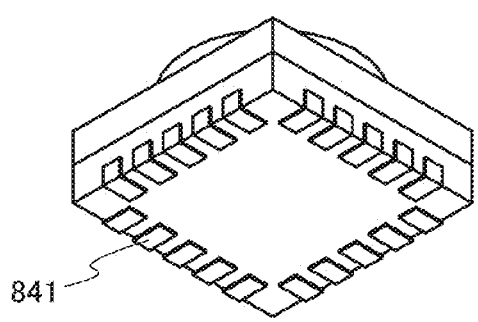

FIG. 53B is an external perspective view showing the bottom surface side of the camera module. Here, a quad flat no-lead package (QFN) is employed in which mounting lands 841 are provided on the bottom surface and four side surfaces of the package substrate 811. This structure is only an example; a quad flat package (QFP), the above-described BGA, or the like may be alternatively employed.

Figure 53C:
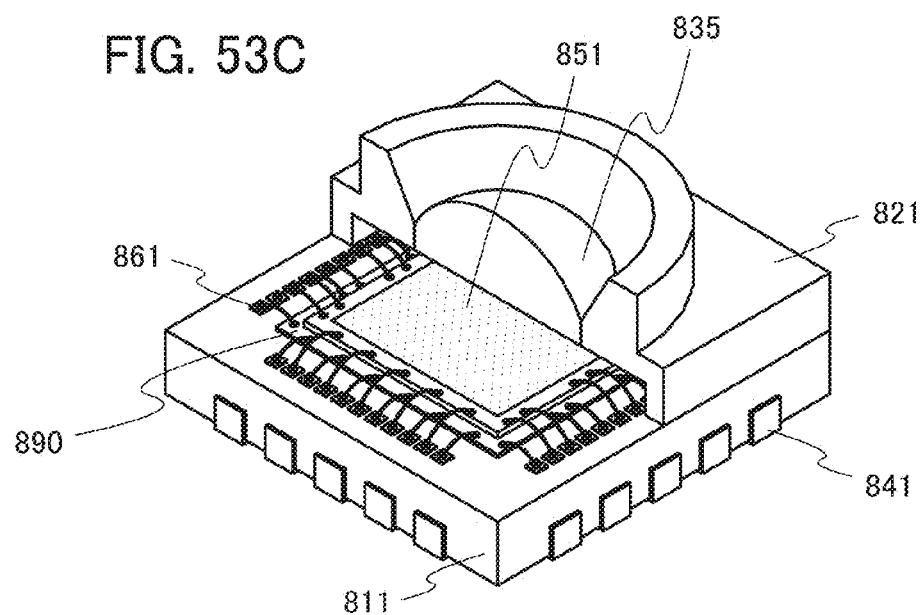
Figure 53D:
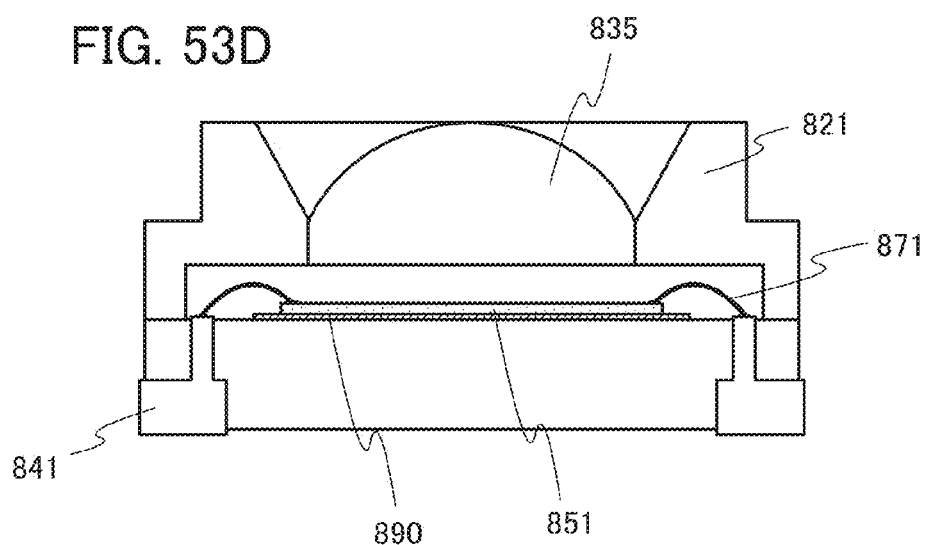

FIG. 53C is a perspective view of the module in which the lens cover 821 and the lens 835 are partly illustrated. FIG. 53D is a cross-sectional view of the camera module. Some of the lands 841 are used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 8

This embodiment will show examples of electronic devices in which an imaging device of one embodiment of the present invention is used.

Examples of an electronic device that can use the imaging device according to one embodiment of the present invention or a semiconductor device including the imaging device include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 54A to 54E illustrate specific examples of these electronic devices.

Figure 54A:
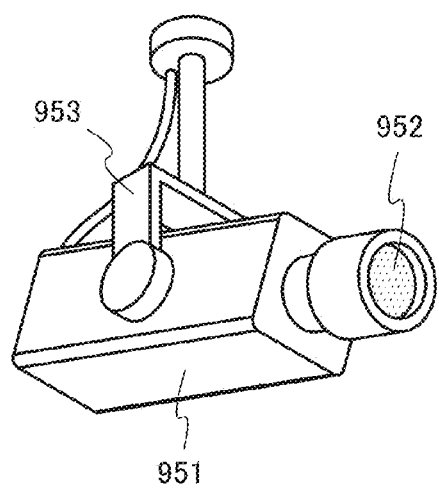
FIGS. 54A to 54F illustrate electronic devices.

FIG. 54A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 54B:
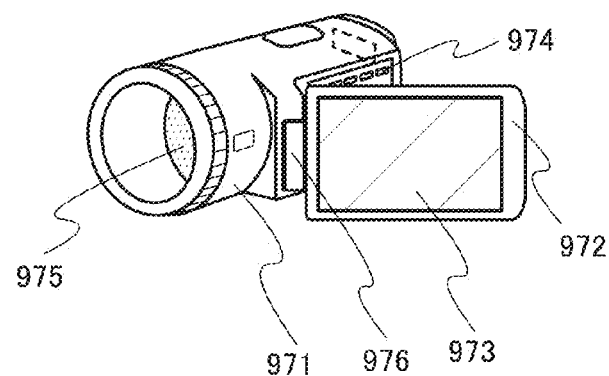

FIG. 54B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 54C:
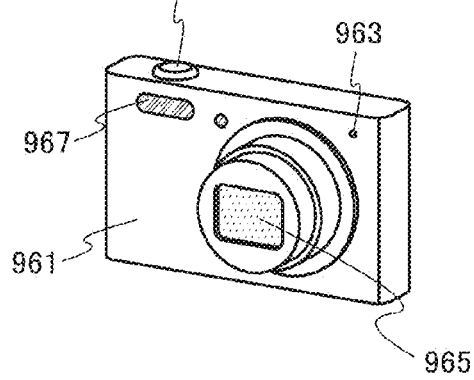

FIG. 54C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 54D:
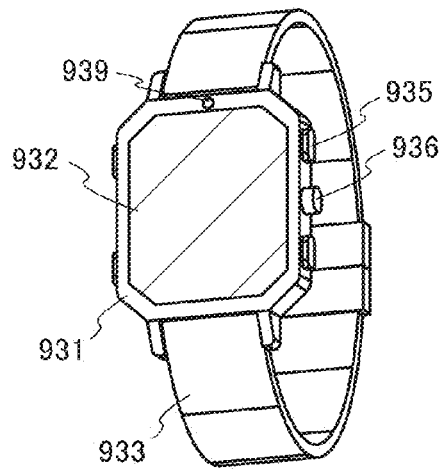

FIG. 54D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 54E:
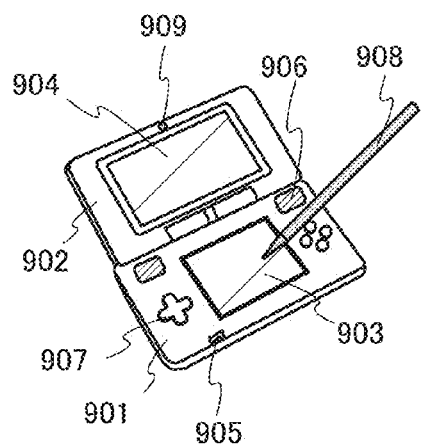

FIG. 54E illustrates a portable game machine, which includes housings 901 and 902, display portions 903 and 904, a microphone 905, speakers 906, an operation key 907, a stylus 908, a camera 909, and the like. Although the portable game machine in FIG. 54E has the two display portions 903 and 904, the number of display portions included in a portable game machine is not limited to this. The imaging device of one embodiment of the present invention can be included as one component in the portable game machine for obtaining an image.

Figure 54F:
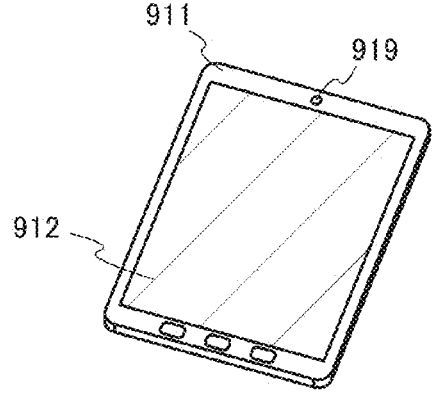

FIG. 54F illustrates a portable data terminal, which includes a first housing 911, a display portion 912, a camera 919, and the like. A touch panel function of the display portion 912 enables input and output of information. The imaging device of one embodiment of the present invention can be included as one component for obtaining an image in the portable data terminal.

This embodiment can be combined with any of the other embodiments in this specification as appropriate.

This application is based on Japanese Patent Application serial no. 2015-142019 filed with Japan Patent Office on Jul. 16, 2015, the entire contents of which are hereby incorporated by reference.

What is claimed is:

1. An imaging device comprising:
a pixel comprising a first photoelectric conversion element, a first transistor, a second transistor, a third transistor, and a fourth transistor; and
a circuit comprising a second photoelectric conversion element, a fifth transistor, a sixth transistor, a seventh transistor, an eighth transistor, a ninth transistor, a comparator circuit, a selector circuit, and an inverter circuit,
wherein:
one terminal of the first photoelectric conversion element is electrically connected to one of a source and a drain of the first transistor and one of a source and a drain of the second transistor,
the other of the source and the drain of the first transistor is electrically connected to a gate of the third transistor,
one of a source and a drain of the third transistor is electrically connected to one of a source and a drain of the fourth transistor,
one terminal of the second photoelectric conversion element is electrically connected to one of a source and a drain of the fifth transistor, a gate of the fifth transistor, and a gate of the sixth transistor,
the other of the source and the drain of the fifth transistor is electrically connected to one of a source and a drain of the sixth transistor,
the other of the source and the drain of the sixth transistor is electrically connected to one of a source and a drain of the seventh transistor and one of a non-inverting input terminal and an inverting input terminal of the comparator circuit,
an output terminal of the comparator circuit is electrically connected to a selection signal input terminal of the selector circuit,
a first input terminal of the selector circuit is electrically connected to a first wiring,
a second input terminal of the selector circuit is electrically connected to a second wiring,
an output terminal of the selector circuit is electrically connected to a gate of the second transistor,
a gate of the eighth transistor is electrically connected to the output terminal of the comparator circuit and an input terminal of the inverter circuit,
one of a source and a drain of the eighth transistor is electrically connected to one of a source and a drain of the ninth transistor and the other of the source and the drain of the second transistor,
the other of the source and the drain of the eighth transistor is electrically connected to a third wiring,
a gate of the ninth transistor is electrically connected to an output terminal of the inverter circuit, and
the other of the source and the drain of the ninth transistor is electrically connected to a fourth wiring.

2. The imaging device according to claim 1, wherein the second wiring and the third wiring are electrically connected to each other.

3. The imaging device according to claim 1, wherein:
the first wiring is configured to supply a first potential or a second potential,
the second wiring is configured to supply a third potential or a fourth potential,
the third wiring is configured to supply the third potential,
the fourth wiring is configured to supply a fifth potential,
the first potential is a potential at which the source and the drain of the second transistor are brought into conduction when the first potential is applied to the gate of the second transistor,
the second potential and the fourth potential are potentials at which the source and the drain of the second transistor are not brought into conduction when the second potential and the fourth potential are applied to the gate of the second transistor,
the third potential is a potential at which an avalanche multiplication phenomenon occurs in the first photoelectric conversion element when the third potential is applied to the other of the source and the drain of the second transistor, and
the third potential is higher than the fifth potential.

4. The imaging device according to claim 1, the pixel further comprising a capacitor,
wherein one terminal of the capacitor is electrically connected to the other of the source and the drain of the first transistor.

5. The imaging device according to claim 1, wherein each of the first photoelectric conversion element and the second photoelectric conversion element comprises a material comprising selenium.

6. The imaging device according to claim 1,
wherein each of the first transistor and the second transistor comprises an oxide semiconductor in an active layer, and
wherein the oxide semiconductor comprises In, Zn, and M (M is one of Al, Ti, Ga, Sn, Y, Zr, La, Ce, Nd, and Hf).

7. An electronic device comprising the imaging device according to claim 1 and a display device.

8. An imaging device comprising:
a pixel comprising a first photoelectric conversion element, a first transistor, a second transistor, a third transistor, and a fourth transistor; and
a circuit comprising a second photoelectric conversion element, a fifth transistor, a sixth transistor, a seventh transistor, an eighth transistor, a ninth transistor, a comparator circuit, a selector circuit, and an inverter circuit,
wherein:
one terminal of the first photoelectric conversion element is electrically connected to one of a source and a drain of the first transistor and one of a source and a drain of the second transistor,
the other of the source and the drain of the first transistor is electrically connected to a gate of the third transistor,
one of a source and a drain of the third transistor is electrically connected to one of a source and a drain of the fourth transistor,
one terminal of the second photoelectric conversion element is electrically connected to one of a source and a drain of the sixth transistor,
the other terminal of the second photoelectric conversion element is electrically connected to one of a source and a drain of the fifth transistor, a gate of the fifth transistor, and a gate of the sixth transistor,
the other of the source and the drain of the sixth transistor is electrically connected to one of a source and a drain of the seventh transistor and one of a non-inverting input terminal and an inverting input terminal of the comparator circuit,
an output terminal of the comparator circuit is electrically connected to a selection signal input terminal of the selector circuit,
a first input terminal of the selector circuit is electrically connected to a first wiring,
a second input terminal of the selector circuit is electrically connected to a second wiring,
an output terminal of the selector circuit is electrically connected to a gate of the second transistor,
a gate of the eighth transistor is electrically connected to the output terminal of the comparator circuit and an input terminal of the inverter circuit,
one of a source and a drain of the eighth transistor is electrically connected to one of a source and a drain of the ninth transistor and the other of the source and the drain of the second transistor,
the other of the source and the drain of the eighth transistor is electrically connected to a third wiring,
a gate of the ninth transistor is electrically connected to an output terminal of the inverter circuit, and
the other of the source and the drain of the ninth transistor is electrically connected to a fourth wiring.

9. The imaging device according to claim 8, wherein the second wiring and the third wiring are electrically connected to each other.

10. The imaging device according to claim 8, wherein:
the first wiring is configured to supply a first potential or a second potential,
the second wiring is configured to supply a third potential or a fourth potential,
the third wiring is configured to supply the third potential,
the fourth wiring is configured to supply a fifth potential,
the first potential is a potential at which the source and the drain of the second transistor are brought into conduction when the first potential is applied to the gate of the second transistor,
the second potential and the fourth potential are potentials at which the source and the drain of the second transistor are not brought into conduction when the second potential and the fourth potential are applied to the gate of the second transistor,
the third potential is a potential at which an avalanche multiplication phenomenon occurs in the first photoelectric conversion element when the third potential is applied to the other of the source and the drain of the second transistor, and
the third potential is higher than the fifth potential.

11. The imaging device according to claim 8, the pixel further comprising a capacitor,
wherein one terminal of the capacitor is electrically connected to the other of the source and the drain of the first transistor.

12. The imaging device according to claim 8, wherein each of the first photoelectric conversion element and the second photoelectric conversion element comprises a material comprising selenium.

13. The imaging device according to claim 8,
wherein each of the first transistor and the second transistor comprises an oxide semiconductor in an active layer, and
wherein the oxide semiconductor comprises In, Zn, and M (M is one of Al, Ti, Ga, Sn, Y, Zr, La, Ce, Nd, and Hf).

14. An electronic device comprising the imaging device according to claim 8 and a display device.

15. A method for operating an imaging device,
the imaging device comprising:
a pixel comprising a first photoelectric conversion element; and
a circuit comprising a second photoelectric conversion element,
wherein the imaging device operates in a first mode or a second mode, and
wherein when first illuminance of light with which the first photoelectric conversion element is irradiated is increased, an increase rate of a writing current flowing to the pixel is lower in the second mode than in the first mode,
the method comprising:
irradiating the second photoelectric conversion element with light;
judging whether second illuminance of light with which the second photoelectric conversion element is irradiated is higher than reference illuminance or not;
when the second illuminance of the light is higher than the reference illuminance, applying a voltage higher than or equal to 0 V at which an avalanche multiplication phenomenon does not occur to both terminals of the first photoelectric conversion element and performing imaging in the first mode; and when the second illuminance of the light is lower than the reference illuminance, applying a voltage at which an avalanche multiplication phenomenon occurs to both terminals of the first photoelectric conversion element and performing imaging in the second mode.

16. The method for operating the imaging device according to claim 15, wherein each of the first photoelectric conversion element and the second photoelectric conversion element comprises a material comprising selenium.

* * * * *